(12) United States Patent
D'Evelyn et al.

(10) Patent No.: US 10,036,099 B2
(45) Date of Patent: Jul. 31, 2018

(54) PROCESS FOR LARGE-SCALE AMMONOTHERMAL MANUFACTURING OF GALLIUM NITRIDE BOULES

(71) Applicant: SLT TECHNOLOGIES, INC., Los Angeles, CA (US)

(72) Inventors: Mark P. D'Evelyn, Santa Barbara, CA (US); Dirk Ehrentraut, Santa Barbara, CA (US); Derrick S. Kamber, Goleta, CA (US); Bradley C. Downey, Santa Barbara, CA (US)

(73) Assignee: SLT TECHNOLOGIES, INC., Los Angeles, CA (US)

( * ) Notice: Subject to any disclaimer, the term of this patent is extended or adjusted under 35 U.S.C. 154(b) by 177 days.

(21) Appl. No.: 14/599,335

(22) Filed: Jan. 16, 2015

(65) Prior Publication Data

US 2015/0132926 A1    May 14, 2015

Related U.S. Application Data

(63) Continuation-in-part of application No. 12/534,844, filed on Aug. 3, 2009, now Pat. No. 8,979,999, and a
(Continued)

(51) Int. Cl.
*C30B 7/10*     (2006.01)
*C30B 29/40*    (2006.01)
(Continued)

(52) U.S. Cl.
CPC ............... *C30B 7/105* (2013.01); *B01J 3/008* (2013.01); *B01J 3/042* (2013.01); *B01J 3/065* (2013.01);
(Continued)

(58) Field of Classification Search
CPC .................................... C30B 7/10; C30B 7/12
See application file for complete search history.

(56) References Cited

U.S. PATENT DOCUMENTS 3,245,760 A    4/1966  Sawyer
3,303,053 A    2/1967  Strong et al.
(Continued)

FOREIGN PATENT DOCUMENTS

CN    101061570    10/2007
EP      2381490    10/2011
(Continued)

OTHER PUBLICATIONS

Altoukhov et al., 'High reflectivity airgap distributed Bragg reflectors realized by wet etching of AlInN sacrificial layers', Applied Physics Letters, vol. 95, 2009, pp. 191102-1-191102-3.
(Continued)

*Primary Examiner* — Robert M Kunemund
(74) *Attorney, Agent, or Firm* — Patterson & Sheridan, LLP

(57) ABSTRACT

Large-scale manufacturing of gallium nitride boules using m-plane or wedge-shaped seed crystals can be accomplished using ammonothermal growth methods. Large-area single crystal seed plates are suspended in a rack, placed in a large diameter autoclave or internally-heated high pressure apparatus along with ammonia and a mineralizer, and crystals are grown ammonothermally. The orientation of the m-plane or wedge-shaped seed crystals are chosen to provide efficient utilization of the seed plates and of the volume inside the autoclave or high pressure apparatus.

23 Claims, 25 Drawing Sheets

Related U.S. Application Data continuation-in-part of application No. 13/472,356, filed on May 15, 2012, now abandoned.

(60) Provisional application No. 61/087,122, filed on Aug. 7, 2008.

(51) Int. Cl.

| | |
|---|---|
| *H01L 21/02* | (2006.01) |
| *B01J 3/00* | (2006.01) |
| *B01J 3/04* | (2006.01) |
| *B01J 3/06* | (2006.01) |
| *B30B 11/00* | (2006.01) |

(52) U.S. Cl.
CPC .......... *B30B 11/002* (2013.01); *C30B 29/406* (2013.01); *H01L 21/02035* (2013.01); *H01L 21/02389* (2013.01); *B01J 2203/068* (2013.01); *B01J 2203/0665* (2013.01)

(56) References Cited

U.S. PATENT DOCUMENTS

| | | |
|---|---|---|
| 3,335,084 A | 8/1967 | Hall |
| 4,030,966 A | 6/1977 | Hornig et al. |
| 4,066,868 A | 1/1978 | Witkin et al. |
| 4,350,560 A | 9/1982 | Helgeland et al. |
| 4,430,051 A | 2/1984 | von Platen |
| 5,098,673 A | 3/1992 | Engel et al. |
| 5,169,486 A | 12/1992 | Young et al. |
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,273,948 B1 | 8/2001 | Porowski et al. |
| 6,350,191 B1 | 2/2002 | D'Evelyn |
| 6,372,002 B1 | 4/2002 | D'Evelyn et al. |
| 6,398,867 B1 | 6/2002 | D'Evelyn et al. |
| 6,406,540 B1 | 6/2002 | Harris et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,528,427 B2 | 3/2003 | Chebi et al. |
| 6,533,874 B1 | 3/2003 | Vaudo et al. |
| 6,541,115 B2 | 4/2003 | Pender et al. |
| 6,596,040 B2 | 7/2003 | Saak et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall |
| 7,009,215 B2 | 3/2006 | D'Evelyn et al. |
| 7,012,279 B2 | 3/2006 | Wierer, Jr. et al. |
| 7,026,755 B2 | 4/2006 | Setlur et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,062,726 B2 | 11/2011 | Greiner et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,979,999 B2 | 3/2015 | D'Evelyn |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2005/0087753 A1 | 4/2005 | D'Evelyn et al. |
| 2005/0098095 A1 | 5/2005 | D'Evelyn et al. |

(56) References Cited

U.S. PATENT DOCUMENTS

| | | |
|---|---|---|
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0218703 A1 | 9/2007 | Kaeding et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto et al. |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0218593 A1 | 9/2009 | Kamikawa et al. |
| 2009/0250686 A1 | 10/2009 | Sato et al. |
| 2009/0262516 A1 | 10/2009 | Li |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0219505 A1 | 9/2010 | D'Evelyn |
| 2010/0295088 A1 | 11/2010 | D'Evelyn et al. |
| 2011/0001157 A1 | 1/2011 | McKenzie et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0220912 A1 | 9/2011 | D'Evelyn |
| 2011/0223701 A1 | 9/2011 | Kyono et al. |
| 2011/0256693 A1 | 10/2011 | D'Evelyn et al. |
| 2011/0262773 A1 | 10/2011 | Poblenz et al. |
| 2011/0266552 A1 | 11/2011 | Tu et al. |
| 2012/0000415 A1 | 1/2012 | D'Evelyn et al. |
| 2012/0007102 A1 | 1/2012 | Feezell et al. |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199952 A1 | 8/2012 | D'Evelyn et al. |
| 2013/0119401 A1 | 5/2013 | D'Evelyn et al. |
| 2013/0207148 A1 | 8/2013 | Krauter et al. |
| 2013/0234108 A1 | 9/2013 | David et al. |
| 2013/0251615 A1 | 9/2013 | D'Evelyn et al. |
| 2013/0323490 A1 | 12/2013 | D'Evelyn et al. |
| 2014/0065360 A1 | 3/2014 | D'Evelyn et al. |
| 2014/0175492 A1 | 6/2014 | Steranka et al. |

FOREIGN PATENT DOCUMENTS

| | | |
|---|---|---|
| JP | H06-334215 | 12/1994 |
| JP | 2002-161000 | 6/2002 |
| JP | 2004-179644 | 6/2004 |
| JP | 2004-533391 | 11/2004 |
| JP | 2005-289797 | 10/2005 |
| JP | 2007-039321 | 2/2007 |
| JP | 2007-331973 | 12/2007 |
| JP | 2008-501600 | 1/2008 |
| JP | 2008-084973 | 4/2008 |
| JP | 2008-521737 | 6/2008 |

(56) References Cited

FOREIGN PATENT DOCUMENTS

| | | |
|---|---|---|
| JP | 2008-263154 | 10/2008 |
| JP | 2009-267164 | 11/2009 |
| JP | 2010-098068 | 4/2010 |
| JP | 2010-212493 | 9/2010 |
| JP | 2010-226110 | 10/2010 |
| JP | 2010-263128 | 11/2010 |
| JP | 2011-051863 | 3/2011 |
| JP | 2011-068503 | 4/2011 |
| JP | 2011-077325 | 4/2011 |
| JP | 2005-506271 | 6/2011 |
| JP | 2011-522191 | 7/2011 |
| JP | 2011-148655 | 8/2011 |
| JP | 2011-219304 | 11/2011 |
| JP | 2011-230998 | 11/2011 |
| JP | 2011-243963 | 12/2011 |
| JP | 2012-001432 | 1/2012 |
| JP | 2012-512119 | 5/2012 |
| WO | WO 2005/121415 | 12/2005 |
| WO | WO 2006/057463 | 1/2006 |
| WO | WO 2006/038467 | 4/2006 |
| WO | WO 2006/062880 | 6/2006 |
| WO | WO 2007/004495 | 1/2007 |
| WO | WO 2010/068916 | 6/2010 |
| WO | WO 2011/097393 | 8/2011 |
| WO | WO 2012/016033 | 2/2012 |
| WO | WO 2012/022813 | 2/2012 |
| WO | WO 2012/024636 | 2/2012 |

OTHER PUBLICATIONS

Byrappa et al., 'Handbook of Hydrothermal Technology: A Technology for Crystal Growth and Materials Processing', Noyes Publications, Park Ridge, New Jersey, 2001, pp. 94-96 and 152.

Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.

Chiang et al., 'Luminescent Properties of Cerium-Activated Garnet Series Phosphor: Structure and Temperature Effects', Journal of the Electrochemical Society, vol. 155, No. 6, 2008, pp. B517-B520.

Chiu et al., 'Synthesis and Luminescence Properties of Intensely Red-Emitting M5Eu(WO4)4—x(MoO4)x(M=Li, Na, K) Phosphors', Journal of the Electrochemical Society, vol. 155, No. 3, 2008, pp. J71-J78.

Choi et al., '2.51 microcavity InGaN light-emitting diodes fabricated by a selective dry-etch thinning process', Applied Physics Letters, 2007, 91(6), 061120.

Cl et al., 'Ca1—xMo1—ySiyO4:Eux3+: A Novel Red Phosphor for White Light Emitting Diodes', Physica B, vol. 403, 2008, pp. 670-674.

Copel et al., 'Surfactants in Epitaxial Growth', Physical Review Letters, Aug. 7, 1989, vol. 63, No. 6, p. 632-635.

D'Evelyn et al., 'Bulk GaN Crystal Growth by the High-Pressure Ammonothermal Method', Journal of Crystal Growth, vol. 300, 2007, pp. 11-16.

Dorsaz et al., 'Selective oxidation of AlInN Layers for current confinement III-nitride devices', Applied Physics Letters, vol. 87, 2005 pp. 072102.

Dwilinski et al., 'AMMONO Method of BN, AlN and GaN Synthesis and Crystal Growth', MRS Internet Journal Nitride Semiconductor Research, vol. 3, No. 25, 1998, pp. 1-5.

Dwilinski et al., 'Excellent Crystallinity of Truly Bulk Ammonothermal GaN', Journal of Crystal Growth, vol. 310, 2008, pp. 3911-3916.

Ehrentraut et al., 'The ammonothermal crystal growth of gallium nitride—A technique on the up rise', Proceedings IEEE, 2010, 98(7), pp. 1316-1323.

Fang., 'Deep centers in semi-insulating Fe-doped native GaN substrates grown by hydride vapour phase epitaxy', Physica Status Solidi, vol. 5, No. 6, 2008, pp. 1508-1511.

Farrell et al., 'Continuous-Wave Operation of AlGaN-Cladding-Free Nonpolar m-Plane InGaN/GaN Laser Diodes', 2007, Japanese Journal of Applied Physics, vol. 46, No. 32, 2007, pp. L761-L763.

Feezell et al., 'AlGaN-Cladding-Free Nonpolar InGaN/GaN Laser Diodes', Japanese Journal of Applied Physics, vol. 46, No. 13, 2007, pp. L284-L286.

Frayssinet et al., 'Evidence of Free Carrier Concentration Gradient Along the c-Axis for Undoped GaN Single Crystals', Journal of Crystal Growth, vol. 230, 2001, pp. 442-447.

Fujito et al., 'Development of Bulk GaN Crystals and Nonpolar/Semipolar Substrates by HVPE', MRS Bulletin, May 2009, vol. 34, No. 5, pp. 313-317.

Fukuda et al., 'Prospects for the Ammonothermal Growth of Large GaN Crystal', Journal of Crystal Growth, vol. 305, 2007, pp. 304-310.

Gladkov et al., 'Effect of Fe doping on optical properties of freestanding semi-insulating HVPE GaN:Fe', Journal of Crystal Growth, 312, pp. 1205-1209.

Grzegory, 'High pressure growth of bulk GaN from Solutions in gallium', Journal of Physics Condensed Matter, vol. 13, 2001, pp. 6875-6892.

Happek, 'Development of Efficient UV-LED Phosphor Coatings for Energy Saving Solid State Lighting', University of Georgia, 2007, 22 pages.

Hashimoto et al., 'A GaN bulk crystal with improved structural quality grown by the ammonothermal method', Nature Materials, vol. 6, 2007, pp. 568-671.

Hashimoto et al., 'Ammonothermal Growth of Bulk GaN', Journal of Crystal Growth, vol. 310, 2008, pp. 3907-3910.

Hoppe et al., 'Luminescence in Eu2+-Doped Ba2Si5N8: Fluorescence, Thermoliminescence, and Upconversion', Journal of Physics and Chemistry of Solids, vol. 61, 2000, pp. 2001-2006.

Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.

Kim et al., 'Improved Electroluminescence on Nonpolar m-Plane InGaN/GaN Qantum Well LEDs', Rapid Research Letters, vol. 1, No. 3, 2007, pp. 125-127.

Kojima et al., 'Stimulated Emission at 474 nm From an InGaN Laser Diode Structure Grown on a (1122) GaN Substrate', Applied Physics Letters, vol. 91, 2007, pp. 251107-251107-3.

Kolis et al., 'Crystal Growth of Gallium Nitride in Supercritical Ammonia', Journal of Crystal Growth, vol. 222, 2001, pp. 431-434.

Kubota et al., 'Temperature Dependence of Polarized Photoluminescence From Nonpolar m-Plane InGaN Multiple Quantum Wells for Blue Laser Diodes', Applied Physics Letter, vol. 92, 2008, pp. 011920-1-011920-3.

Li et al., 'The Effect of Replacement of Sr by Ca OnThe Structural and Luminescence Properties of the Red-Emitting Sr2Si5N8:Eu2+ LED Conversion Phosphor', Journal of Solid State Chemistry, vol. 181, 2008, pp. 515-524.

Lide et al., 'Thermal Conductivity of Ceramics and Other Insulating Materials', CRC Handbook of Chemistry and Physics, 91st Edition, 2010-2011, pp. 12-203 and 12-204.

Lu et al., 'Structure of the CI-passivated GaAs(111) surface', Physical Review B, Nov. 15, 1998, vol. 58, No. 20, pp. 13820-13823.

Massies et al., 'Surfactant mediated epitaxial growth of InxGa1-xAs on GaAs (001)', Applied Physics Letters, vol. 61, No. 1, Jul. 6, 1992, pp. 99-101.

http://www.matbase.com/material/non-ferrous-metals/other/molybdenum/properties, Data Table for: Non-Ferrous Metals: Other Metals: Molybdenum, Mar. 28, 2011, pp. 1.

Mirwald et al., 'Low-Friction Cell for Piston-Cylinder High Pressure Apparatus', Journal of Geophysical Research, vol. 80, No. 11, 1975, pp. 1519-1525.

Moutanabbir, 'Bulk GaN Ion Cleaving', Journal of Electronic Materials, vol. 39, 2010, pp. 482-488.

Mueller-Mach et al., 'Highly Efficient All-Nitride Phosphor-Converted White Light Emitting Diode', Physica Status Solidi (a), vol. 202, 2005, pp. 1727-1732.

(56) References Cited

OTHER PUBLICATIONS

Murota et al., 'Solid State Light Source Fabricated With YAG:Ce Single Crystal', Japanese Journal of Applied Physics, vol. 41, Part 2, No. 8A, 2002, pp. L887-L888.
Okamoto et al., 'Continuous-Wave Operation of m-Plane InGaN Multiple Quantum Well Laser Diodes', Japanese Journal of Applied Physics, vol. 46, No. 9, 2007, pp. L187-L189.
Okamoto et al., 'Pure Blue Laser Diodes Based on Nonpolar m-Plane Gallium Nitride With InGaN Waveguiding Layers', Japanese Journal of Applied Physics, vol. 46, No. 35, 2007, pp. L820-L822.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.
Pattison et al., 'Gallium Nitride Based Microcavity Light Emitting Diodes With 2? Effective Cavity Thickness', Applied Physics Letters, vol. 90, Issue 3, 031111 (2007) 3pg.
International Search Report & Written Opinion of PCT Application No. PCT/US2009/052750, dated Oct. 6, 2009, 13 pages total.
International Search Report & Written Opinion of PCT Application No. PCT/US2009/067745, dated Feb. 5, 2010, 9 pages total.
International Search Report & Written Opinion of PCT Application No. PCT/US2013/029453, dated Jul. 25, 2013, 11 pages total.
Porowski, 'High Resistivity GaN Single Crystalline Substrates', Acta Physica Polonica A, vol. 92, No. 2, 1997, pp. 958-962.
Porowski, 'Near Defect Free GaN Substrates', Journal of Nitride Semiconductor, 1999, pp. 1-11.
Saito et al., 'Plane Dependent Growth of GaN in Supercritical Basic Ammonia', Applied Physics Express, vol. 1, No. 12, Dec. 2008, pp. 121103-1-121103-3.
Sarva et al., 'Dynamic Compressive Strength of Silicon Carbide Under Uniaxial Compression', Material Sciences and Engineering, vol. A317, 2001, pp. 140-144.
Sato et al., 'High Power and High Efficiency Green Light Emitting Diode on Free-Standing Semipolar (1122) Bulk GaN Substrate', Physica Status Solidi (RRL), vol. 1, No. 4, 2007, pp. 162-164.
Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.
Schmidt et al., 'Demonstration of Nonpolar m-Plane InGaN/GaN Laser Diodes', Japanese Journal of Applied Physics, vol. 46, No. 9, 2007, pp. L190-L191.
Setlur et al., 'Crystal Chemistry and Luminescence of Ce3+-Doped (Lu2CaMg2(Si,Ge)3O12 and Its Use in LED Based Lighting', Chemistry pp. 3314-3322.
Sharma et al., Applied Physics Letters, vol. 87, 2005, pp. 051107.
Sizov et al., '500-nm Optical Gain Anisotropy of Semipolar (1122) InGaN Quantum Wells', Applied Physics Express, vol. 2, 2009, pp. 071001-1-071001-3.
Sumiya et al., 'High-pressure synthesis of high-purity diamond crystal', Diamond and Related Materials, 1996, vol. 5, pp. 1359-1365.
Tsuda et al., 'Blue Laser Diodes Fabricated on m-Plane GaN Substrates', Applied Physics Express, vol. 1, 2008, pp. 011104-1-011104-3.
Tyagi et al., 'Semipolar (1011) InGaN/GaN Laser Diodes on Bulk GaN Substrates', Japanese Journal of Applied Physics, vol. 46, No. 19, 2007, pp. L444-L445.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Communication from the Chinese Patent Office re 200980134876.2 dated Aug. 21, 2014 (10 pages).
Communication from the Chinese Patent Office re 200980134876.2 dated Mar. 6, 2014, (10 pages).
Communication from the Japanese Patent Office re 2011-522191 dated Mar. 28, 2014, (6 pages).
Communication from the Korean Patent Office re 10-2012-7009980 dated Apr. 15, 2013, (6 pages).
Communication from the Japanese Patent Office re 2013-117510 dated Sep. 24, 2014 (8 pages).
Communication from the Polish Patent Office re P394857 dated Aug. 14, 2013, (2 pages).
Wang et al., 'Ammonothermal Growth of GaN Crystals in Alkaline Solutions', Journal of Crystal Growth, vol. 287, 2006, pp. 376-380.
Wang et al., 'Ammonothermal Synthesis of III-Nitride Crystals', Crystal Growth & Design, vol. 6, No. 6, 2006, pp. 1227-1246.
Wang et al., 'Synthesis of Dense Polycrystaline GaN of High Purity by the Chemical Vapor Reaction Process', Journal of Crystal Growth, vol. 286, 2006, pp. 50-54.
Wang et al., 'New Red Y0.85Bi0.1Eu0.05V1-yMyO4 (M=Nb, P) Phosphors for Light-Emitting Diodes', Physica B, vol. 403, 2008, pp. 2071-2075.
Weisbuch et al., 'Recent results and latest views on microcavity LEDs', Light-Emitting Diodes: Research, Manufacturing, and Applications VIII, ed. by S.A. Stockman et al., Proc. SPIE, vol. 5366, p. 1-19 (2004).
Yamamoto, 'White LED Phosphors: The Next Step', Proceeding of SPIE, 2010, pp. 1-10.
Yang et al., 'Preparation and luminescence properties of LED conversion novel phosphors SrZn02:Sm', Materials Letters, vol. 62, 2008, pp. 907-910.
Zhong et al., 'High Power and High Efficiency Blue Light Emitting Diode on Freestanding Semipolar (1011) Bulk GaN Substrate', Applied Physics Letter, vol. 90, No. 23, 2007, pp. 233504-1-233504-3.
Zhong et al., 'Demonstration of High Power Blue-Green Light Emitting Diode on Semipolar (1122) Bulk GaN Substrate', Electronics Letters, vol. 43, No. 15, 2007, pp. 825-826.
USPTO Office Action for U.S. Appl. No. 12/133,364 dated Nov. 26, 2010 (5 pages).
USPTO Office Action for U.S. Appl. No. 12/133,364 dated Jun. 1, 2011 (7 pages).
USPTO Notice of Allowance for U.S. Appl. No. 12/133,364 dated Oct. 11, 2011 (5 pages).
USPTO Office Action for U.S. Appl. No. 12/133,365 dated Jun. 9, 2011 (16 pages).
USPTO Office Action for U.S. Appl. No. 12/133,365 dated Oct. 18, 2011 (21 pages).
USPTO Office Action for U.S. Appl. No. 12/133,365 dated May 13, 2013 (22 pages).
USPTO Office Action for U.S. Appl. No. 12/133,365 dated Aug. 21, 2013 (28 pages).
USPTO Office Action for U.S. Appl. No. 12/133,365 dated Feb. 20, 2014 (32 pages).
USPTO Office Action for U.S. Appl. No. 12/334,418 dated Apr. 5, 2011 (19 pages).
USPTO Office Action for U.S. Appl. No. 12/334,418 dated Oct. 19, 2011 (23 pages).
USPTO Office Action for U.S. Appl. No. 12/334,418 dated Sep. 17, 2013 (26 pages).
USPTO Office Action for U.S. Appl. No. 12/478,736 dated Sep. 27, 2011 (10 pages).
USPTO Office Action for U.S. Appl. No. 12/478,736 dated Feb. 7, 2012 (6 pages).
USPTO Notice of Allowance for U.S. Appl. No. 12/478,736 dated Apr. 23, 2012 (7 pages).
USPTO Notice of Allowance for U.S. Appl. No. 12/478,736 dated Oct. 9, 2012 (4 pages).
USPTO Office Action for U.S. Appl. No. 12/484,095 dated Nov. 10, 2010 (8 pages).
USPTO Office Action for U.S. Appl. No. 12/484,095 dated Jul. 8, 2011 (11 pages).
USPTO Office Action for U.S. Appl. No. 12/491,176 dated Mar. 1, 2012 (9 pages).
USPTO Office Action for U.S. Appl. No. 12/497,969 dated Feb. 2, 2012 (19 pages).
USPTO Office Action for U.S. Appl. No. 12/497,969 dated Jul. 5, 2012 (17 pages).

(56) References Cited

OTHER PUBLICATIONS

USPTO Office Action for U.S. Appl. No. 12/497,969 dated May 16, 2013 (21 pages).
USPTO Office Action for U.S. Appl. No. 12/497,969 dated Sep. 6, 2013 (20 pages).
USPTO Office Action for U.S. Appl. No. 12/534,838 dated May 3, 2011 (11 pages).
USPTO Office Action for U.S. Appl. No. 12/534,838 dated Jan. 13, 2012 (12 pages).
USPTO Office Action for U.S. Appl. No. 12/534,838 dated Mar. 20, 2012 (12 pages).
USPTO Notice of Allowance for U.S. Appl. No. 12/534,838 dated Jun. 8, 2012 (8 pages).
USPTO Office Action for U.S. Appl. No. 12/534,843 dated Sep. 10, 2012 (9 pages).
USPTO Notice of Allowance for U.S. Appl. No. 12/534,843 dated Jan. 24, 2013 (8 pages).
USPTO Office Action for U.S. Appl. No. 12/534,844 dated Sep. 16, 2010 (8 pages).
USPTO Office Action for U.S. Appl. No. 12/534,844 dated Feb. 4, 2011 (9 pages).
Communication from the Japanese Patent Office re 2011-522191 dated Oct. 31, 2014 (9 pages).
USPTO Office Action for U.S. Appl. No. 12/534,844 dated Apr. 25, 2014 (7 pages).
USPTO Notice of Allowance for U.S. Appl. No. 12/534,844 dated Nov. 17, 2014 (5 pages).
USPTO Notice of Allowance for U.S. Appl. No. 12/534,849 dated Jul. 31, 2012 (11 pages).
USPTO Office Action for U.S. Appl. No. 12/534,857 dated Sep. 1, 2010 (10 pages).
USPTO Notice of Allowance for U.S. Appl. No. 12/534,857 dated May 27, 2011 (5 pages).
USPTO Office Action for U.S. Appl. No. 12/546,458 dated Jul. 20, 2011 (4 pages).
USPTO Notice of Allowance for U.S. Appl. No. 12/546,458 dated Nov. 28, 2011 (5 pages).
USPTO Office Action for U.S. Appl. No. 12/556,558 dated Sep. 16, 2010 (8 pages).
USPTO Notice of Allowance for U.S. Appl. No. 12/556,558 dated Mar. 22, 2011 (5 pages).
USPTO Office Action for U.S. Appl. No. 12/556,562 dated Sep. 15, 2010 (7 pages).
USPTO Office Action for U.S. Appl. No. 12/556,562 dated Mar. 21, 2011 (5 pages).
USPTO Notice of Allowance for U.S. Appl. No. 12/556,562 dated Jul. 27, 2011 (5 pages).
USPTO Office Action for U.S. Appl. No. 12/569,337 dated May 9, 2012 (18 pages).
USPTO Notice of Allowance for U.S. Appl. No. 12/569,337 dated Nov. 15, 2012 (5 pages).
USPTO Office Action for U.S. Appl. No. 12/569,841 dated Dec. 23, 2011 (12 pages).
USPTO Office Action for U.S. Appl. No. 12/569,844 dated Oct. 12, 2012 (12 pages).
USPTO Office Action for U.S. Appl. No. 12/634,665 dated Apr. 25, 2012 (10 pages).
USPTO Office Action for U.S. Appl. No. 12/634,665 dated Oct. 1, 2012 (10 pages).
USPTO Notice of Allowance for U.S. Appl. No. 12/634,665 dated Feb. 15, 2013 (9 pages).
USPTO Office Action for U.S. Appl. No. 12/636,683 dated Jun. 12, 2013 (14 pages).
USPTO Office Action for U.S. Appl. No. 12/636,683 dated Aug. 16, 2013 (16 pages).
USPTO Office Action for U.S. Appl. No. 12/636,683 dated Feb. 24, 2014 (16 pages).
USPTO Office Action for U.S. Appl. No. 12/697,171 dated Jun. 20, 2013 (16 pages).
USPTO Office Action for U.S. Appl. No. 12/697,171 dated Aug. 20, 2013 (17 pages).
USPTO Office Action for U.S. Appl. No. 12/724,983 dated Mar. 5, 2012 (20 pages).
USPTO Notice of Allowance for U.S. Appl. No. 12/754,886 dated May 17, 2012 (19 pages).
USPTO Notice of Allowance for U.S. Appl. No. 12/754,886 dated Jun. 5, 2012 (16 pages).
USPTO Notice of Allowance for U.S. Appl. No. 12/754,886 dated Jun. 20, 2012 (14 pages).
USPTO Office Action for U.S. Appl. No. 12/785,404 dated Mar. 6, 2012 (9 pages).
USPTO Notice of Allowance for U.S. Appl. No. 12/785,404 dated Jul. 16, 2012 (5 pages).
USPTO Office Action for U.S. Appl. No. 12/891,668 dated Sep. 25, 2012 (20 pages).
USPTO Office Action for U.S. Appl. No. 12/891,668 dated Jan. 10, 2013 (30 pages).
USPTO Notice of Allowance for U.S. Appl. No. 12/891,668 dated Mar. 20, 2013 (13 pages).
USPTO Office Action for U.S. Appl. No. 13/025,833 dated Jul. 12, 2012 (15 pages).
USPTO Office Action for U.S. Appl. No. 13/041,199 dated Nov. 30, 2012 (13 pages).
USPTO Office Action for U.S. Appl. No. 13/041,199 dated Mar. 12, 2013 (9 pages).
USPTO Office Action for U.S. Appl. No. 13/175,739 dated Dec. 7, 2012 (5 pages).
USPTO Notice of Allowance for U.S. Appl. No. 13/175,739 dated Mar. 21, 2013 (6 pages).
USPTO Office Action for U.S. Appl. No. 13/179,346 dated Aug. 17, 2012 (17 pages).
USPTO Office Action for U.S. Appl. No. 13/179,346 dated Dec. 13, 2012 (20 pages).
USPTO Office Action for U.S. Appl. No. 13/226,249 dated Oct. 10, 2012 (7 pages).
USPTO Notice of Allowance for U.S. Appl. No. 13/226,249 dated Feb. 21, 2013 (5 pages).
USPTO Office Action for U.S. Appl. No. 13/272,981 dated Mar. 20, 2013 (18 pages).
USPTO Office Action for U.S. Appl. No. 13/272,981 dated Aug. 15, 2013 (13 pages).
USPTO Notice of Allowance for U.S. Appl. No. 13/272,981 dated Mar. 13, 2014 (10 pages).
USPTO Office Action for U.S. Appl. No. 13/346,507 dated Dec. 21, 2012 (8 pages).
USPTO Notice of Allowance for U.S. Appl. No. 13/346,507 dated Apr. 22, 2013 (8 pages).
USPTO Notice of Allowance for U.S. Appl. No. 13/425,304 dated Aug. 22, 2012 (7 pages).
USPTO Office Action for U.S. Appl. No. 13/472,356 dated Dec. 9, 2013 (11 pages).
USPTO Office Action for U.S. Appl. No. 13/472,356 dated Jun. 5, 2014 (12 pages).
USPTO Notice of Allowance for U.S. Appl. No. 13/548,931 dated Jun. 3, 2013 (10 pages).
USPTO Office Action for U.S. Appl. No. 14/022,587 dated Jul. 30, 2014 (9 pages).
Communication from the Japanese Patent Office re 2013-263760 dated Nov. 14, 2014 (11 pages).

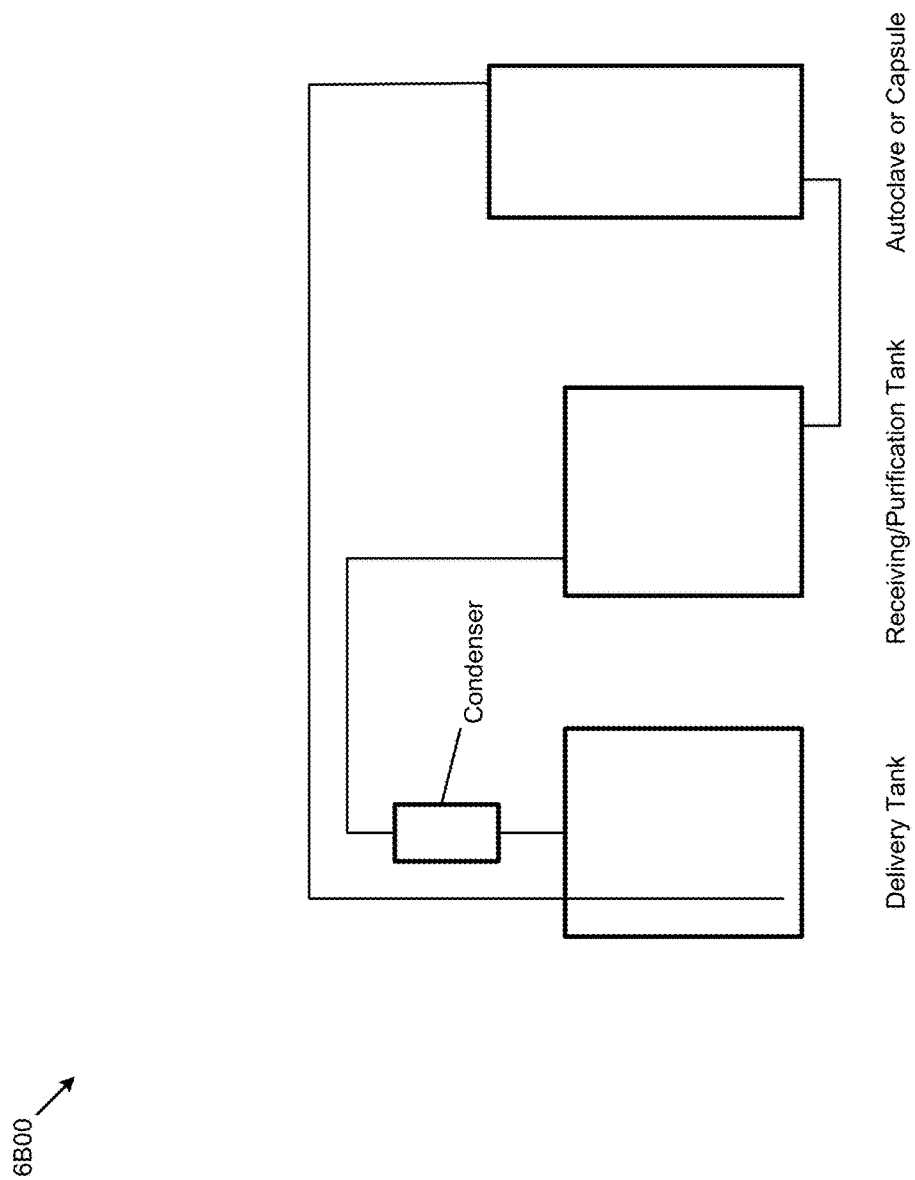

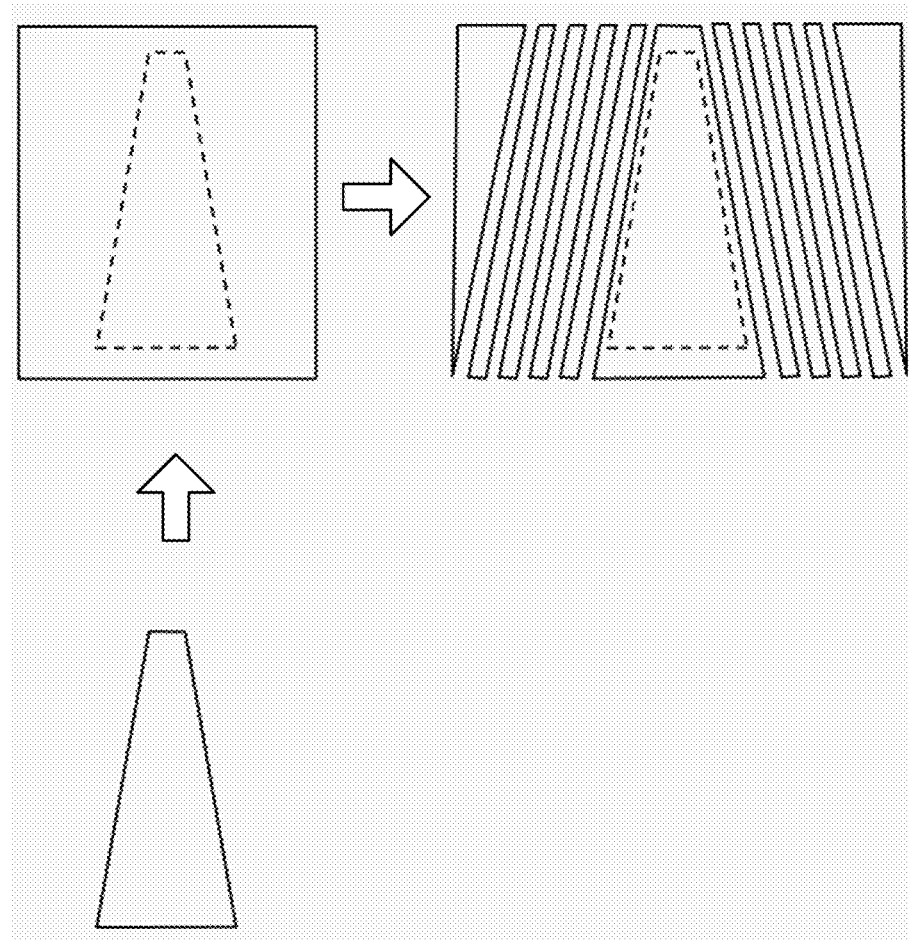

PROCESS FOR LARGE-SCALE AMMONOTHERMAL MANUFACTURING OF GALLIUM NITRIDE BOULES

This application is a continuation-in-part of U.S. application Ser. No. 12/534,844, filed on Aug. 3, 2009, now U.S. Pat. No. 8,979,999, which claims the benefit under 35 U.S.C. § 119(e) to U.S. Provisional Application No. 61/087,122 filed on Aug. 7, 2008; and this application is a continuation-in-part of U.S. application Ser. No. 13/472,356 filed on May 15, 2012 now pending, each of which is commonly assigned and incorporated by reference in its entirety herein for all purposes.

This invention was made with government support under Contract DE-SC0006168 awarded by the U.S. Department of Energy. The government has certain rights in the invention.

FIELD

The field relates to methods for large-scale manufacturing of gallium nitride boules using m-plane or wedge-shaped seed crystals. Large-area single crystal seed plates are suspended in a rack, placed in a large diameter autoclave or internally-heated high pressure apparatus along with ammonia and a mineralizer, and crystals are grown ammonothermally. The orientation of the m-plane or wedge-shaped seed crystals are chosen to provide efficient utilization of the seed plates and of the volume inside the autoclave or high pressure apparatus.

BACKGROUND

The present disclosure generally relates to processing of materials for growth of crystals. More particularly, the present disclosure provides a method for obtaining a gallium-containing nitride crystal by an ammonothermal technique, including ammonobasic or ammonoacidic techniques, but there can be others. In certain embodiments, the present disclosure provides an apparatus for large scale processing of nitride crystals, but it would be recognized that other crystals and materials can also be processed. Such crystals and materials include, but are not limited to, GaN, AlN, InN, InGaN, AlGaN, AlInN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation devices, photodetectors, integrated circuits, power electronics, and transistors, among other devices.

Gallium nitride containing crystalline materials serve as a starting point for manufacture of conventional optoelectronic devices, such as blue light emitting diodes and lasers. Such optoelectronic devices have been commonly manufactured on sapphire or silicon carbide substrates that differ in composition from the deposited nitride layers. In the conventional Metal-Organic Chemical Vapor Deposition (MOCVD) method, deposition of GaN is performed from ammonia and organometallic compounds in the gas phase. Although successful, conventional growth rates make it difficult to provide a bulk layer of GaN material. Additionally, dislocation densities are also high and lead to poor optoelectronic device performance.

Other techniques have been proposed for obtaining bulk monocrystalline gallium nitride. Such techniques include epitaxial deposition employing halides and hydrides in a vapor phase, e.g., Hydride Vapor Phase Epitaxy (HVPE) ("Growth and characterization of freestanding GaN substrates," Motoki et al., Journal of Crystal Growth 237-239, 912 (2002)). Unfortunately, drawbacks exist with HVPE techniques. In some cases, the quality of the bulk monocrystalline gallium nitride is not generally sufficient for high quality laser diodes because of issues with dislocation density, stress, and the like. In addition, scaleup of HVPE is difficult and costs tend to be high.

Techniques using supercritical ammonia have been proposed. Peters has described the ammonothermal synthesis of aluminum nitride (J. Cryst. Growth 104, 411-418 (1990)). R. Dwiliński et al. have shown that it is possible to obtain a fine-crystalline gallium nitride by a synthesis from gallium and ammonia, provided that the latter contains alkali metal amides ($KNH_2$ or $LiNH_2$). These and other techniques have been described in "AMMONO method of BN, AlN, and GaN synthesis and crystal growth," Proc. EGW-3, Warsaw, Jun. 22 24, 1998, MRS Internet Journal of Nitride Semiconductor Research, "Crystal growth of gallium nitride in supercritical ammonia," Kolis et al., J. Cryst. Growth 222, 431-434 (2001), and Mat. Res. Soc. Symp. Proc. Vol. 495, 367-372 (1998) by J. W. Kolis et al. However, using these supercritical ammonia processes, no wide scale production of bulk monocrystalline was achieved.

Dwiliński, in U.S. Pat. Nos. 6,656,615 and 7,335,262, and D'Evelyn, in U.S. Pat. Nos. 7,078,731 and 7,101,433, disclose apparatus and methods for conventional ammonothermal crystal growth of GaN. These methods are useful for growth of relatively small GaN crystals. Unfortunately, such methods have limitations for large scale manufacturing. The conventional apparatus with an inner diameter of 40 mm is useful for growing smaller diameter GaN crystals but is not suitable for large scale growth of GaN boules. Additionally, conventional suspension of seed crystals using wires passing through single laser-drilled holes may be adequate for small crystals but is not amenable to large scale manufacturing. Other limitations may also exist.

From the above, it can be appreciated that improved techniques for large scale GaN crystal growth are desired.

BRIEF SUMMARY

According to the present disclosure, techniques related to processing of materials for growth of gallium-containing nitride crystals are provided. More particularly, the present disclosure provides methods for obtaining a gallium-containing nitride crystal by an ammonothermal technique, including ammonobasic and ammonoacidic techniques, but there can be others. In certain embodiments, the present disclosure provides an apparatus for large scale processing of gallium-containing nitride crystals; however, other crystals and materials can also be processed using the methods disclosed herein. Such crystals and materials include, but are not limited to, GaN, AlN, InN, InGaN, AlGaN, AlInN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation devices, photodetectors, integrated circuits, power electronics, transistors, and other devices.

In certain embodiments, the present disclosure provides methods for growth of a gallium-containing nitride crystals, e.g., GaN. The methods include providing gallium-containing source material and providing a mineralizer. In certain embodiments, methods include providing a plurality of seed plates, such as at least two seed plates, including a first seed plate and a second seed plate. The methods include supporting the plurality of seed plates in a seed rack including differing sites of a seed rack. For example, methods include supporting a first seed plate and a second seed plate in a first site and a second site, respectively, of a seed rack. In certain embodiments, the first seed plate and the second seed plate have substantially an equivalent crystallographic orientation to within about five degrees. Each of the first seed plate and the second seed plate has a length of at least about 1 centimeter according to certain embodiments. The methods include placing the source material, the mineralizer, and the seed plates in a sealable container and introducing a nitrogen-containing solvent into the sealable container. In certain embodiments, the methods include processing the source material, the mineralizer, and the seed plates contained in the sealable container in a supercritical fluid at a temperature higher than about 400 degrees Celsius and a pressure higher than about 2 kbar.

In certain embodiments, the present disclosure provides methods for growth of a gallium-containing nitride crystal. The methods include providing gallium-containing source material and providing a mineralizer. The methods also include providing at least a first seed plate and a second seed plate. In certain embodiments, the first seed plate has a first side having a first crystallographic orientation and a second side having a second crystallographic orientation. In certain embodiments, the second seed plate has a first side having a first crystallographic orientation and a second side having a second crystallographic orientation. In certain embodiments, the methods also include supporting the first seed plate and the second seed plate such that the first side of the first seed plate faces the first side of the second seed plate and spaced by a predetermined gap between the first side of the first seed plate and the first side of the second seed plate. The methods include placing the source material, mineralizer, and the seed plates in a sealable container. The methods introduce a nitrogen-containing solvent into the sealable container and process the source material, the mineralizer, and the seed plates contained in the sealable container in a supercritical fluid at a temperature higher than about 400 degrees Celsius and a pressure higher than about 2 kbar.

Still further, the present disclosure provides methods for growth of a gallium-containing nitride crystal, e.g., GaN. The methods include providing gallium-containing source material. In certain embodiments, the methods also include providing a mineralizer and providing at least a first seed plate and a second seed plate. In certain embodiments, the first seed plate has a first side having a first a-plane crystallographic orientation and a second side having a second a-plane crystallographic orientation. In certain embodiments, the second seed plate has a first side having a first a-plane crystallographic orientation and a second side having a second a-plane crystallographic orientation. In certain embodiments, the methods include supporting the first seed plate and the second seed plate. Each of the first seed plate and the second seed plate has a length of at least about 1 centimeter according to a specific embodiment. In certain embodiments, the methods include placing the source material, the mineralizer, and the seed plates in a sealable container and introducing a nitrogen-containing solvent into the sealable container. In certain embodiments, the methods include processing the source material, mineralizer, and seed plates contained in the sealable container in a supercritical fluid at a temperature higher than about 400 degrees Celsius and a pressure higher than about 2 kbar. The disclosed methods also generally thicken each of the seed plates by way of crystal growth.

In certain aspects, methods for growth of gallium-containing nitride crystals are provided, the methods comprising: providing a gallium-containing source material; providing a mineralizer; providing a plurality of gallium-containing nitride seed plates, each of the plurality of seed plates having a minimum lateral dimension of at least about three centimeters and having a first large-area surface with a first crystallographic orientation, wherein the first crystallographic orientation of each of the plurality of seed plates is equivalent to within about 5 degrees and the first crystallographic orientation of at least two of the plurality of seed plates differs by at least about 0.05 degrees; supporting the plurality of seed plates in a seed rack, wherein the seed rack is substantially rigid under processing conditions; placing the source material, the mineralizer, and the seed rack supporting the plurality of seed plates in a sealable container; introducing a nitrogen-containing solvent into the sealable container; and processing the source material, the mineralizer, and the seed plates contained in the sealable container in a supercritical fluid at a temperature higher than about 400 degrees Celsius and a pressure higher than about 2 kbar.

In certain aspects, methods for growth of gallium-containing nitride crystals are provided, the methods comprising: providing a gallium-containing source material; providing a mineralizer; providing a plurality of gallium-containing nitride seed plates, each of the plurality of seed plates having a non-cubic crystal structure and a wedge shape, wherein the wedge shape comprises a wedge angle θ between a first large area surface and a second large area surface between about 1 degree and about 60 degrees, wherein the first large area surface and the second large area surface have crystallographic orientations that are equivalent to one another to within about 5 degrees; supporting the plurality of seed plates in a seed rack, wherein the seed rack is substantially rigid under processing conditions; placing the source material, the mineralizer, and the seed rack supporting the plurality of seed plates in a sealable container; introducing a nitrogen-containing solvent into the sealable container; and processing the source material, the mineralizer, and the plurality of seed plates contained in the sealable container in a supercritical fluid at a temperature higher than about 400 degrees Celsius and a pressure higher than about 2 kbar.

In certain aspects, methods for growth of gallium-containing nitride crystals are provided, the methods comprising: providing a gallium-containing source material; providing a mineralizer; providing a plurality of gallium-containing nitride seed plates, each of the plurality of seed plates comprising large-area surfaces, wherein each of the large-area surfaces has a crystallographic orientation vicinal to the {1 −1 0 0} m-plane, with a miscut between about 1 and about −5 degrees in the [0001] c-direction and a miscut less than or equal to 1 degree in the <11−20> a-direction; and the crystallographic orientation of the large-area surfaces of each of the plurality of seed plates are equivalent to within about 5 degrees of one another and the crystallographic orientation of at least two of the plurality of seed plates differs by at least 0.05 degrees; supporting the plurality of seed plates in a seed rack; placing the source material, the mineralizer, and the seed rack supporting the plurality of seed plates in a sealable container; introducing a nitrogen-containing solvent into the sealable container; and processing the source material, the mineralizer, and the plurality of seed plates contained in the sealable container in a supercritical fluid at a temperature higher than about 400 degrees Celsius and a pressure higher than about 2 kbar. In still other cases, growth of a gallium-containing nitride crystal is accomplished by providing a plurality of gallium-containing nitride seed plates, each of the plurality of seed plates having a non-cubic crystal structure and a wedge shape, wherein the wedge shape comprises a wedge angle between about 1 degree and about 60 degrees as measured between a first large area surface and a second large area surface, and wherein the first large area surface and the second large area surface have crystallographic orientations that are equivalent to one another (at least to within about 5 degrees). Seed plates are placed in a seed rack and then placed into a sealable container together with source material, and a mineralizer. Processing includes introducing a nitrogen-containing solvent into the sealable container and heating in a supercritical fluid at a temperature higher than about 400 degrees Celsius.

In certain aspects, methods for growth of an m-plane gallium-containing nitride crystal are disclosed, the methods comprising providing a gallium-containing source material; providing a mineralizer; providing at least two gallium-containing nitride seed plates, each of the at least two gallium-containing nitride seed plates comprising a first large-area surface and a second large-area surface opposite the first large-area surface, wherein, each of the first large-area surfaces and each of the second large-area surfaces are characterized by a minimum lateral dimension of at least about one centimeter; the first large-area surface of the first gallium-containing nitride seed plate comprises an outward facing growth surface characterized by a first crystallographic orientation; the first large-area surface of the second gallium-containing nitride seed plate comprises an outward facing growth surface characterized by a second crystallographic orientation; the first crystallographic orientation and the second crystallographic orientation differ by at least about 0.1 degree and less than about 5 degrees; and the first crystallographic orientation and the second crystallographic orientation are characterized by a nominally m-plane crystallographic orientation with a miscut angle in the c-direction between about 5 degrees and about 0.05 degrees toward [000-1] and a miscut angle in the a-direction less than or equal to about 1 degree; supporting the at least two seed plates in a seed rack; placing the source material, the mineralizer, and the seed rack supporting the at least two seed plates in a sealable container; introducing a nitrogen-containing solvent into the sealable container; and processing the source material, the mineralizer, and the at least two seed plates contained in the sealable container in a supercritical fluid at a temperature higher than about 400 degrees Celsius to provide at least two m-plane gallium-containing nitride crystals, wherein, a surface of each of the at least two m-plane gallium-containing nitride crystals is characterized by an X-ray diffraction rocking curve full-width-half maximum less than about 150 arc-second.

In certain aspects, methods for growth of an m-plane gallium-containing nitride crystal are disclosed, the methods comprising: providing a gallium-containing source material; providing a mineralizer; providing at least 25 gallium-containing nitride seed plates, each of the at least 25 gallium-containing nitride seed plates comprising a first large-area surface and a second large-area surface opposite the first large-area surface, wherein, each of the first large-area surfaces and each of the second large-area surfaces are characterized by a minimum lateral dimension of at least about three centimeters; the first large-area surface of the first gallium-containing nitride seed plate comprises an outward facing growth surface characterized by a first crystallographic orientation; the first large-area surface of the second gallium-containing nitride seed plate comprises an outward facing growth surface characterized by a second crystallographic orientation; the first crystallographic orientation and the second crystallographic orientation differ by at least about 0.1 degree and less than about 5 degrees; and the first crystallographic orientation and the second crystallographic orientation are characterized by a nominally m-plane crystallographic orientation with a miscut angle in the c-direction between about 5 degrees and about 0.05 degrees toward [000-1] and a miscut angle in the a-direction less than or equal to about 1 degree; supporting the at least two seed plates in a seed rack; placing the source material, the mineralizer, and the seed rack supporting the at least two seed plates in a sealable container; introducing a nitrogen-containing solvent into the sealable container; and processing the source material, the mineralizer, and the at least two seed plates contained in the sealable container in a supercritical fluid at a temperature higher than about 400 degrees Celsius to provide at least 25 m-plane gallium-containing nitride crystals, wherein, a surface of each of the at least 25 m-plane gallium-containing nitride crystals is characterized by an X-ray diffraction rocking curve full-width-half maximum less than about 150 arc-second.

In certain aspects, methods for growth of a plurality of gallium-containing nitride crystals are disclosed, the methods comprising providing a gallium-containing source material; providing a mineralizer; providing a plurality of gallium-containing nitride seed plates, each of the plurality of seed plates having a non-cubic crystal structure and a wedge shape, wherein the wedge shape comprises a wedge angle θ between a first large area surface and a second large area surface between about 1 degree and about 60 degrees, wherein the first large area surface and the second large area surface have crystallographic orientations that are equivalent to one another to within about 5 degrees; supporting the plurality of seed plates in a seed rack, wherein the seed rack is substantially rigid under processing conditions; placing the source material, the mineralizer, and the seed rack supporting the plurality of seed plates in a sealable container; introducing a nitrogen-containing solvent into the sealable container; and processing the source material, the mineralizer, and the plurality of gallium-containing nitride seed plates contained in the sealable container in a supercritical fluid at a temperature higher than about 400 degrees Celsius to provide a plurality of gallium-containing nitride crystals.

Benefits are achieved over current techniques using the present disclosure. In particular, the present disclosure provides a cost-effective high pressure apparatus and methods for growth of crystals such as GaN, AlN, InN, InGaN, AlInN, AlInGaN, and others. In certain embodiments, the present methods and apparatus can operate with components that are relatively simple and cost-effective to manufacture. Depending upon the embodiment, the present apparatus and methods can be manufactured using conventional materials and/or methods according to one of ordinary skill in the art. The present apparatus and methods enable cost-effective crystal growth and materials processing under extreme pressure and temperature conditions in batch volumes larger than about 0.3 liters, larger than about 1 liter, larger than about 3 liters, larger than about 10 liters, larger than about 30 liters, larger than about 100 liters, and larger than about 300 liters according to certain embodiments. Depending upon the embodiment, one or more of these benefits may be achieved. These and other benefits are described throughout the present specification.

The present disclosure achieves these benefits and others in the context of known process technology. However, a further understanding of the nature and advantages of the present disclosure may be realized by reference to the specification and attached drawings.

BRIEF DESCRIPTION OF THE DRAWINGS

FIG. 6A and FIG. 6B are diagrams illustrating a recycling operation for crystal growth according to embodiments of the present disclosure.

FIG. 11A and FIG. 11B are diagrams illustrating crystal growth processes according to embodiments of the present disclosure.

DETAILED DESCRIPTION

Figure 12:
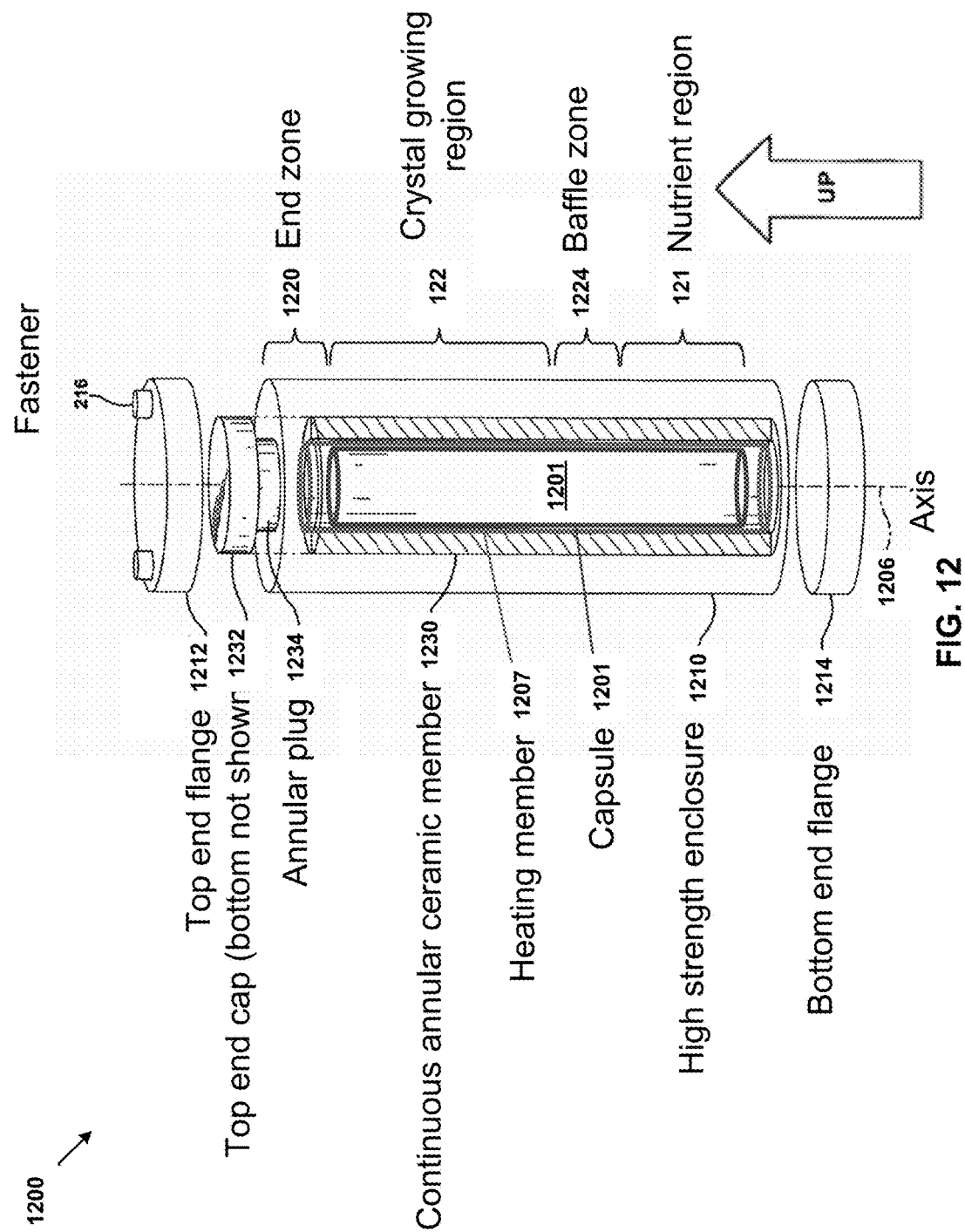
FIG. 12 is a diagram of an apparatus for a crystal growth process according to embodiments of the present disclosure.

According to the present disclosure, techniques related to processing of materials for growth of crystals are provided. More particularly, the present disclosure provides methods for obtaining a gallium-containing nitride crystal by an ammonobasic or ammonoacidic technique, but there can be others. In certain embodiments, the present disclosure provides an apparatus for large scale processing of nitride crystals, but other crystals and materials can also be processed. Such crystals and materials include, but are not limited to, GaN, AlN, InN, InGaN, AlGaN, AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation devices, photodetectors, power electronics, integrated circuits, and transistors, and other devices. An example of a suitable apparatus for ammonothermal crystal growth of gallium-containing nitride crystals, including ammonoacidic and ammonobasic variations, is shown in FIG. 12.

Figure 5:
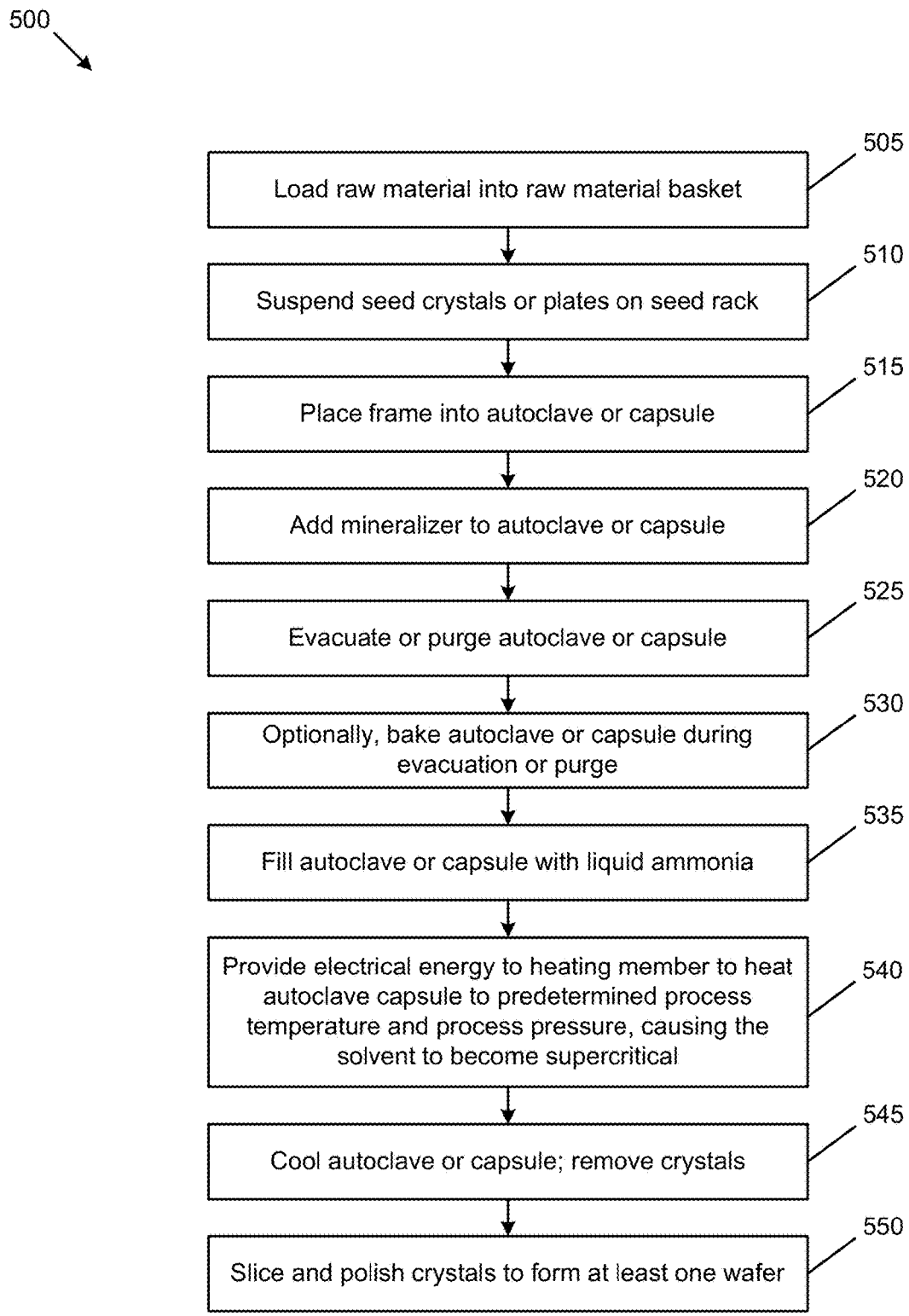
FIG. 5 is a diagram of flow chart illustrating a crystal growth process according to an embodiment of the present disclosure.

In the discussion that follows, the present apparatus is described as being vertically oriented. In certain embodiments, the apparatus is instead horizontally oriented or oriented at an oblique angle intermediate between vertical and horizontal, and may be rocked so as to facilitate convection of a supercritical fluid within the high pressure apparatus. The present methods may be used in conjunction with a sealable container and high pressure apparatus. Examples of representative applicable apparatus are described, for example, in U.S. Pat. Nos. 7,101,433, 7,125, 453, 7,160,388, 7,942,970, and 8,097,081, and in U.S. Application Publication Nos. 2009/030101388A1 and 2010/0320744A1. Reference is also made to FIG. 5, which lists the general steps for carrying out a process of crystal growth according to embodiments of the present disclosure. As shown, FIG. 5 is merely an illustration and is not intended to limit the scope of the claims herein. One of ordinary skill in the art will recognize that there are other variations, modifications, and alternatives.

Figure 1A:
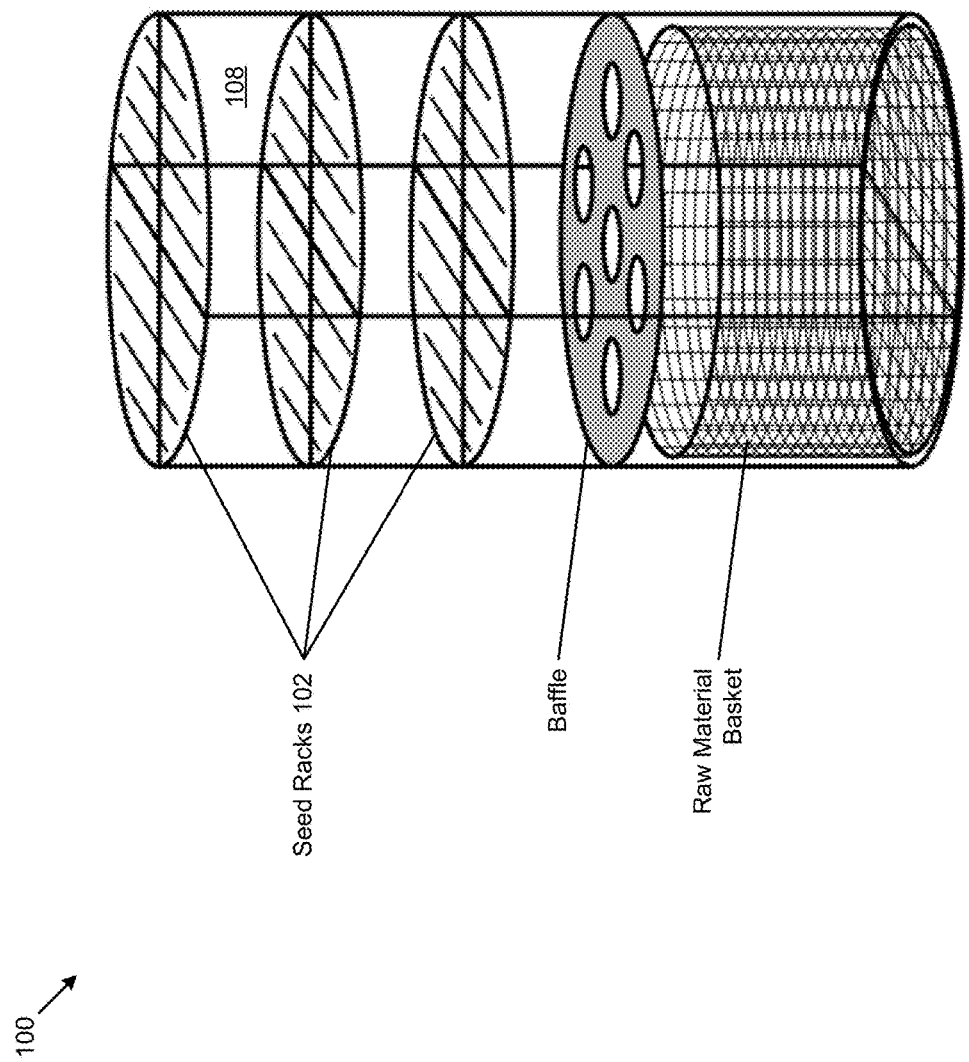
FIG. 1A and FIG. 1B show crystal growth frame structures according to embodiments of the present disclosure.
Figure 1B:
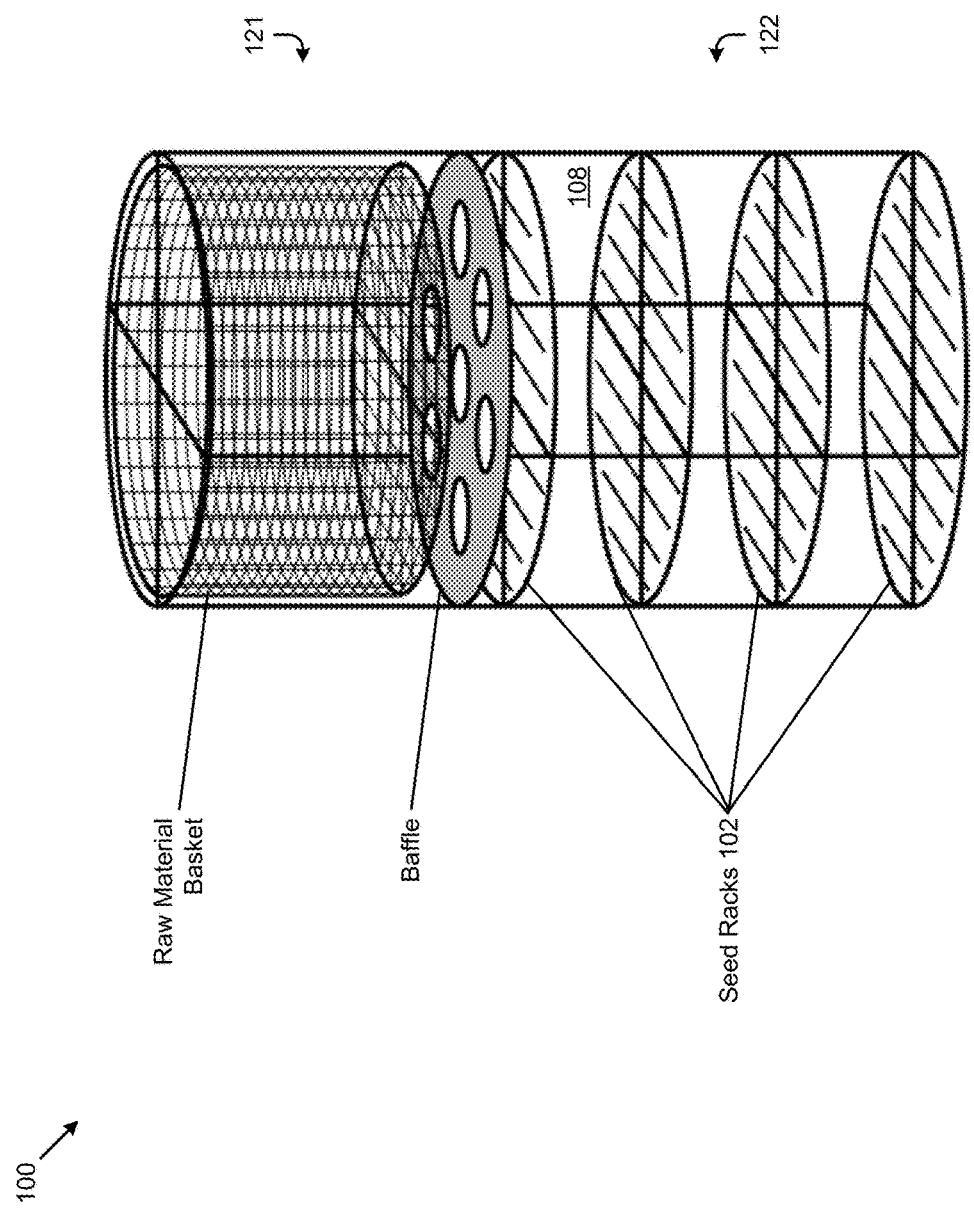

Schematics of a frame 100 for seed crystals and raw material is shown in FIG. 1A and FIG. 1B. The frame 100 enables seed crystals and raw material to be loaded into a suitable configuration for crystal growth prior to placement inside a sealable container (e.g., a high pressure apparatus, such as an autoclave or a capsule for placing into an autoclave or into an internally-heated high pressure apparatus) and in a form that is convenient for subsequent handling. The frame retains good rigidity under crystal growth conditions and is substantially chemically inert to the crystal growth environment, neither contributing to contamination of the growing crystals nor undergoing significant corrosion. The materials of construction of the frame and the components thereof may include, for example, one or more of copper, copper-based alloy, gold, gold-based alloy, silver, silver-based alloy, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, silica, alumina, zirconia, hafnia, combinations of any of the foregoing, and the like. Iron-based alloys that may be used to form the frame include, but are not limited to, stainless steels. Nickel-base alloys that may be used to form the frame include, but are not limited to, Inconel®, Hastelloy®, and the like. Again, there can be other variations, modifications, and alternatives. In certain embodiments, the components of the frame are fabricated from an alloy comprising at least two elements, for increased hardness and creep resistance. The frame and its components may comprise wire, wire cloth or mesh, foil, plate, sheet, square bar, round bar, rectangular bar, hexagonal bar, tubing, threaded rod, nuts, and fasteners. The frame and its components may be attached by means of welding, arc welding, resistance welding, ultrasonic welding, brazing, clamping, attachment by means of fasteners such as at least one of screws, bolts, springs, threaded rod, and nuts, and the like.

The frame may include, as components, a baffle, a raw material basket, and seed racks 102 for suspending seed crystal plates, plus a means for attaching at least two of the aforementioned components. In certain embodiments, as illustrated in FIG. 1A, appropriate for situations where the crystal to be grown has a solubility that increases with increasing temperature, the raw material basket is positioned below the baffle and the seed rack is positioned above the baffle. In certain embodiments, as illustrated in FIG. 1B, appropriate for the case where the crystal to be grown has a solubility that decreases with increasing temperature, i.e., retrograde solubility, the raw material basket is positioned above the baffle and the seed rack is positioned below the baffle. A larger volume may be provided for the crystal growing region 122, that is, the region containing the seed rack, than for the nutrient region 121, that is, the region containing the raw material basket. In certain embodiments, the ratio of the volumes of the crystal growing region and the nutrient region is between about 1 and about 5. In certain embodiments, this ratio is between about 1.25 and about 3, or between about 1.5 and about 2.5. The overall diameter and height of the frame are chosen for a close fit within the high pressure apparatus, so as to maximize the utilization of the available volume and optimize the fluid dynamics. The diameter of the frame may be between about 1 inch and about 2 inches, between about 2 inches and about 3 inches, between about 3 inches and about 4 inches, between about 4 inches and about 6 inches, between about 6 inches and about 8 inches, between about 8 inches and about 10 inches, between about 10 inches and about 12 inches, between about 12 inches and about 16 inches, between about 16 inches and about 24 inches, or greater than about 24 inches. The ratio of the overall height of the frame to its diameter may be between about 1 and about 2, between about 2 and about 4, between about 4 and about 6, between about 6 and about 8, between about 8 and about 10, between about 10 and about 12, between about 12 and about 15, between about 15 and about 20, or greater than about 20.

The baffle provides a means for dividing the sealable container into two separate regions (e.g., nutrient region 121, and a crystal growing region 122). The frame to be inserted into the sealable container comprises one or more disks. The two regions are in fluid communication with each other, that is, convection between the two regions is possible, as the baffle has a plurality of through-holes, openings, and/or an annular gap with respect to the inner diameter of the sealable container. Thus, a fraction of the cross-sectional area of the baffle is open. In a specific embodiment, the baffle has a fractional open area of between about 0.5% and about 30%, but can also have other percentages. In certain embodiments, the baffle has a fractional open area between about 2% and about 20%, or between about 5% and about 15%. The baffle serves the purpose of confining the at least one (or more) volumes of source material to a specific region or end of chamber 108, for example, within the raw material basket, while permitting solvent and, under high pressure high temperature (HPHT) conditions, supercritical fluid, to migrate throughout the sealable container by passing freely through through-holes in baffle. In certain embodiments, this feature is particularly useful in applications such as crystal growth, in which the supercritical fluid transports one material (e.g., a nutrient material), from one region of the chamber, defined by placement of baffle, to another region where crystal growth on seed crystals takes place. In certain embodiments, the diameter of the baffle is equal to the maximum diameter of the overall frame. In certain embodiments, the diameter of the baffle is slightly less than the maximum diameter of the overall frame, providing an annular space through which fluid can flow under crystal growth conditions. The diameter of the baffle may be less than the maximum diameter of the overall frame by about 0.5 inch or less. In certain embodiments, the diameter of the baffle is larger than the diameter of the overall frame. The diameter of the baffle may be larger than the maximum diameter of the overall frame by about 0.1 inch or more. The openings in the baffle should be large enough so as not to readily clog. In embodiments, the diameters of the openings in the baffle are between about 0.020 inch and about 0.5 inch. In certain embodiments, the diameters of the openings in the baffle are between about 0.050 inch and about 0.25 inch. In one specific embodiment, the baffle comprises a single disk with a thickness between about 0.020 inch and about 0.5 inch. In certain embodiments, the baffle comprises a single disk with a thickness between about 0.050 inch and about 0.25 inch. In certain embodiments, the baffle comprises two disks, three disks, or more. In some multi-disk embodiments, one or more of the openings in the disks lie above one another. In certain multi-disk embodiments, one or more of the openings in the disks do not lie above one another. The effective fractional open area in multi-disk baffle embodiments may therefore lie between the fractional open area of each disk, as an upper bound, and the product of the fractional open areas of each disk.

The raw material basket provides a convenient means for transferring the raw material, including source material and mineralizer, into the sealable container, for permitting facile fluid convection from the region between source material particles within the raw material basket and the crystal growth region, and for removing un-consumed source material from the reactor at the conclusion of a growth run. In certain embodiments, the raw material basket comprises wire mesh or wire cloth, as indicated schematically in the figures. The diameter of the wire in the mesh or cloth may be between about 0.001 inch and about 0.25 inch, between about 0.005 inch and about 0.125 inch, or between about 0.010 inch and about 0.080 inch. The mesh or cloth may be defined by a percentage of open area which comprises the ratio of open space between the wires to the total area of the piece of mesh or cloth. The percent open area may be between about 1% and about 99%, between about 2% and about 50%, or between about 5% and about 30%. The wire mesh or wire cloth may be contained within, around and/or, optionally, attached to a frame comprising larger-diameter wire so as to provide improved mechanical support. In certain embodiments, the raw material basket comprises foil or plate with a plurality of through-holes, slots, slits, or openings. The size of the openings in the wire mesh, wire cloth, or foil or plate should be small enough so that raw material particles do not pass through them during crystal growth, even after a significant portion of the raw material has been etched and/or consumed by the crystal growth operation. In one specific embodiment, the openings in the wire mesh, wire cloth, or foil or plate have a diameter between about 0.005 inch and about 0.5 inch. In certain embodiments, the openings have a diameter between about 0.010 inch and about 0.125 inch, or between about 0.025 inch and about 0.080 inch. In certain embodiments, hollow pipes, with openings that may be covered by wire mesh, are placed within the raw material basket prior to loading of the raw material so as to improve fluid communication between the region between raw material particles within the raw material basket and the crystal growth region. Suitable configurations for such hollow pipes are disclosed, for example, in U.S. Pat. No. 3,245,760.

In certain embodiments, the source material is placed in the raw material basket prior to placement of seed crystals on the seed rack, so as to minimize the likelihood of breakage of the seed crystals. The source material may be supplied in various forms. In certain embodiments, the source material comprises single crystals or chunks or grit of polycrystalline material. In certain embodiments, the source material comprises chunks of sintered polycrystalline material. In the case of gallium nitride, the source material may be derived from by-product single- or poly-crystalline GaN deposited on the wall or miscellaneous surfaces with a hydride vapor phase epitaxy (HVPE) reactor. In certain embodiments, the source material comprises plates of single- or poly-crystalline GaN grown on a substrate by HVPE. In certain embodiments, the source material is derived from sintered GaN powder, as disclosed, for example, in U.S. Pat. No. 6,861,130. In certain embodiments, the source material is derived from polycrystalline GaN plates comprising a columnar microstructure, as disclosed, for example, in U.S. Application Publication No. 2010/0151194A1. In certain embodiments, the source material may comprise GaN grown by an ammonothermal method, including by-product material. The source material may contain oxygen provided as a group III metal oxide or as a substitutional or interstitial impurity within a group III metal nitride at a concentration below about $10^{19}$ cm$^{-3}$, below about $10^{18}$ cm$^{-3}$, or below about $10^{17}$ cm$^{-3}$. The source material may contain an n-type dopant, such as Si or O, a p-type dopant, such as Mg or Zn, a compensatory dopant, such as Fe or Co, or a magnetic dopant, such as Fe, Ni, Co, or Mn, at concentrations between about $10^{16}$ cm$^{-3}$ and about $10^{21}$ cm$^{-3}$. The source material may further comprise a getter, at a level greater than about 200 parts per million. In certain embodiments, the particle size distribution of the source material lies between about 0.020 inch and about 5 inches. In certain embodiments, the particle size distribution of the source material lies between about 0.050 inch and about 0.5 inch. In certain embodiments, the total surface area of the source material is greater, by at least a factor of three, than the total surface area of all the seed crystal plates that are placed in the seed rack. As used herein, the term plate encompasses seed crystals.

In certain embodiments, the source material comprises a metal that will become molten at elevated temperatures, for example, gallium or indium. In certain embodiments, the mineralizer comprises a metal that will become molten at elevated temperatures, for example, sodium, potassium, or lithium. If placed in direct contact with the inner surface of an autoclave or a capsule, the metal may form an alloy, compromising the integrity of the autoclave or capsule. In certain embodiments, therefore, at least one crucible is placed within or proximate to the raw material basket and contains at least one metal. The crucible should be substantially chemically inert with respect to the supercritical fluid crystal growth environment and should not react or alloy with the at least one metal. In certain embodiments, the crucible comprises molybdenum, tantalum, niobium, iridium, platinum, palladium, gold, silver, nickel, chromium, ruthenium, rhodium, tungsten, or a combination of any of the foregoing. In certain embodiments, the crucible comprises alumina, magnesia, calcia, zirconia, hafnia, yttria, aluminum nitride r gallium nitride, or a combination of any of the foregoing. The crucible may comprise a sintered or other polycrystalline material.

The seed rack provides a convenient means for transferring seed crystals or plates into the sealable container, for permitting facile fluid convection between the seed crystals or plates and the nutrient region on the other side of the baffle, and for removing the grown crystals from the reactor at the conclusion of a growth run. The seed rack should be easy to load and unload, enable efficient usage of the available crystal growth volume, and minimize breakage and other yield losses of the crystals.

In certain embodiments, the seed crystals or plates comprise gallium nitride. In certain embodiments, the seed crystals or plates may comprise aluminum nitride, indium nitride, indium gallium nitride, sapphire, silicon carbide, MgAl$_2$O$_4$ spinel, zinc oxide, or the like. The seed plates have a minimum lateral dimension of at least about one centimeter. In certain embodiments, the seed plates have a maximum lateral dimension of at least about two centimeters and a minimum lateral dimension of at least one centimeter. In certain embodiments, the seed plates have minimum lateral dimensions of at least about three centimeters, at least about four centimeters, at least about five centimeters, at least about six centimeters, at least about eight centimeters, or at least about ten centimeters. In certain embodiments, the seed plates are bulk single crystals of gallium nitride. In certain embodiments, the seed plates are prepared from crystals that are grown by hydride vapor phase epitaxy. In certain embodiments, the seed plates are prepared from crystals that are grown ammonothermally. In certain embodiments, the seed plates are prepared from crystals that are grown from solution. In certain embodiments, the seed plates are prepared by the method disclosed in U.S. Patent Application No. 61/078,704, which is incorporated by reference in its entirety. In certain embodiments, the dislocation density at the large-area surfaces of a seed plate is less than about $10^6$ cm$^{-2}$. In certain embodiments, the dislocation density at the large-area surfaces of a seed plates is less than about $10^5$ cm$^{-2}$, less than about $10^4$ cm$^{-2}$, less than about $10^3$ cm$^{-2}$, and in certain embodiments, less than about $10^2$ cm$^{-2}$. In certain embodiments, the full width at half maximum of the x-ray diffraction peak corresponding to the crystallographic orientation of a large-area surface is less than about 300 arc seconds, less than about 150 arc seconds, less than about 100 arc seconds, or less than about 50 arc seconds.

Gallium nitride is a hexagonal, wurtzite-structure crystal (space group P6$_3$mc; point group 6 mm) with distinct growth sectors. Under a given set of growth conditions, growth occurs at different rates in the +c direction, the −c direction, the m directions, the a directions, and in other crystallographic directions. In general, fast-growing directions tend to grow themselves out of existence, so that the resulting crystals are terminated mainly by facets associated with the slower-growing directions. The most commonly occurring facets under ammonothermal growth conditions are c-plane (0 0 0 1) and (0 0 0 −1), and m-plane {1 −1 0 0}. Other planes, for example, a-plane {1 1 −2 0} and semi-polar {1 −1 0 1} and/or {1 −1 0 −1} occur less frequently or with smaller areas. Manufacturing efficiency is enhanced by using seed crystals or plates that are already large in a relatively slow-growing dimension, and performing the predominant crystal growth in a relatively faster growing direction. In certain embodiments, the large area faces of the seed plates are stable under the pre-selected growth conditions, i.e., do not facet, which is facilitated by selecting seed plates with (0 0 0 1), (0 0 0 −1), {1 −1 0 0}, {1 1 −2 0}, {1 −1 0 1}, or {1 −1 0 −1} orientations. The terms large area face and large area surface are used interchangeably herein.

In addition, the tendency for impurity uptake differs from one growth sector to another. For example, as shown by Frayssinet et al. (Journal of Crystal Growth, volume 230, pages 442-447 (2001)), the concentration of free carriers caused by point defects is markedly different in the +c and −c growth sectors of unintentionally-doped bulk GaN crystals grown by a particular technique. Similar results have been reported by other authors, with the general tendency that the (0 0 0 −1), or −c, growth sector incorporates a higher impurity concentration than does the (0 0 0 1), or +c, growth sector. Differential impurity uptake is undesirable for at least two reasons. First, the presence of concentration gradients within crystals makes it more difficult for the crystal manufacturer to maintain consistent product specifications. Second, the presence of concentration gradients within the crystal generates strain (typically, impurities in GaN cause a slight increase in the lattice constants), which can lead to bow, cracking, dislocation generation, and other detrimental effects. Manufacturing efficiency, including yield, product quality, and product consistency, is enhanced by restricting the predominant crystal growth to occur in only one growth sector.

In certain embodiments, manufacturing growth is desired to occur predominantly on m planes. For example, under a predetermined set of growth conditions crystal growth may occur more rapidly in the a directions than in the m directions, and more rapidly in the m direction than in the +c or −c directions. Under such a predetermined set of growth conditions, spontaneously nucleated and grown crystals will take the shape of hexagonal platelets, with large c facets and long m-plane-terminated side edges and a thickness that is less than the diameter. Growth in the m direction could also be desired by virtue of improved crystallographic quality, reduced impurity incorporation, or, conversely, by increased capability for incorporation of dopants or band-gap modifiers such as Al or In. Growth in the m direction may also be ideal for producing m-plane-oriented wafers. Opposite faces on an m-plane oriented seed crystal or plate will both constitute m planes, so use of such a seed crystal would produce growth in a single crystallographic growth sector.

Figure 2A:
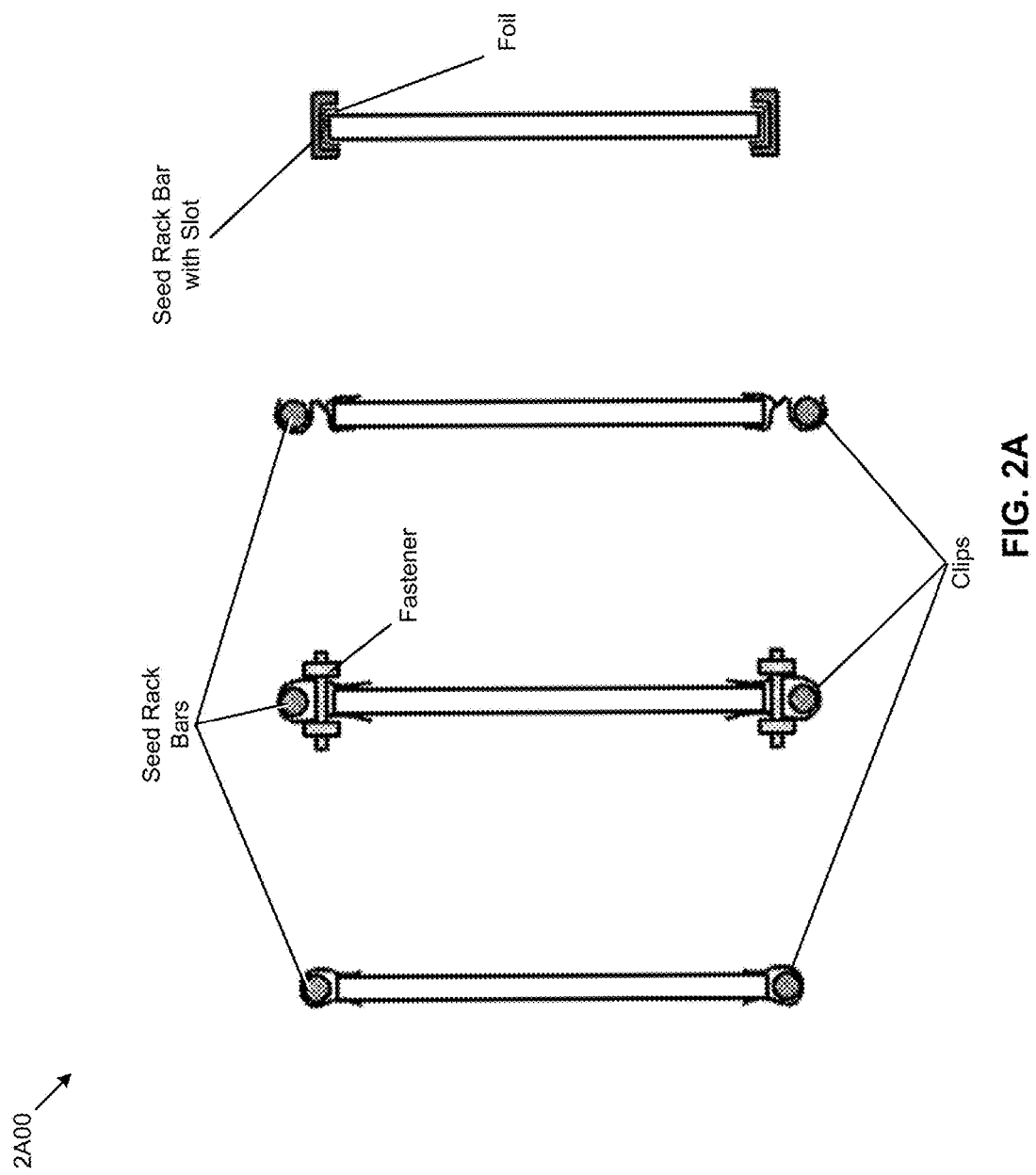
FIG. 2A, FIG. 2B, and FIG. 2C show crystal growth seed rack structures according to embodiments of the present disclosure.
Figure 2B:
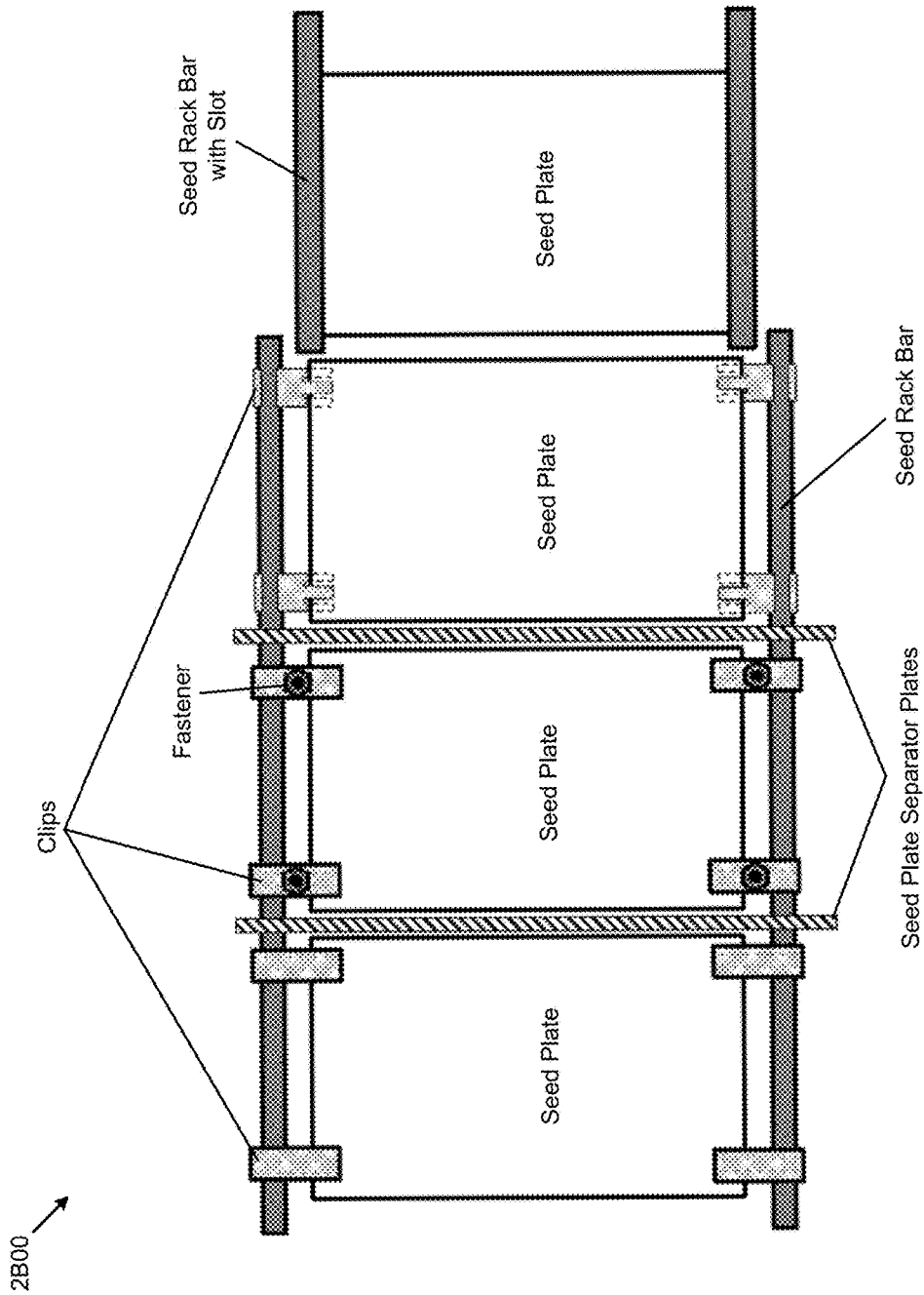
Figure 2C:
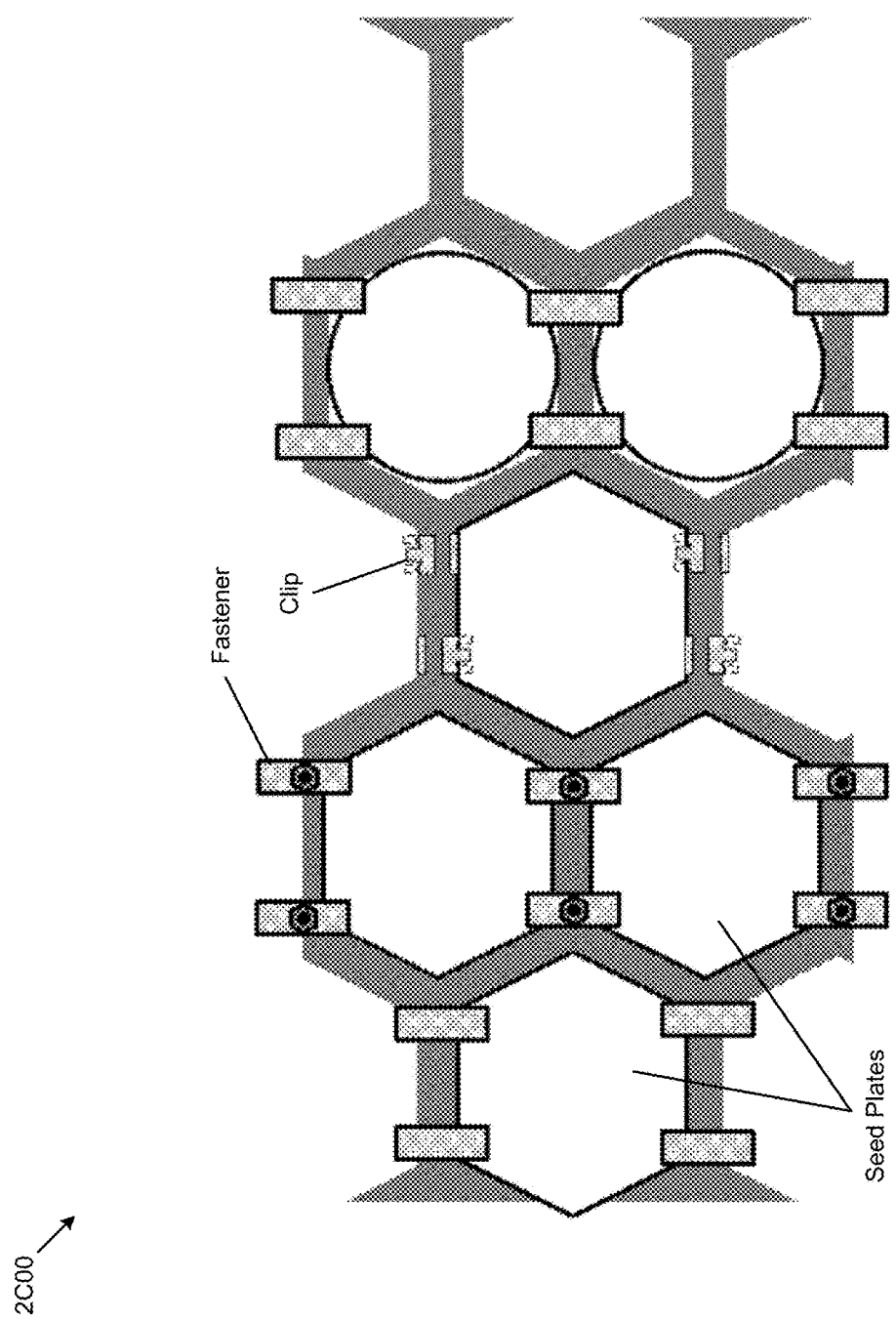

In certain embodiments, seed crystals are attached to a seed rack as shown in FIG. 2A, as shown in FIG. 2B, and in FIG. 2C. Individual seed crystals or plates may be selected or cut to have approximately the same height, so that multiple seed crystals or plates may be placed adjacent to one another in a tier of the seed rack. The seed crystals may have rectangular large-area faces or surfaces. The seed crystals may be placed between upper and lower seed rack bars and held in place by means of clips. The clips may clamp the seed crystals by spring force, by virtue of the seed crystal being thicker than the separation between opposite sides of the clip when the latter is free standing and relaxed. In an alternative set of embodiments, the seed crystal is affixed to the clip by virtue of a fastener positioned proximate to the clip, seed crystal, and seed rack, such as a length of threaded rod with nuts on opposite ends. In certain embodiments, the clips are attached to the seed crystals first and then attached to the seed rack. In certain embodiments, the clips have at least one opening through which the crystal can grow, so as to minimize strain and defect generation. In certain embodiments, the seed rack comprises recesses, slots, hollows, or the like, into which opposite ends of the seed crystals are slid. Pieces of foil may be placed between the seed crystals and the recesses in the seed rack so as to facilitate removal after crystal growth. In certain embodiments, each seed crystal is attached to the seed rack in at least two positions, so as to minimize the likelihood of seed or crystal breakage before, during, or after crystal growth, and to hold the seed crystals accurately in the desired positions in the reactor. Adjacent seed crystals or plates may be separated by a crystal separator plate. The crystal separator plates may have holes that slide over the seed rack bar(s), may have slots that are open on one side so as to slide over the seed rack bar, or the like.

In certain embodiments, holes or slots are provided in the seed crystals or plates, and the seed crystals or plates are suspended from the seed rack by at least one wire or foil strip. In certain embodiments, the seed crystals are suspended by at least two, at least three, or at least four wires or foil strips. The holes or slots in the seed crystals or plates may be formed by laser drilling or cutting, by ultrasonic drilling, by mechanical drilling or milling, by grinding, by sanding, by electric discharge machining, by water jet cutting, or the like.

In certain embodiments, manufacturing growth is desired to occur predominantly on m planes. Growth in the m direction may provide a useful means for preparing non-polar and/or semipolar substrate orientations. Growth in the m direction may also be desired for improved crystallographic quality, reduced impurity incorporation, or, conversely, by increased capability for incorporation of dopants or band-gap modifiers such as Al or In. Opposite faces on an m-plane oriented seed crystal or plate will both constitute m-planes, so use of such a seed crystal will produce growth in a single crystallographic growth sector.

In certain embodiments, manufacturing growth is desired to occur predominantly on a-planes. Growth in the a direction may provide a useful means for preparing non-polar and/or semi-polar substrate orientations. Growth in the a direction may also be desired for improved crystallographic quality, reduced impurity incorporation, or, conversely, by increased capability for incorporation of dopants or band-gap modifiers such as Al or In. Opposite faces on an a-plane oriented seed crystal or plate will both constitute a-planes, so use of such a seed crystal will produce growth in a single crystallographic growth sector.

In certain embodiments, manufacturing growth is desired to occur predominantly on c-planes, either in the +c direction (the [0 0 0 1] Ga-polar direction) or −c direction (the [0 0 0 −1] N-polar direction). For example, under a predetermined set of growth conditions crystal growth may occur more rapidly in the +c or −c direction than in the m direction. Under such a predetermined set of growth conditions, spontaneously nucleated and grown crystals will take the shape of hexagonal pillars, prisms, or needles, with small c facets and long m-plane-terminated side edges and a length that is less than the diameter. Growth in the +c or −c direction could also be desired by virtue of improved crystallographic quality, reduced impurity incorporation, or, conversely, by increased capability for incorporation of dopants or band-gap modifiers such as Al or In. Growth in the +c or −c direction may also be ideal for producing c-plane-oriented wafers. Opposite faces on a c-plane oriented seed crystal or plate constitute different planes, so use of such a seed crystal alone would produce growth in two distinct crystallographic growth sectors. Growth in a single crystallographic growth sector may be achieved by stacking pairs of c-plane-oriented seed crystals or plates back to back, with like faces facing one another. For example, the −c face of two c-plane-oriented seed crystals or plates may be faced proximate to one another, so that the +c faces of the two c-plane-oriented seed crystals or plates face outward and thereby yield growth in a single crystallographic orientation. Conversely, the +c face of two c-plane-oriented seed crystals or plates may be faced proximate to one another, so that the −c faces of the two c-plane-oriented seed crystals or plates face outward and thereby yield growth in a single crystallographic orientation. Pairs of seed crystals can be placed in direct contact with one another or could be separated by a crystal separator plate. Pairs of seed crystals placed back to back may be separated by a predetermined gap. The predetermined gap may be, less than about 5 millimeters, less than about 2 millimeters, less than about 1 millimeter, less than about 0.3 millimeter, less than about 0.1 millimeter, less than about 0.03 millimeter, or less than about 0.01 millimeter. The predetermined gap may be essentially zero, that is, with the seed crystals in direct contact. If the pairs of seed crystals or plates grow together during a growth run they may be separated after the run, if desired, or may be left together for use as a seed (bi-) crystal in a subsequent run. A c-plane-oriented bi-crystal, on which both large-area faces constitute +c or −c surfaces, is suitable for use as a seed, as growth on the large area faces will occur in only a single crystallographic direction. At least one contact twin or stacking fault, oriented substantially parallel to the large-area surfaces, may be present in the bi-crystal. Schematic illustrations of a bi-crystal are shown in FIG. 4B, where the alternative shadings indicate grains that are separated by a twin, grain boundary, or other boundary. In certain embodiments, the back sides of the pairs of seed crystals may be wafer-bonded together, for example, using techniques described in U.S. Publication NO. 2012/0000415, which is incorporated by reference in its entirety.

In certain embodiments, manufacturing growth is desired to occur predominantly on the semi-polar {1 −1 0 ±1} family of planes, that is, one of the (1 −1 0 1), (−1 1 0 1), (1 0 −1 1), (−1 0 1 1), (0 1 −1 1), (0 −1 1 1), (1 −1 0 −1), (−1 1 0 −1), (1 0 −1 −1), (−1 0 1 −1), (0 1 −1 −1), or (0 −1 1 −1), planes. For brevity, the {h k i l} family of planes is referred to herein as the {h k i l} planes, the {h k i l} plane, or the (h k i l) plane. Similarly, for brevity the <h k i l> family of directions is referred to herein as the <h k i l> directions, the <h k i l> direction, or the [h k i l] direction. Growth in these semipolar directions may be desired for improved crystallographic quality, reduced impurity incorporation, or, conversely, by increased capability for incorporation of dopants or band-gap modifiers such as Al or In. Growth perpendicular to the {1 −1 0 −1} plane may also be suitable for producing {1 −1 0 −1}-oriented wafers. Opposite faces on an {1 −1 0 −1}-oriented seed crystal or plate constitute different planes, so use of such a seed crystal alone can produce growth in two distinct crystallographic growth sectors. Growth in a single crystallographic growth sector may be achieved by stacking pairs of {1 −1 0 −1}-oriented seed crystals or plates back to back, with the {1 −1 0 1}-oriented faces facing one another. The pairs of seed crystals may be placed in direct contact with one another or could be separated by a crystal separator plate. If the pairs of seed crystals or plates grow together during a growth run they may be separated after the run, if desired, or may be left together for use as a seed (bi-)crystal in a subsequent run. A {1 −1 0 −1}-oriented bi-crystal, on which both large-area faces constitute {1 −1 0 −1} surfaces, is suitable for use as a seed crystal, as growth on the large area faces will occur in only a single crystallographic direction. At least one contact twin, stacking fault, grain boundary, or other boundary, oriented substantially parallel to the large-area surfaces, may be present in the bi-crystal.

In certain embodiments, manufacturing growth is desired to occur predominantly on the semi-polar {2 −2 0 ±1} plane, the {3 −3 0 ±1} plane, the {6 −6 0 ±1} plane, the {3 −3 0 ±2} plane, the {5 −5 0 ±4} plane, or the {5 −5 0 ±2} plane. Growth on these semipolar planes may be desired for improved device performance, improved crystallographic quality, reduced impurity incorporation, or, conversely, by increased capability for incorporation of dopants or band-gap modifiers such as Al or In. Growth perpendicular to the {2 −2 0 −1}, {3 −3 0 −1}, {6 −6 0 −1}, {3 −3 0 −2}, {5 −5 0 −4}, or {5 −5 0 −2} planes may also be suitable for producing {2 −2 0 −1}-, {3 −3 0 −1}-, {6 −6 0 −1}-, {3 −3 0 −2}-, {5 −5 0 −4}-, or {5 −5 0 −2}-oriented wafers. Opposite faces on a {2 −2 0 −1}-, {3 −3 0 −1}-, {6 −6 0 −1}-, {3 −3 0 −2}-, {5 −5 0 −4}-, or {5 −5 0 −2}-oriented seed crystal or plate constitute different planes, so use of such a seed crystal alone may produce growth in two distinct crystallographic growth sectors. Growth in a single crystallographic growth sector may be achieved by stacking pairs of {2 −2 0 −1}-, {3 −3 0 −1}-, {6 −6 0 −1}-, {3 −3 0 −2}-, {5 −5 0 −4}-, or {5 −5 0 −2}-oriented seed crystals or plates back to back, with the {2 −2 0 1}-, {3 −3 0 1}-, {6 −6 0 1}-, {3 −3 0 2}-, {5 −5 0 4}-, or {5 −5 0 2}-oriented faces facing one another. The pairs of seed crystals may be placed in direct contact with one another or may be separated by a crystal separator plate. If the pairs of seed crystals or plates grow together during a growth run they may be separated after the run, if desired, or may be left together for use as a seed (bi-) crystal in a subsequent run. A {2 −2 0 −1}-, {3 −3 0 −1}-, {6 −6 0 −1}-, {3 −3 0 −2}-, {5 −5 0 −4}-, or {5 −5 0 −2}-oriented bi-crystal, in which both outward-facing large-area faces constitute {2 −2 0 −1}-, {3 −3 0 −1}-, {6 −6 0 −1}-, {3 −3 0 −2}-, {5 −5 0 −4}-, or {5 −5 0 −2} surfaces, is suitable for use as a seed crystal, as growth on the large area faces will occur in only a single crystallographic direction. At least one contact twin, stacking fault, grain boundary, or other boundary, oriented substantially parallel to the large-area surfaces, may be present in the bi-crystal.

In certain embodiments, manufacturing growth is desired to occur predominantly on semi-polar planes. Semipolar planes may be designated by (h k i l) Miller indices, where i=−(h+k), l is nonzero and at least one of h and k are nonzero. For example, growth on (1 0 −1 −1) planes may be desired over growth on (1 0 −1 1) planes because of a higher growth rate, improved crystallographic quality, reduced impurity incorporation, or, conversely, by increased capability for incorporation of dopants or band-gap modifiers such as Al or In. Growth in semipolar directions may be ideal for producing semi-polar-oriented wafers. Opposite faces on a semi-polar oriented seed crystal or plate constitute different planes, so use of such a seed crystal alone would produce growth in two distinct crystallographic growth sectors. Growth in a single crystallographic growth sector may be achieved by stacking pairs of semi-polar-oriented seed crystals or plates back to back, with like faces facing one another. For example, the (1 0 −1 1) face of two semi-polar seed crystals or plates may be faced proximate to one another, so that the (1 0 −1 −1) faces of the two seed crystals or plates face outward and yield growth in a single crystallographic orientation. More generally, the (h k i l) face of two semipolar seed crystals or plates may be placed proximate to one another, so that the (h k i −l) faces of the two seed crystals or plates face outward and yield growth in a single crystallographic orientation. The pairs of seed crystals may be placed in direct contact with one another or may be separated by a crystal separator plate. If the pairs of seed crystals or plates grow together during a growth run they may be separated after the run, if desired, or may be left together for use as a seed (bi-)crystal in a subsequent run. A semi-polar bi-crystal, on which both large-area faces constitute the same semi-polar orientation, is suitable for use as a seed, as growth on the large area faces will occur in only a single crystallographic direction.

In certain embodiments, polar or semi-polar seed crystals may be placed back to back to each other, with the outward-facing surfaces having substantially the same crystallographic orientation as one another, by means of wafer bonding, die bonding, or the like. Similarly, the inward-facing surfaces of pairs of polar ((0001) +c-plane or (000-1) -c-plane) or semipolar seed crystals may have substantially the same crystallographic orientation as one another (and different than the respective outward-facing surfaces). For example, the back sides of the crystals may be coated with one or more of gold, titanium-gold, silicon-gold, gold-tin, gold-indium, copper-tin, gold-germanium, aluminum-germanium, nickel, chromium, copper, aluminum, silica ($SiO_2$), or the like, placed into contact with one another, and heated and/or pressed against one another to form a bond.

In certain embodiments, particularly when the seed or seed plate constitutes a bi-crystal or a wafer-bonded composite of two crystals, one or more edges of the crystal or crystals may be passivated so as to avoid undesirable growth, for example, rapid growth of a crystal with a re-entrant twin or of a polycrystal, during an ammonothermal crystal growth process. In certain embodiments, at least one edge may be coated with at least one of nickel, chromium, titanium, gold, platinum, or silver, for example, by thermal evaporation, electron-beam evaporation, sputtering, or the like.

In certain embodiments, manufacturing growth of nominally non-polar, m-plane crystals is desired to occur predominantly on planes having a miscut, such as about 0.5 degree to about 5 degrees towards the +c [0001], −c [000−1], or a <11−20> directions. Such an orientation is actually semipolar and the front and back of parallel faces of such a seed crystal will not be crystallographically equivalent. For example, if the front face of a parallel-faced seed is miscut by 5 degrees from m towards +c, the back face will be miscut by 5 degrees from m towards −c. This problem can be avoided by having both the front and back large-area surfaces of the seed cut to expose substantially the same crystallographic orientation, thereby producing a wedge angle θ between the front and back surfaces, rather than cutting such that the surfaces are parallel. For example, both sides of a seed may be cut 3 degrees from m towards −c, with a 6-degree wedge angle θ between the front and back surfaces, rather than cutting them parallel.

The miscut angle on both sides of a non-polar m-plane seed crystal may be less than about 5 degrees, less than about 2 degrees, or less than about 1 degree towards the −c [000−1] direction. The miscut angle on both sides of a non-polar m-plane seed crystal may be less than about 1 degree, less than about 0.5 degree, less than about 0.2 degree, or less than about 0.1 degree towards the <11−20> a direction. The miscut angle on at least one side of a non-polar m-plane seed crystal may between about 0 and about 2 degrees, or between about 0 and about 1 degree, between on-axis <10−10> m-plane and the [0001] +c direction.

For growth of a nominally semipolar boule the appropriate wedge angle may be larger. For example, the (10−1−1) facet may be stable during ammonothermal crystal growth of GaN under a particular set of conditions but the orientation of a parallel-cut seed crystal, the (10−11) facet may not be. The (10−1−1) orientation makes an angle of approximately 28 degrees from the (10−10) m-plane, and another {10−1−1} plane lies another 28 degrees from this m-plane in the other direction. Therefore, a seed crystal with a wedge angle θ of approximately 56 degrees and two large-area {10-1-1} faces could be used.

Figure 7:
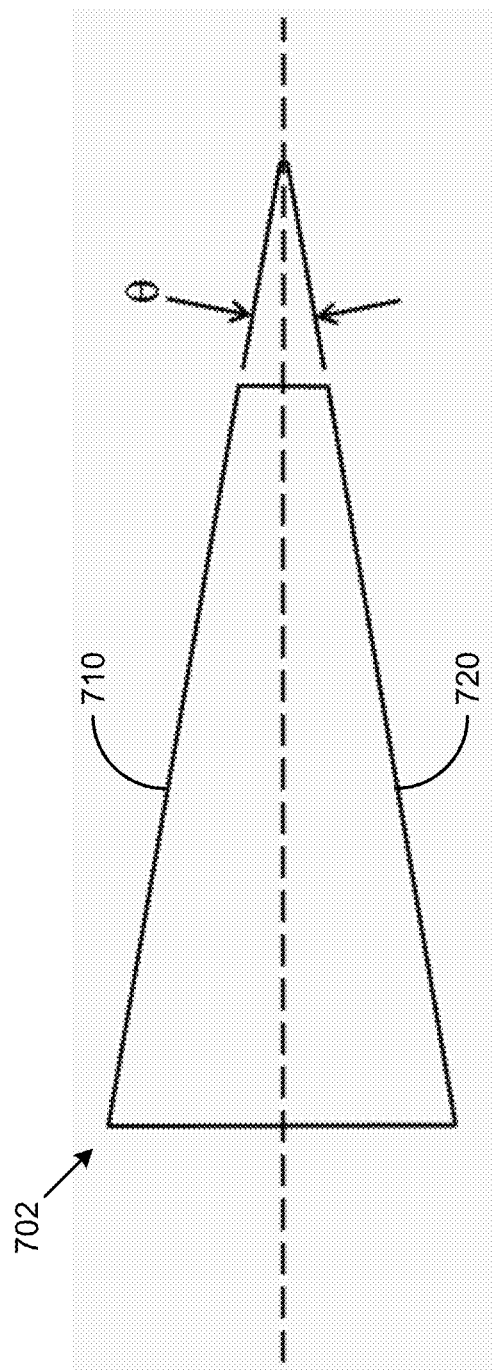
FIG. 7 is a diagram illustrating a wedge-shaped seed plate according to embodiments of the present disclosure.

A wedge-shaped seed crystal 702, as shown in FIG. 7, may be characterized by having a non-cubic crystal structure, for example, wurtzite. Large-area surfaces 710 and 720 have crystallographic orientations that are equivalent to one another, to within about 5 degrees, to within about 2 degrees, to within about 1 degree, to within about 0.5 degree, to within about 0.2 degree, or to within about 0.1 degree, and the wedge angle θ between the two large-area surfaces 710 and 720 is between about 1 degree and about 60 degrees, between about 1 degree and about 30 degrees, or between about 1 degree and about 10 degrees. The crystallographic orientations of the two large-area surfaces may differ from strict equivalency by at least about 0.01 degree, at least about 0.02 degree, at least about 0.05 degree, at least about 0.1 degree, at least about 0.2 degree, at least about 0.5 degree, or at least about 1 degree.

Epitaxial growth of III-nitride materials on a GaN substrate can be sensitive to miscut with respect to a nominal crystallographic orientation. For example, Hirai et al. (Appl. Phys. Lett. 91, 191906 (2007)]) disclose epitaxial GaN layers and LED structures by metalorganic chemical vapor deposition (MOCVD) on m-plane substrates that were on-axis or were miscut by 0.2°, 0.5°, 2°, or 5° in the a-direction or by 0.45°, 5.4°, or 9.7° in the −c-direction. They found that the surface morphology of the on-axis structures was dominated by pyramidal hillocks, and that the hillocks could be largely eliminated by increasing the miscut angle to 0.5° or greater. However, the surface morphology deteriorated for a-miscut angles of 2° or greater. Similarly, Yamada et al. (J. Cryst. Growth, 310, 4968 (2008)) investigated InGaN/GaN epitaxial structures grown by MOCVD on m-plane substrates that were accurately on-axis or were miscut by 1°, 5°, or 10° toward the a-direction, by 1°, 2°, 3°, or 10° toward the +c-direction, or by 1°, 2°, 3°, 5°, or 10° toward the −c-direction. They reported that the surface roughness, the presence of hillocks, and the luminescence wavelength were sensitive to the miscut angle, with differences of 1° or 2° often having marked effects. Also, Lai et al. (J. Cryst. Growth 312, 902 (2010)) prepared m-plane substrates that were miscut by 0.1° or 0.7° towards the +c-direction or by 0.1° towards the a-direction and by 0.1° or 0.3° towards the +c-direction. These authors found that the surface roughness and the emission wavelength of InGaN/GaN epitaxial structures deposited on these substrates were sensitive to the miscut angle, with a difference as small as 0.2° having a large effect. When a miscut of only 0.1° in the a-direction was present, the surface roughness in pure n-type GaN layers was more than 25-times higher if the miscut angle in the +c-direction was 0.3° rather than 0.1°. As an additional example, Isobe et al. (Phys. Stat. Solidi (a) 208, 1191 (2011)) grew AlGaN/GaN heterostructures on m-plane bulk GaN substrates that were miscut by 0.3°, 1.2°, 3°, or 4° in the c-direction. Pure GaN constituted 99% of the layer thickness and therefore most of the observed effects were a consequence of simple GaN-on-GaN epitaxy. They found that the surface roughness and crystalline quality worsened significantly with increasing miscut angle, with a large drop-off as the miscut angle was increased from 0.3° to 1.2°. Confirming the sensitivity to substrate misorientation angle, Lin et al. (Appl. Phys. Express 2, 082102 (2009)) disclose that the surface morphology and laser diode device performance was markedly better when epitaxy was performed on m-plane substrates that were miscut by 1° towards the −c-direction than was the case with on-axis substrates.

These effects of surface orientation on epitaxy are not peculiar to MOCVD growth. For example, Sawicka et al. (J. Vac. Sci. Technology B 29, 03C135 (2011)) disclose that molecular beam epitaxy (MBE) on substrates vicinal to m-plane were strongly anisotropic and the morphology depended on both the miscut angle and miscut direction.

While the preceding discussion has focused on GaN epitaxy on vicinal m-plane substrates, the sensitivity of epitaxy to substrate misorientation is not unique to m-plane or even to GaN. For example, Xu et al. (Phys. Stat. Solidi (a) 202, 727 (2005)) reported the formation of hillocks upon MOCVD epitaxy on on-axis c-plane GaN substrates, but a miscut of 1, 2, 4, or 8 degrees in the m-direction or a-direction enabled growth of smooth layers. It is well known that surface morphology during crystal growth is determined by a competition between the rates of overall deposition, surface migration, nucleation of new layers, and "sticking" of growth species to step and to kink sites, the latter being very sensitive to miscut angle.

The optimum crystal growth process by a given method, for example ammonothermal growth, will in general differ for different crystallographic orientations of the seed crystals. An efficient manufacturing process may therefore involve growth on a large number of seed crystals, for example, at least three, at least 10, at least 25, at least 50, at least 100, at least 250, at least 500, or at least 1000, each of which perform similarly during the growth process. One might well conclude from the preceding discussion that to achieve an efficient manufacturing process for ammonothermal GaN crystals the surface orientation of each seed crystal must be controlled to a very high precision, for example, less than 0.05°. Surprisingly, however, we find that high fidelity ammonothermal crystal growth can be achieved when the misorientation angle from one seed crystal to another is greater than about 0.05 degree, greater than about 0.1 degree, greater than about 0.2 degree, greater than about 0.3 degree, greater than about 0.4 degree, greater than about 0.5 degree, greater than about 0.7 degree, or greater than about 1 degree, as long as the orientations are equivalent to within about 1 to about 5 degrees in specific crystallographic directions. This prescription enables a considerable reduction in the cost of preparing seed crystals, relative to the cost of maintaining extremely tight tolerances on the crystallographic orientation of each large-area face. In the case of growth on nominally m-plane seed crystals, as described in the examples, we find that high quality growth can be achieved when the miscut angle in the c-direction lies between about 5 degrees toward [000−1] and about 1 degree toward [000+1] and the miscut angle in the a-direction is less than or equal to about 1 degree for each large-area surface of each of a plurality of seeds. This specification for crystallographic orientation is illustrated schematically in FIG. 14.

In certain embodiments, the seed crystals or plates have a rectangular or approximately rectangular shape. An approximately rectangular shape may be particularly appropriate for m-plane or a-plane seed plates. In certain embodiments, the corners of the seed crystals or plates are rounded or chamfered so as to minimize the likelihood of breakage. Rectangular shapes are convenient for mounting and for efficiently utilizing space within a high pressure crystal growth reactor. In certain embodiments, the seed crystals or plates have a hexagonal or approximately hexagonal shape. A hexagonal shape may be particularly convenient when working with c-plane-oriented seed crystals or plates. In certain embodiments, the seed crystals or plates have a circular, oval, or approximately circular or oval shape.

In certain embodiments, particularly those with non-rectangular seed crystals or plates, the seed crystals may be arranged in a non-rectangular, close-packed way, as shown in FIG. 2C. Rather than comprising linear arrays of bars arranged into multiple tiers stacked vertically, the seed rack may comprise a honeycomb-type arrangement, with hexagonal, circular, rectangular or other shape cutouts arranged in a regular pattern. The honeycomb structure may be formed from a sheet by wire electric discharge machining, water-jet cutting, sawing, milling, drilling, or the like. Alternatively, the honeycomb structure may be fabricated from bent quasi-horizontal bars attached with vertical reinforcement structures.

In certain embodiments, particularly those involving the use of an autoclave or an autoclave with a liner as the high pressure apparatus, the frame further comprises a set of stacked disks or baffles on the top end of the frame. The stacked disks or baffles reduce convective heat transfer from the supercritical fluid during crystal growth to the upper end of the autoclave so that the seal of the autoclave may be at a reduced temperature relative to the upper end of the interior of the autoclave. In certain embodiments, one or more disks or baffles are placed on top of the frame after insertion of the latter into a high pressure apparatus or sealable container. In certain embodiments, one or more disks or baffles are placed at the lower end of the frame after insertion of the latter into a high pressure apparatus or sealable container.

Figure 8:
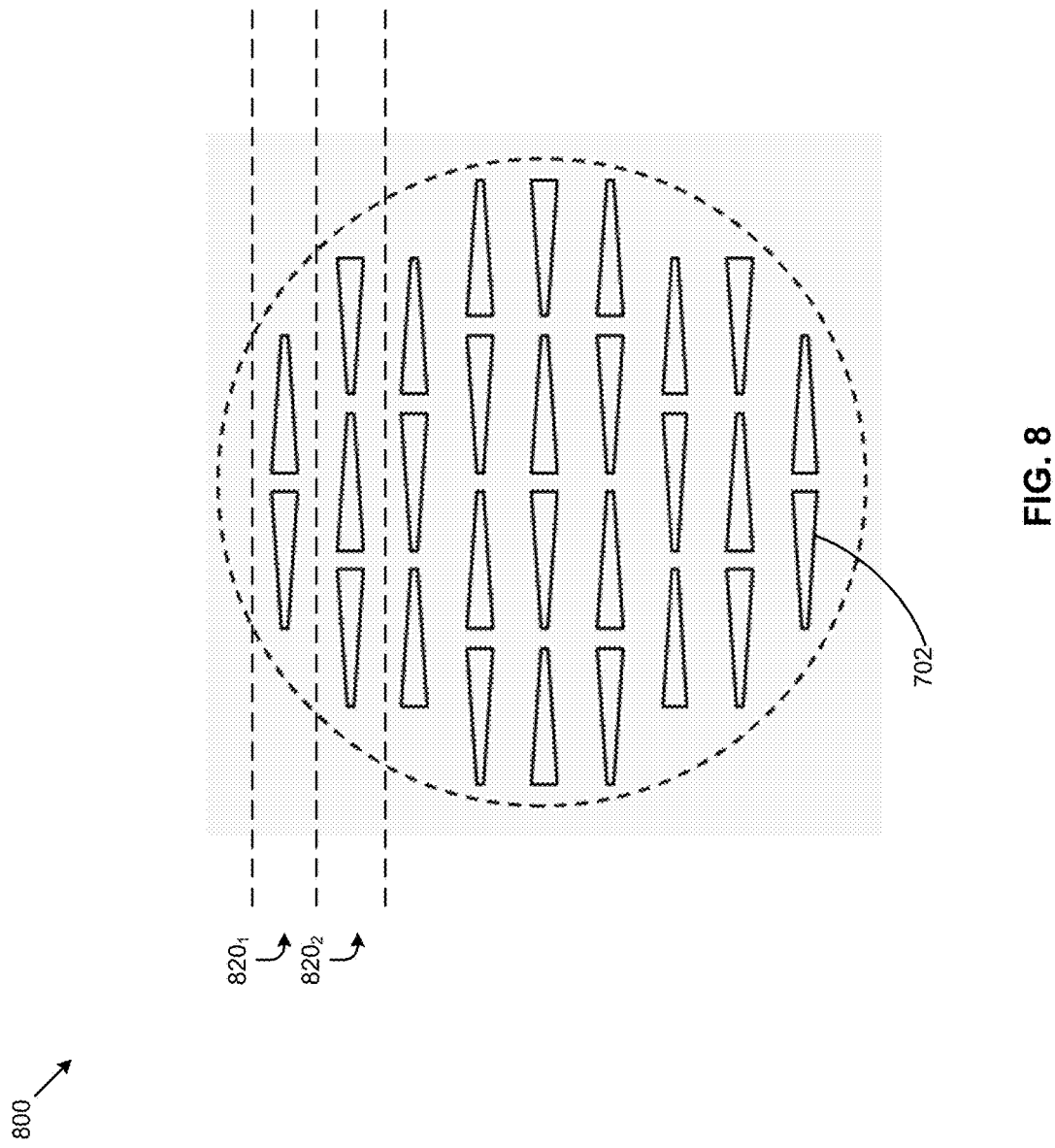
FIG. 8 is a diagram illustrating arrangement of seed plates according to embodiments of the present disclosure.

The seed crystals may be positioned substantially vertically, in one or more axially-arranged tiers. More than three, more than ten, more than about 20, more than about 35, more than about 50, more than about 75, more than about 100, more than about 200, more than about 500, or more than about 1,000 seed crystals may be positioned within the seed rack. In certain embodiments, and as shown in FIG. 8, the seeds in a given tier 800 may be arranged as parallel rows 820 (e.g., row $820_1$, row $820_2$). A juxtaposition of wedge-shaped seed crystals 702 may be arranged so that, as much as is practical, the narrow end of one seed is positioned so as to face the narrow end of an adjacent seed in the same row, and so that the gap between seeds in adjacent rows is relatively uniform. The spacing between adjacent rows, the spacing between adjacent seeds in a given row, and the spacing from the inner diameter of the sealable container (autoclave, liner, or capsule) may be chosen to be large enough so that, after growth of the seed crystals into boules, the crystals do not grow into one another and sufficient gaps remain so as to allow unimpeded fluid flow.

Figure 9:
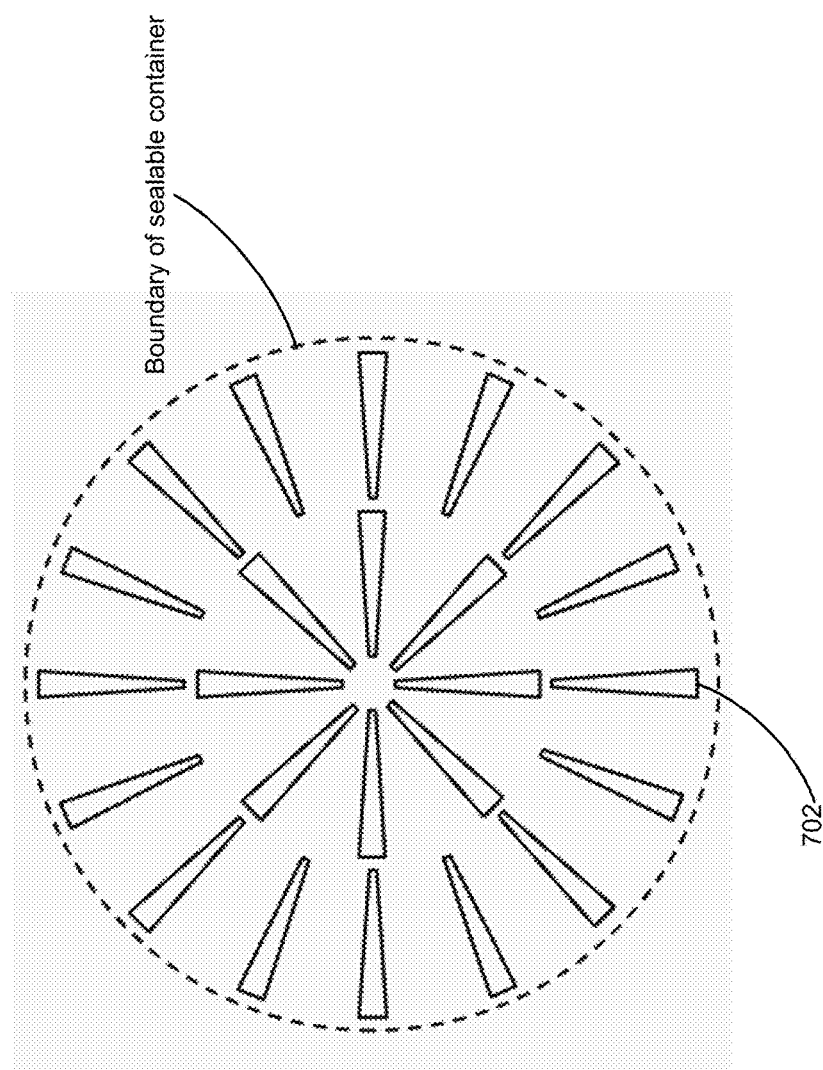
FIG. 9 is a diagram illustrating arrangement of seed plates according to embodiments of the present disclosure.
Figure 10:
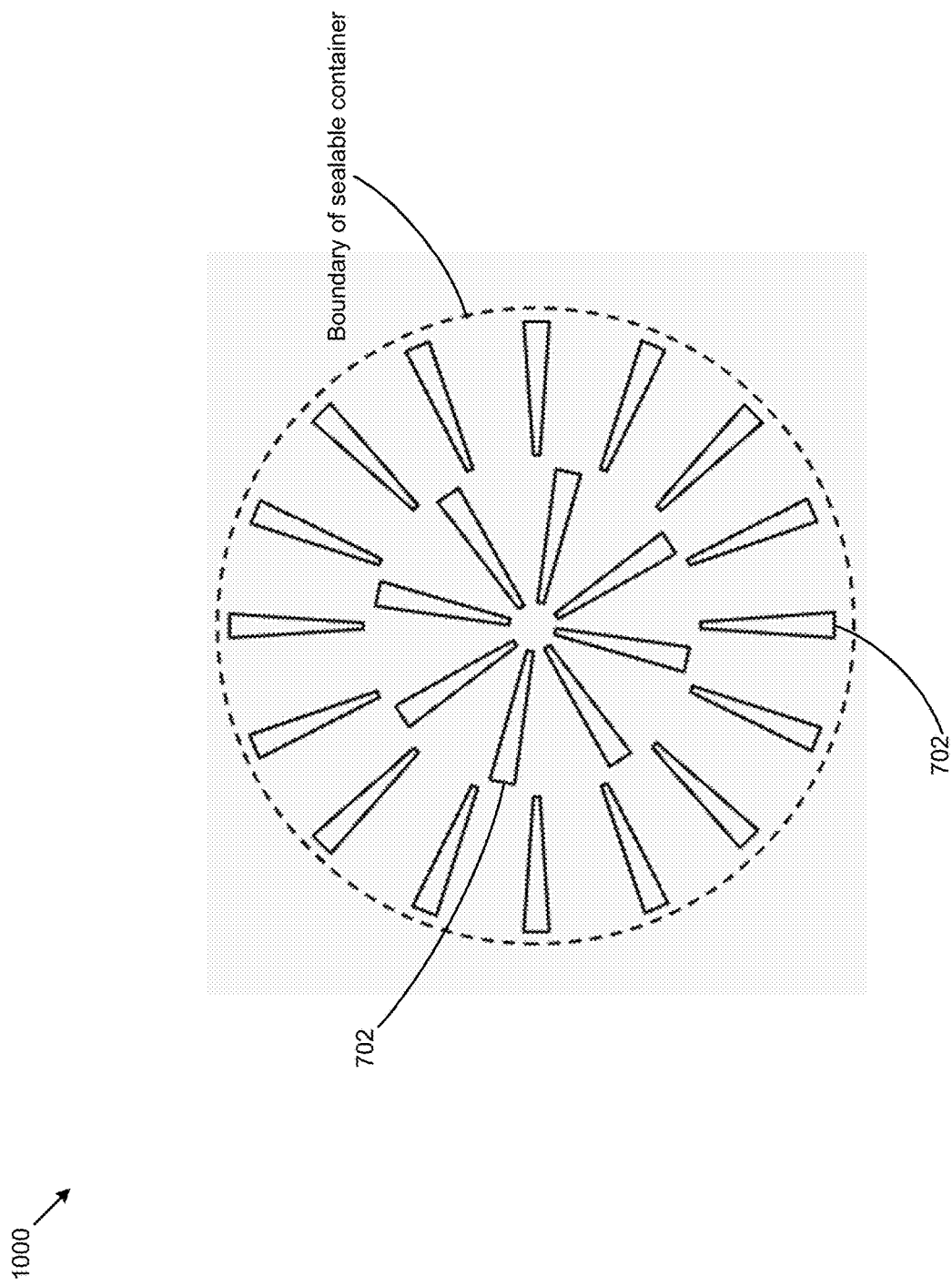
FIG. 10 is a diagram illustrating arrangement of seed plates according to embodiments of the present disclosure.

FIG. 9 depicts embodiments where crystals in a tier 900 are arranged radially, like spokes on a wheel, and having the seed axes lying along radii of the sealable container (e.g., autoclave, liner, or capsule). The narrow ends of the wedge-shaped crystals may be positioned closer to the center, with the wide ends positioned further from the center. The seeds may be arranged in one or more concentric circles. In certain embodiments adjacent circles of seeds are aligned (see FIG. 9); in certain embodiments they are staggered (see FIG. 10). In certain embodiments, rather than being mounted vertically, the seed crystals are mounted at an angle that deviates from vertical by between 1 and 90 degrees, or between about 5 and about 60 degrees.

After loading the frame with seed crystals and raw material, the frame is placed inside a sealable container. The sealable container may constitute an autoclave or a capsule designed for use with an internally-heated high pressure apparatus. At least one mineralizer may be added. The mineralizer may comprise an alkali metal such as Li, Na, K, Rb, or Cs, an alkaline earth metal, such as Mg, Ca, Sr, or Ba, or an alkali or alkaline earth hydride, amide, imide, amidoimide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of F, Cl, Br, I, HF, HCl, HBr, HI, Ga, and $NH_3$. The mineralizer may comprise other alkali, alkaline earth, or ammonium salts, other halides, urea, sulfur or a sulfide salt, or phosphorus or a phosphorus-containing salt. The mineralizer may be provided as a metal, a loose powder, as granules, or as at least one densified compact or pill. The mineralizer may be added to the raw material basket, may be placed in a crucible, or may be placed directly in the high pressure apparatus or capsule. In a certain embodiment, the mineralizer is added to the high pressure apparatus or capsule in the absence of exposure to air, such as inside a glove box.

The sealable container is then closed and sealed except for a connection to a gas, liquid, or vacuum manifold. In one embodiment, the sealable container comprises an autoclave, as disclosed in U.S. Pat. No. 7,335,262. In certain embodiments, a sealable container comprises a metal can, as disclosed, for example, in U.S. Pat. No. 7,125,453, a container, as disclosed, for example, in U.S. Publication No. 2007/0234946, or a capsule, as disclosed, for example, in U.S. patent application Ser. No. 12/133,365. The inner diameter of the sealable container may be between about 1 inch and about 2 inches, between about 2 inches and about 3 inches, between about 3 inches and about 4 inches, between about 4 inches and about 6 inches, between about 6 inches and about 8 inches, between about 8 inches and about 10 inches, between about 10 inches and about 12 inches, between about 12 inches and about 16 inches, between about 16 inches and about 24 inches, or greater than about 24 inches. The clearance between the inner diameter of sealable container and the outer diameter of the frame may be between about 0.005 inch and about 1 inch, or between about 0.010 inch and about 0.25 inch. The ratio of the inner height of the sealable container to its inner diameter may be between about 1 and about 2, between about 2 and about 4, between about 4 and about 6, between about 6 and about 8, between about 8 and about 10, between 10 and about 12, between about 12 and about 15, between 15 and about 20, or greater than about 20.

In certain embodiments, the sealable container is evacuated, so as to remove air, moisture, and other volatile contaminants. In certain embodiments, the high pressure apparatus or capsule is heated during evacuation, to a temperature between about 25 degrees Celsius and about 500 degrees Celsius. In certain embodiments, the sealable container is heated using the same heating elements that are used during high pressure processing. In one specific embodiment, the capsule is heated by placing it inside an internally-heated pressure apparatus and heated using the heater for the latter.

Figure 3A:
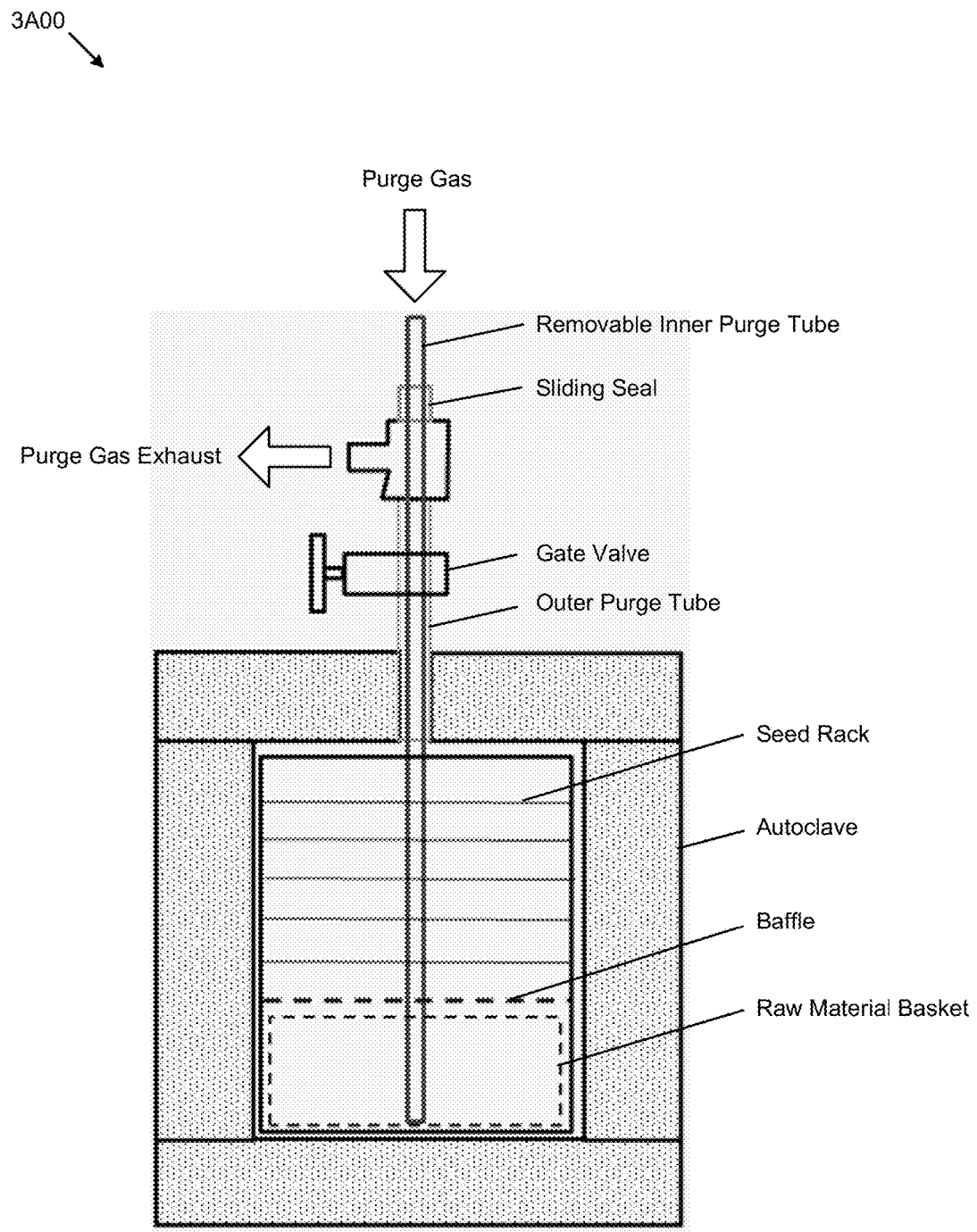
FIG. 3A and FIG. 3B are diagrams illustrating processing methods for crystal growth apparatus according to embodiments of the present disclosure.
Figure 3B:
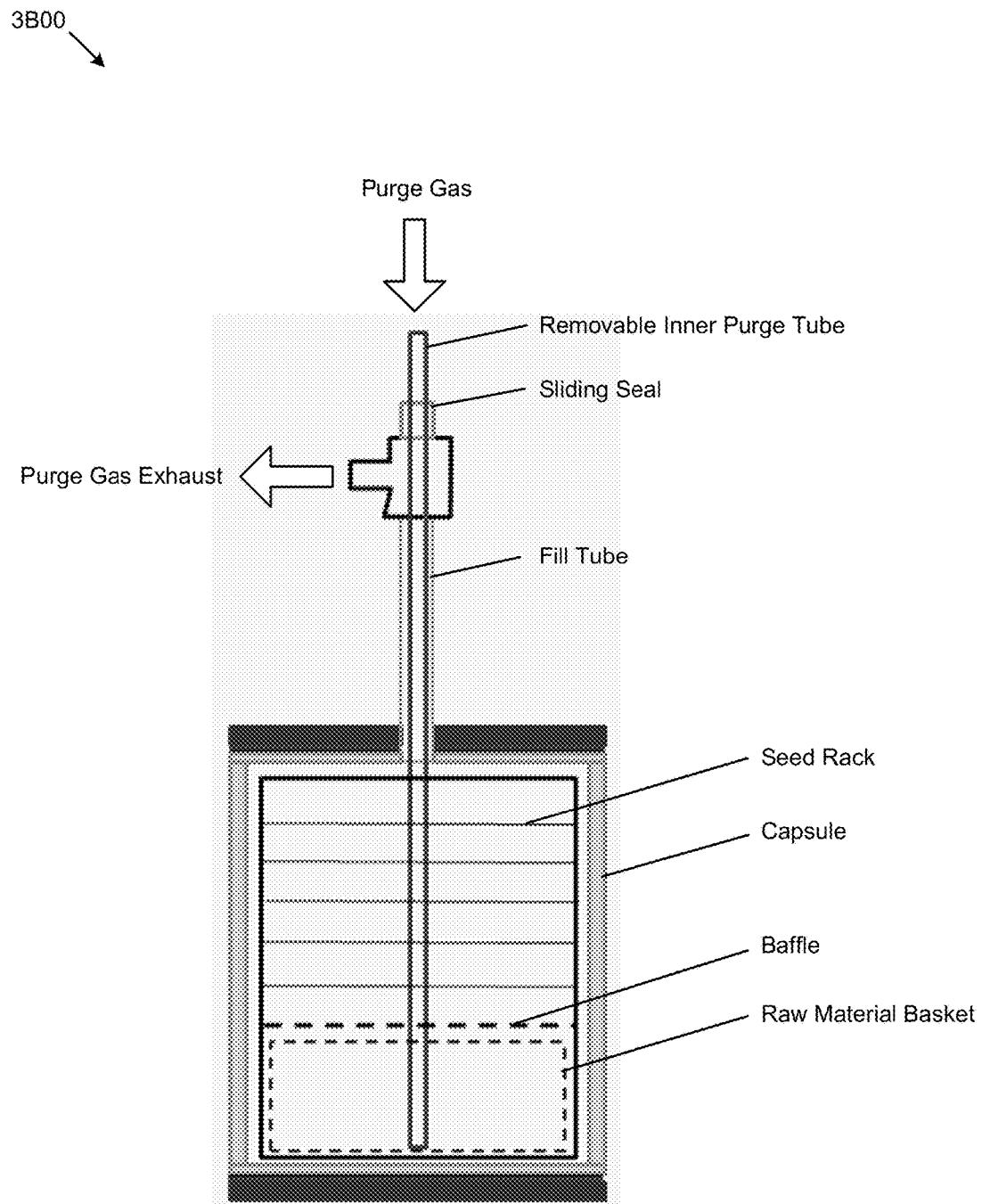

In certain embodiments, the autoclave or capsule containing the filled frame is purged to remove air, moisture, and other volatile contaminants, as shown in FIG. 3A and FIG. 3B. Purging may provide for superior removal of air, moisture, and other volatile contaminants, relative to evacuation, because of the limited conductance through a tube or long hole to the interior of the autoclave or capsule. The autoclave or capsule is then coupled to a gas source by means of at least one fill tube or purge tube, and without exposing the contents of the capsule to air, according to a specific embodiment. The gas source may comprise at least one of nitrogen, argon, hydrogen, helium, Freon, fluorine-containing gas, and solvent vapor, or a combination of any of the foregoing, among others. In certain embodiments, both a first fill or purge tube and a second fill or purge tube are coupled to a gas source and/or exhaust. In certain embodiments, an inner purge tube is placed inside the fill or outer purge tube and positioned so that one end is proximate to the bottom end of the autoclave or capsule. The inner purge tube and outer purge tube may be fabricated from at least one of copper, copper-based alloy, gold, gold-based alloy, silver, silver-based alloy, palladium, platinum, iridium, ruthenium, rhodium, osmium, iron, iron-based alloy, nickel, nickel-based alloy, chromium, chromium-based alloy, molybdenum, and combinations thereof. Iron-base alloys that may be used to form the inner purge tube or outer purge tube include, but are not limited to, stainless steels. Nickel-base alloys that may be used to form the inner purge tube or outer purge tube include, but are not limited to, Inconel®, Hastelloy®, and the like. The outer diameter of the inner purge tube may be less than the inner diameter of the fill or outer purge tube by at least 0.010 inch, as shown. The inner purge tube may be coupled to the fill or outer purge tube by means of a tee fitting or other suitable technique, so that purge gas introduced through the inner purge tube will exit near the bottom end of the autoclave or capsule, pass through the length of the autoclave or capsule before exhausting though the annular space in the fill or outer purge tube outside the inner purge tube and the tee fitting, providing for efficient removal of gas phase contaminants according to a specific embodiment. The interface between the tee fitting and the inner purge tube may be a sliding seal, for example, an O-ring or a differentially-pumped set of Teflon® seals or O-rings. The rate of flow of the purge gas may be in the range between about 0.05 and about 50 standard liters per minute. The autoclave or capsule may be heated, for example, to a temperature between about 25 degrees Celsius and about 500 degrees Celsius during the purge operation, in order to more efficiently remove water and other adsorbed contaminants. After shutting off flow of the purge gas, nitrogen-containing solvent vapor, for example, gas phase ammonia, may be flowed through the autoclave or capsule in order to remove most or all of the purge gas.

In embodiments, the inlet of the gas flow, for example, the second fill tube or the purge tube may then be coupled to a source of liquid nitrogen-containing solvent, such as ammonia. The sealable container and fill tube(s) may be cooled, or the liquid solvent delivery system and transfer lines heated, so that the former are cooler by between one and 50 degrees Celsius than the latter. Liquid solvent may then be introduced into the sealable container at a rate between about 0.1 and about 1,000 grams per minute. At room temperature, the vapor pressure of ammonia is approximately 10 atmospheres. Depending on the temperature of the solvent source, therefore, the system pressure during solvent delivery may be above about 7 atmospheres, above about 8 atmospheres, above about 9 atmospheres, or above about 10 atmospheres. In one embodiment, the purge exhaust is closed and the nitrogen-containing solvent vapor above the liquid is forced to condense into liquid during the filling operation. In these embodiments, the autoclave or capsule may be actively cooled in order to dissipate the heat released by condensation of the solvent vapor. In certain embodiments, the purge exhaust is fitted with a check valve so that residual purge gas or solvent vapor is allowed to exit when the pressure exceeds a predetermined threshold, but air or other gases are not allowed to flow backward into the autoclave. The quantity of solvent in the sealable container may be determined by using a liquid delivery system with the capability for accurately monitoring and controlling the mass of liquid delivered. An example of suitable equipment for delivery of precision-metered, high-purity liquid ammonia is the InScale™ system manufactured by iCon Dynamics, LLC. In certain embodiments, the amount of ammonia delivered to the sealable container is quantified by the loss in weight of at least one ammonia supply cylinder. If solvent gas is allowed to exhaust during liquid filling, in the case where ammonia is the solvent, the quantity of vented solvent may be determined by trapping it in aqueous solution and measuring the change in pH and this quantity subtracted from the total liquid delivered to determine the quantity of liquid in the sealable container. An analogous method for determining the quantity of vented solvent may be performed in cases where the solvent is different from ammonia.

In certain embodiments, a solvent is delivered to a sealable container as a vapor at elevated pressure. The inlet of the gas flow, for example, the second fill tube or the purge tube is then coupled to a source of vapor-phase solvent. The sealable container and fill tube(s) may be cooled, or the solvent delivery system and transfer lines heated, so that the former are cooler by between about one and about 50 degrees Celsius than the latter. Vapor-phase solvent is then introduced into the sealable container at a rate between about 0.1 and about 1,000 grams per minute and allowed to condense in the sealable container. The pressure of the solvent vapor should be higher than the equilibrium vapor pressure at the temperature of the sealable container. Depending on the temperature of the sealable container and of the solvent delivery system, the pressure during solvent delivery may be above about 7 atmospheres, above about 8 atmospheres, above about 9 atmospheres, or above about 10 atmospheres. In certain embodiments, the purge exhaust is closed and the solvent vapor above the liquid is forced to condense into liquid during the filling operation. In this embodiment, the sealable container may be actively cooled in order to dissipate the heat released by condensation of the solvent vapor. In certain embodiments, the purge exhaust is fitted with a check valve so that residual purge gas or solvent vapor is allowed to exit when the pressure exceeds a predetermined threshold, but air or other gases are not allowed to flow backward into the autoclave. The quantity of solvent in the sealable container may be determined by using a vapor delivery system equipped with a mass flow meter. In certain embodiments, the amount of ammonia delivered to the sealable container is quantified by the loss in weight of at least one ammonia supply cylinder. If solvent gas is allowed to exhaust during liquid filling, in the case where ammonia is the solvent, the quantity of vented solvent may be determined by trapping it in aqueous solution and measuring the change in pH and this quantity subtracted from the total liquid delivered to determine the quantity of liquid in the capsule. An analogous method for determining the quantity of vented solvent may be performed in cases where the solvent is different from ammonia.

The inner purge tube, if present, may be removed after the sealable container (e.g., autoclave or capsule) is filled. In certain embodiments, the inner purge tube may be removed after the purging step but before the filling step. A gate valve to the autoclave, or the fill tube(s) to the capsule, are then sealed. Once sealed, the interior of the autoclave or of the capsule is substantially air-free, and the at least one material contained therein can be processed with reduced risk of contamination.

In certain embodiments, an autoclave may then be heated to crystal growth conditions. In certain embodiments, the capsule is placed inside an autoclave, an internally-heated pressure apparatus, or other high pressure apparatus, and heated to crystal growth conditions. In certain embodiments, the thermal cycle includes a pre-reaction segment to form mineralizer, polycrystalline gallium nitride, dissolved gallium containing complexes, or the like. In certain embodiments, the atmosphere in the autoclave may be modified during the run. For example, excess $H_2$ formed by reaction of gallium metal with ammonia may be bled off through the gate valve or allowed to diffuse through a heated palladium membrane. Excess nitrogen formed by decomposition of an azide mineralizer may be bled off through the gate valve. Additional ammonia may be added to replenish the solvent in the high pressure apparatus.

Suitable thermal cycles for crystal growth are disclosed, for example, in U.S. Pat. Nos. 6,656,615 and 7,078,731. The crystals grow predominantly perpendicular to the large-diameter faces, but may also grow in lateral directions as well. With the possible exception of c-plane or $\{1 -1 0 \pm 1\}$ seeds stacked back-to-back, the crystals are prevented from growing into one another by the crystal separator plates.

After performing crystal growth for a predetermined period of time, the autoclave or high pressure apparatus is cooled. When the autoclave or capsule has cooled to below about 100 degrees Celsius, below about 75 degrees Celsius, below about 50 degrees Celsius, or below about 35 degrees Celsius, a valve to the autoclave is opened, or the capsule is vented, and the ammonia is removed. In certain embodiments, the sealable container is vented at high temperature. In certain embodiments, this venting is accomplished by opening of a valve attached to the sealable container. In certain embodiments, gas-phase ammonia is allowed to exit the autoclave or capsule and is bubbled through an acidic aqueous solution in order to be chemically trapped. In certain embodiments, gas phase ammonia is passed through a flame so as to burn the ammonia, forming $H_2O$ and $N_2$. In certain embodiments illustrated in FIG. 6A and FIG. 6B, the ammonia is trapped for recycling and reuse.

Figure 6A:
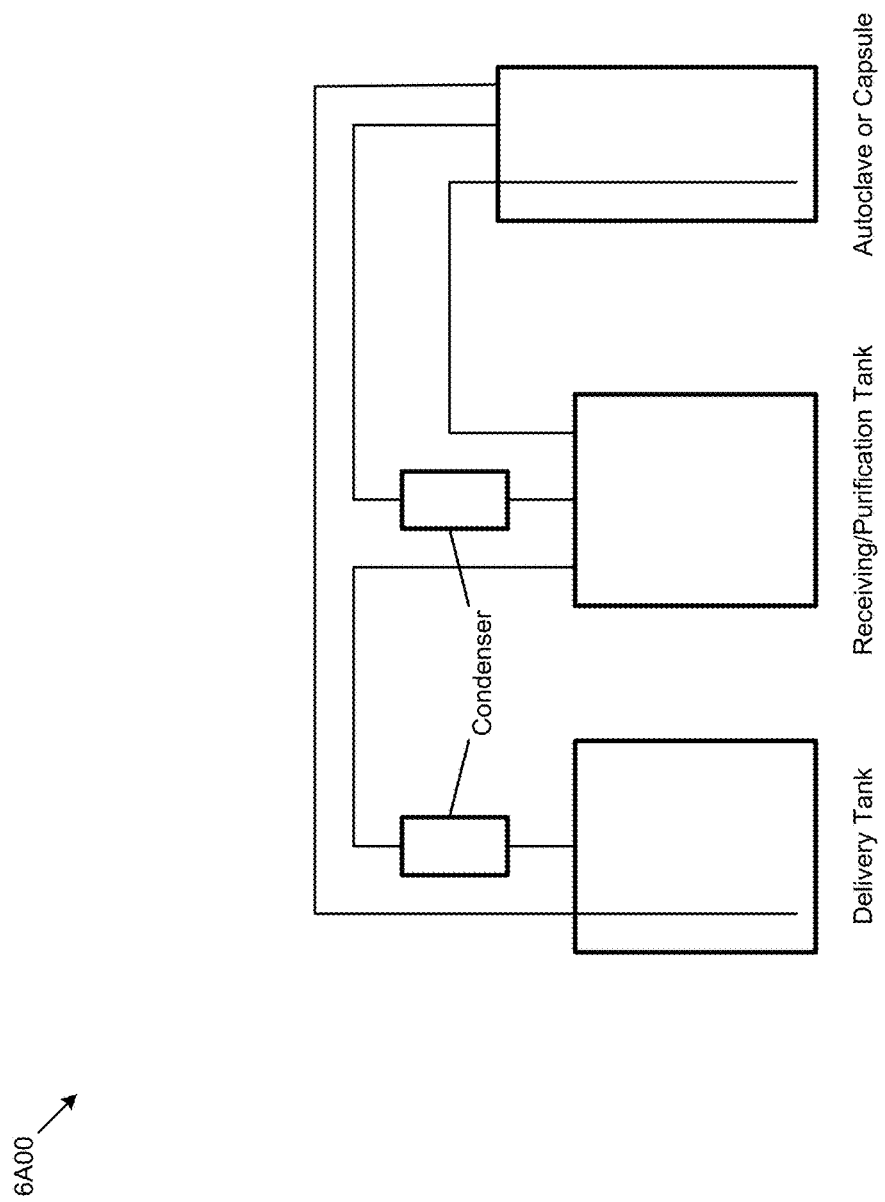

Referring to the configuration of FIG. 6A, the illustrated configuration is appropriate for a single-ended autoclave or capsule; the ammonia may be removed as either a liquid or a gas. To remove the ammonia as a liquid, the inner purge tube (see FIG. 3A and FIG. 3B) can be re-inserted into the outer purge or fill tube and the outlet of the inner purge tube connected to the Receiving/Purification tank. Keeping the purge gas exhaust connection (see FIG. 3A and FIG. 3B) closed, a valve in the line to the inner purge tube is opened, allowing liquid ammonia to flow through the inner purge tube in the autoclave into the Receiving/Purification tank, which is otherwise closed. The Receiving/Purification tank may be cooled, for example, by chilled water, and/or the autoclave or capsule and transfer line may be heated during the ammonia transfer operation, so as to maintain a higher vapor pressure of ammonia in the autoclave as compared to the vapor pressure in the Receiving/Purification tank. The temperature differential between the autoclave or capsule and the Receiving/Purification tank may be held between about one and about 50 degrees Celsius. In certain embodiments, the ammonia is removed as a vapor. The outlet of the autoclave or capsule is connected to a condenser above the Receiving/Purification tank and a valve opened. Gas-phase ammonia enters the condenser and condenses into liquid in a heat-exchanger, for example, a chilled-water-cooled coil, at a pressure between about 100 and about 250 pounds per square inch. The autoclave and transfer line may be heated to a temperature that is higher than the condenser by between about one and about 50 degrees Celsius. Residual gases, for example, $N_2$ and $H_2$, may be released by venting to a scrubber and/or a flame.

Referring to the configuration of FIG. 6B, the illustrated configuration is appropriate for a double-ended autoclave or capsule; the ammonia may be removed as a liquid. A port on the bottom end of the autoclave or a fill tube on the bottom end of the capsule is connected to the Receiving/Purification tank and a valve opened, allowing liquid ammonia to flow into the Receiving/Purification tank, which is otherwise closed. The Receiving/Purification tank may be cooled, for example, by chilled water, and/or the autoclave and transfer line may be heated during the ammonia transfer operation, so as to maintain a higher vapor pressure of ammonia in the autoclave as compared to the vapor pressure in the Receiving/Purification tank. The temperature differential between the autoclave and the Receiving/Purification tank may be held between one and 50 degrees Celsius.

For recycling purposes, a purifying agent, for example, sodium metal, may be placed in the receiving/purification tank. The sodium can react with residual oxygen and/or water in the ammonia, restoring a very high degree of purity. After a period of one hour to thirty days, the ammonia may be transferred to a delivery tank. In a certain embodiment, the transfer is performed through the gas phase, via a condenser, so as to leave the purifying agent in the receiving/purification tank. Liquid ammonia may be delivered from the delivery tank, via a dip tube, to the autoclave for the next crystal growth run. In an alternative embodiment, vapor-phase ammonia may be delivered from the delivery tank to an autoclave or capsule for the next crystal growth run.

After cooling, removal of the ammonia, and opening of the autoclave or internally-heated high pressure apparatus and capsule, the frame can be removed from the autoclave or capsule, and the grown crystals are removed from the seed rack. If necessary, portions of the clips that have been overgrown by crystalline material may be removed by etching in an appropriate acid, such as at least one of hydrochloric acid, sulfuric acid, nitric acid, and hydrofluoric acid.

Figure 4A:
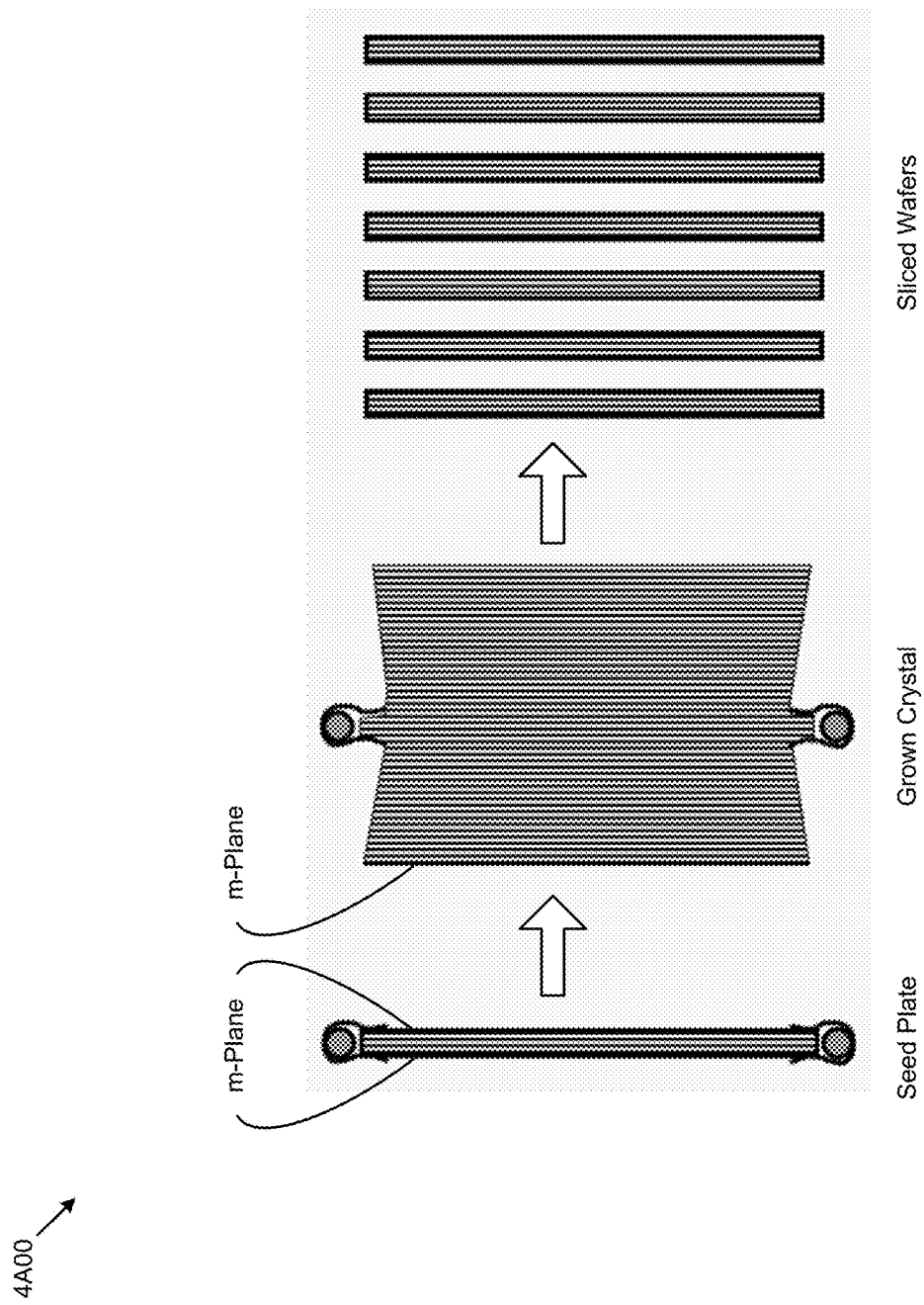
FIG. 4A, FIG. 4B, and FIG. 4C are diagrams illustrating crystal growth processes according to embodiments of the present disclosure.
Figure 4B:
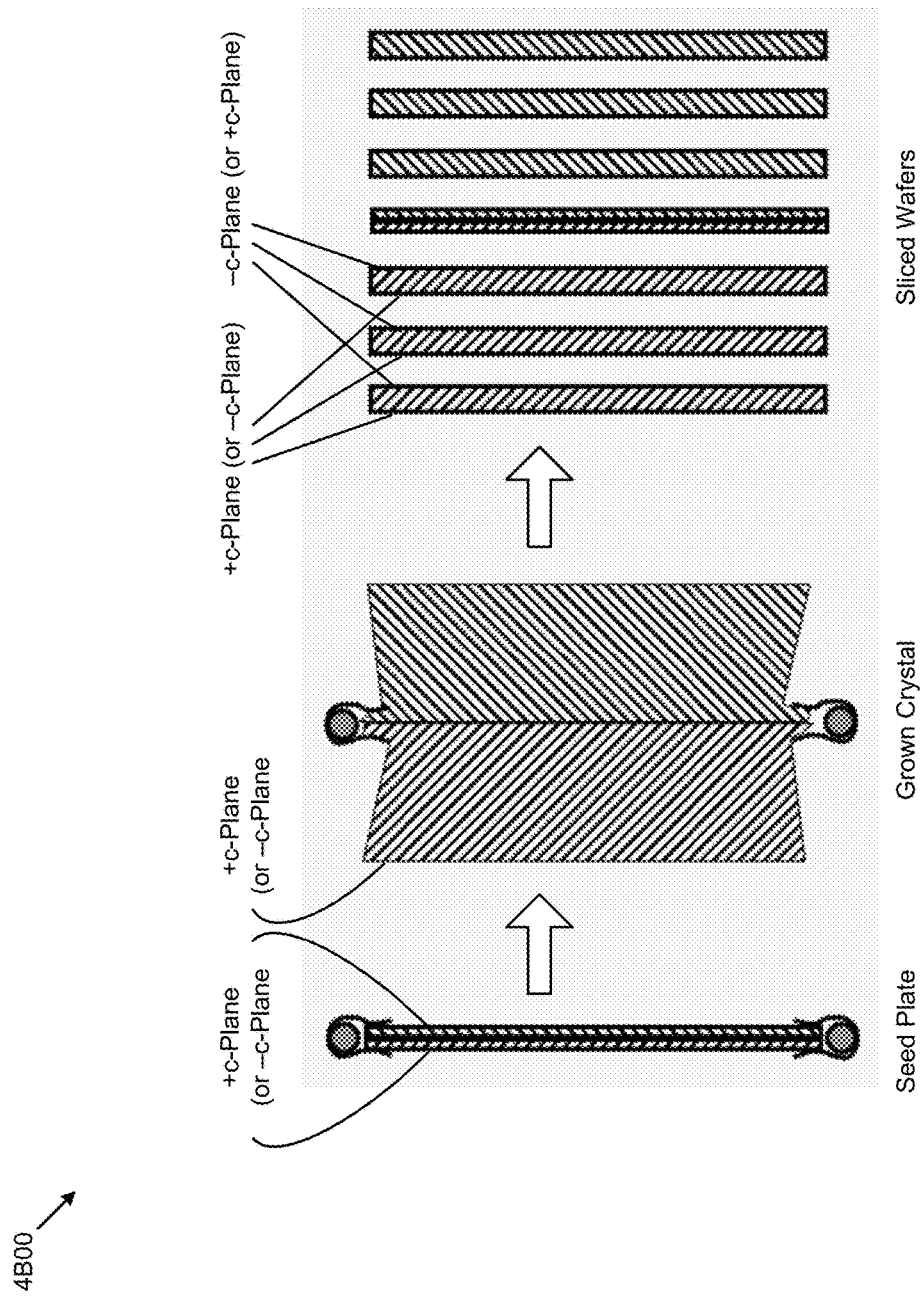
Figure 4C:
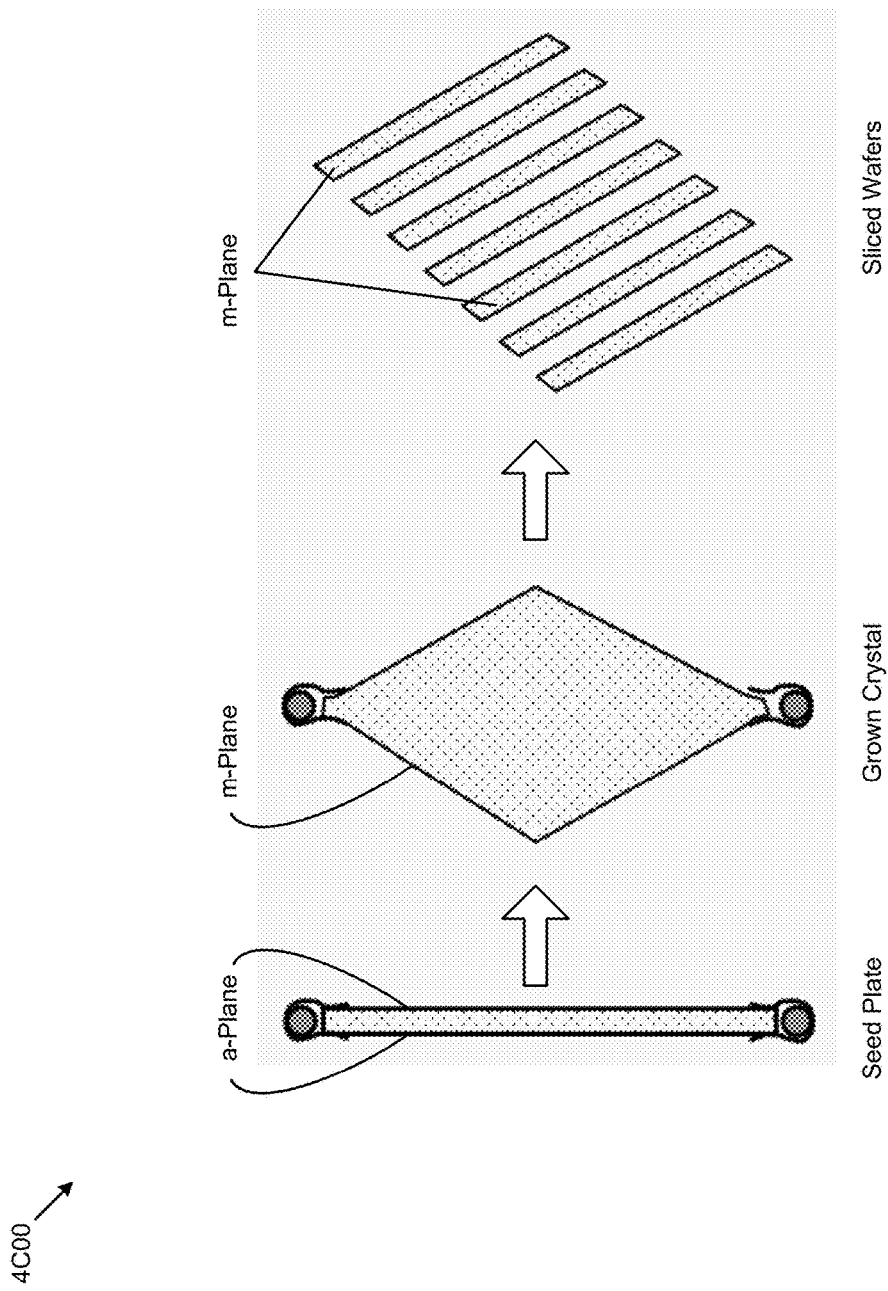
Figure 11A:
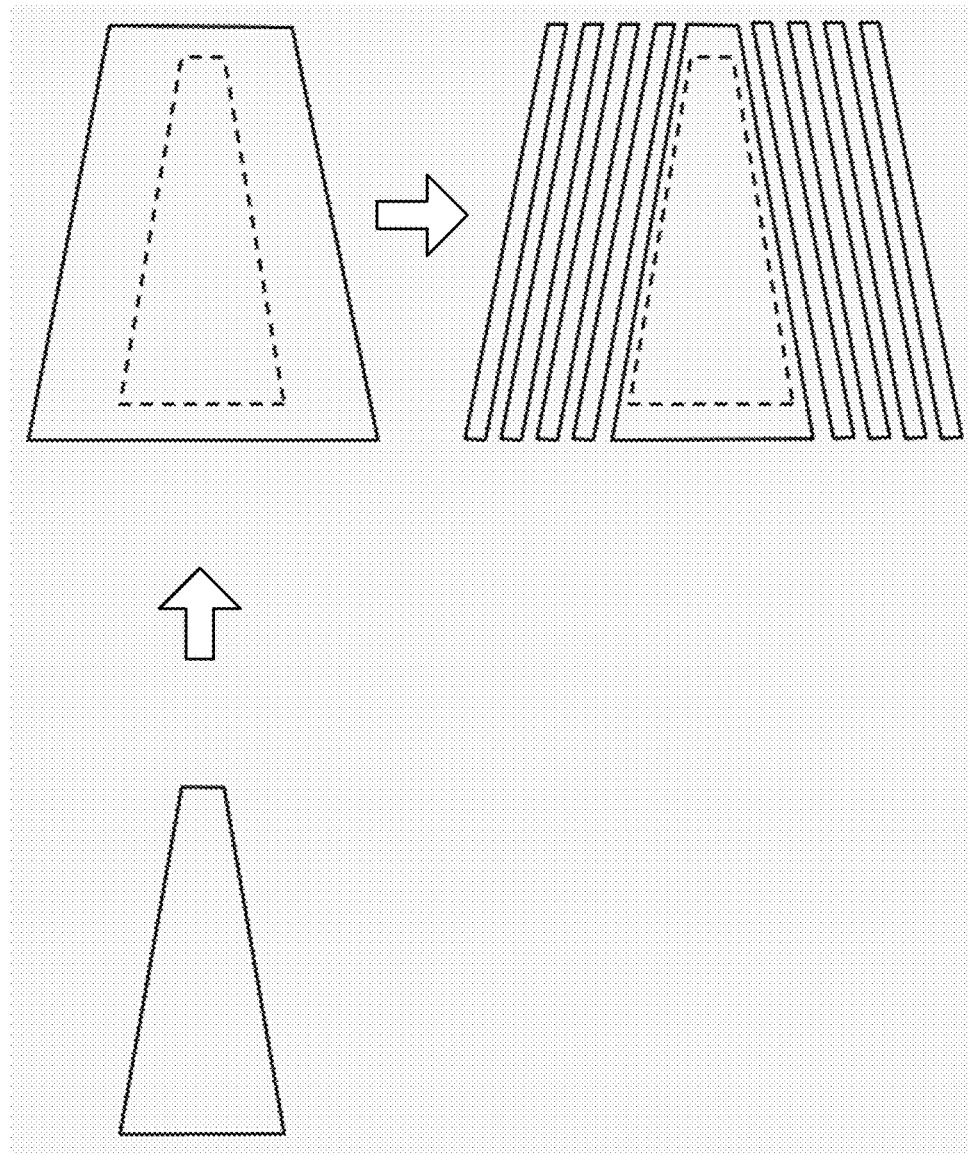

The crystals may then be sliced into pre-selected orientations, as summarized in the shown orientations (see FIG. 4A, FIG. 4B, and FIG. 4C). Other configurations are shown in FIG. 11A and in FIG. 11B. In certain embodiments, the seed crystals have an m-plane orientation and are sliced into m-plane-oriented wafers, as shown in FIG. 4A. In certain embodiments, the seed crystals are +c or −c oriented (or are bi-crystals, as described above), and are sliced into c-plane-oriented wafers, as shown in FIG. 4B. In certain embodiments, the seed crystals are {1 −1 0 −1} oriented and are sliced into {1 −1 0 ±1}-oriented wafers. In certain embodiments, the seed crystals are m-plane oriented, and slices are made at an angle of approximately 28 degrees with respect to the large-area m-plane to prepare semi-polar wafers with a {1 −1 0 ±1} orientation. In certain embodiments, the seed crystals are {1 −1 0 −1} oriented, and slices are made at an angle of approximately 18.8 degrees with respect to the large area plane to prepare semi-polar wafers with a {1 −1 0 ±2} orientation. In certain embodiments, the seed crystals are {1 −1 0 −1} oriented, and slices are made at an angle of approximately 29.9 degrees with respect to the large area plane to prepare semi-polar wafers with a {1 −1 0 ±3} orientation. In certain embodiments, the seed crystals are {1 −1 0 −1} oriented, and slices are made at an angle of approximately 26.2 degrees with respect to the large area plane to prepare semi-polar wafers with a {1 1 −2 ±2} orientation. In certain embodiments, the seed crystals are c-plane oriented, and slices are made at an angle of approximately 32 degrees with respect to the large-area c-plane to prepare semi-polar wafers with a {1 −1 0 ±3} orientation. In certain embodiments, the seed crystals are m-plane oriented, and slices are made at an angle of approximately 42.5 degrees with respect to the large-area m-plane to prepare semi-polar wafers with a {1 1 −2 ±2} orientation. In certain embodiments, the seed crystals are c-plane oriented, and slices are made at an angle of approximately 43.2 degrees with respect to the large-area c-plane to prepare semi-polar wafers with a {1 −1 0 ±2} orientation. In certain embodiments, the seed crystals are c-plane oriented, and slices are made at an angle of approximately 62.0 degrees with respect to the large-area c-plane to prepare semi-polar wafers with a {1 −1 0 ±1} orientation. In certain embodiments, the seed crystals are c-plane oriented, and slices are made at an angle of approximately 58.4 degrees with respect to the large-area c-plane to prepare semi-polar wafers with a {1 1 −2 ±2} orientation. In certain embodiments, the seed crystals are c-plane oriented, and slices are made at an angle of approximately 90.0 degrees with respect to the large-area c-plane to prepare non-polar wafers with a {1 −−1 0 0} orientation. In certain embodiments, the seed crystals are c-plane oriented, and slices are made at an angle of approximately 90.0 degrees with respect to the large-area c-plane to prepare non-polar wafers with a {1 1 −2 0} orientation.

In certain embodiments, the seeds are wedge-shaped, with large-area faces that are miscut from m-plane or are semi-polar, and grow in such a way that a wedge shape is preserved, as shown in FIG. 11A. For example, the large area faces may have a {1 0 −1 −1} orientation that grows stably, preserving the orientation. In certain embodiments, the seeds are wedge-shaped, with large-area faces that are miscut from m-plane or are semipolar, and grow in such a way that a wedge shape is not preserved, as shown in FIG. 11B. For example, the large area faces may be miscut by 1 to 5 degrees from m-plane and grow out to an on-axis m-plane orientation.

One or more wafers may be prepared from the as-grown boule using a single- or multi-wire saw, an inner-diameter saw, an outer-diameter saw, or the like. Prior to sawing, the boule may be precisely oriented using an x-ray goniometer, so as to prepare wafers with a pre-determined miscut angle. If a wedge-shaped crystal is desired, for example, for use as a seed in subsequent crystal growth runs, the orientation of the boule may be re-adjusted after slicing a first set of wafers and a second set of wafers sliced, leaving a wedge-shaped remnant, as shown in FIG. 11A and as shown in FIG. 11B.

In certain embodiments, the seed crystals have a crystallographic orientation such that at least one large face is a relatively fast-growing face. In certain embodiments, the seed crystal has an a-plane orientation. In certain embodiments, the seed crystal has a semi-polar orientation. In certain embodiments, the orientation of the seed crystal is {1 −1 0 −35 1}, {1 −1 0 ±2}, {1 −1 0 ±3}, or {1 1 −2 ±2}. In certain embodiments, two seed crystals are placed together back-to-back, so that opposite faces of the co-mounted seed crystals have an equivalent crystallographic orientation. The use of fast-growing orientations may allow for an overall faster production rate of high quality production crystals. In certain embodiments, shown in FIG. 4C, the seeds are a-plane oriented. Initially, rapid growth in the a direction slows as m-planes form near the top and bottom edges of the crystals. At the end of the crystal growth cycle, the crystal is terminated by four large-area m-plane facets, shown in edge section in FIG. 4C. From geometry, the m-plane facets are approximately 58% of the length of the initial a-plane seed plate. The crystal may be sliced at an angle to produce a plurality of m-plane crystals. In certain embodiments, the crystal may be sliced at other angles to produce c-plane wafers, a-plane wafers, or semi-polar wafers. The semi-polar wafers may have a {1 −1 0 ±1} orientation, a {1 −1 0 ±2} orientation, a {1 −1 0 ±3} orientation, or a {1 1 −2 ±2} orientation.

After slicing, the crystal wafers may be lapped, polished, and chemical-mechanically polished by methods that are known in the art.

FIG. 5 depicts a block diagram of a system for growth of a gallium-containing nitride crystal. As shown, the method of system 500 commences at a step to load raw material into raw material basket (see step 505) and proceeds with steps to: suspend seed crystals or plates on seed rack (see step 510); place frame into autoclave or capsule (see step 515); add mineralizer to autoclave or capsule (see step 520); and evacuate or purge autoclave or capsule (see step 525). In some embodiments, steps include operations to bake the autoclave or capsule during an evacuation or purge (see step 530). Then, next steps are operable to fill autoclave or capsule with liquid ammonia (see step 535); to provide electrical energy to heating member to heat autoclave capsule to predetermined process temperature and process pressure, so as to cause the solvent to become supercritical (see step 540). Finishing steps include operations to cool the autoclave or capsule and remove crystals (see step 545). Further finishing can include operations to slice and polish crystals to form a wafer (see step 550).

The crystal wafers are useful as substrates for fabrication into optoelectronic and electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for a photoelectrochemical water splitting and hydrogen generation device.

In certain embodiments, any of the above sequence of steps provides a method according to embodiments of the present disclosure. In certain embodiments, the present disclosure provides a method and resulting crystalline material provided by a pressure apparatus having a basket structure. Other alternatives can also be provided where steps are added, one or more steps are removed, or one or more steps are provided in a different sequence without departing from the scope of the claims herein.

FIG. 12 is a diagram of a high pressure apparatus 1200 for a crystal growth. Shown is a capsule 1201 and three, four, 10, 20, 50, 100, or more seed crystals placed within the capsule, which in turn is placed within a heating member 1207. The heating member defines a plurality of at least two independently-controllable zones. The zones may include an end zone 1220, a crystal growing region 122, a baffle zone 1224, and a nutrient region 121. At least the crystal growing region or zone and the nutrient region or zone are necessary for ammonothermal crystal growth. An independently-controllable baffle zone may be useful for process optimization. Due to axial end losses, in the absence of additional hot zones the top of the top zone and the bottom of the bottom zone will each be cooler than the crystal growing region and the nutrient regions, respectively. One or more end zones may be incorporated to provide additional heating to the ends to compensate for the axial heat losses and reduce or eliminate the temperature dip at one or more ends. This particular arrangement is suitable for a system with normal solubility, for example, when $NH_4Cl$ is used as the mineralizer. In other cases, for example, for ammonobasic growth or when $NH_4F$ is used as the mineralizer, the positions of the growth zone and nutrient zone are reversed, so that the nutrient zone lies above the growth zone. In general, during growth, the upper zone(s) are maintained at a lower temperature than the lower zone(s). The heating member is positioned within a continuous annular ceramic member 1230, which in turn is positioned within a high strength enclosure 1210. One or more annular plugs 1234 and end caps 1232 may be provided (e.g., for axial thermal insulation). The ends of the apparatus may be closed by top end flange 1212 and bottom end flange 1214. Axis 1206 is common to the capsule, the heating member, the continuous annular ceramic member, and the high strength enclosure. Top end flange 1212 includes fastener 216.

Figure 13:
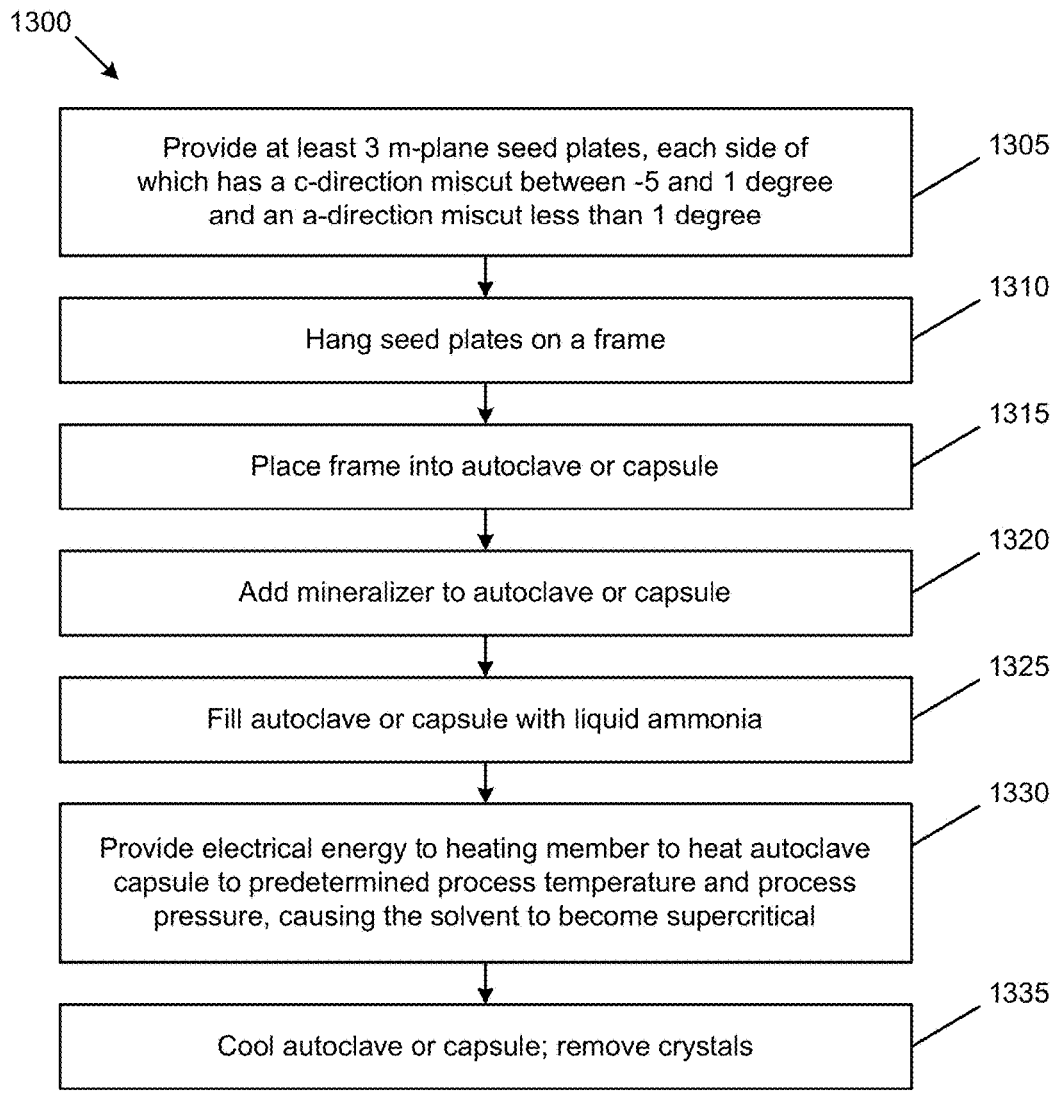
FIG. 13 is a flow chart illustrating a crystal growth process according to embodiments of the present disclosure.

FIG. 13 is a diagram of flow chart illustrating a crystal growth process. As shown the method 1300 results in crystalline material being produced in a pressure apparatus (e.g., an autoclave or a capsule within an autoclave or an internally-heated high pressure apparatus) having a basket structure and a seed frame. As shown, the method commences upon starting with at least 3 m-plane seed crystals, each side of which has a c-direction miscut between about −5 and about 1 degree and an a-direction miscut less than about 1 degree (see operation 1305). Next the method provides the means to hang seed crystals on a frame (see operation 1310), the frame suited to be placed within an autoclave or capsule (see operation 1315). Then method 1300 adds mineralizer to the autoclave or capsule (see operation 1320) and fills the autoclave or capsule with liquid ammonia (see operation 1325). For forming the crystalline material, the method provides electrical energy to heating member in order to heat the autoclave or capsule to a predetermined process temperature and predetermined process pressure, causing the solvent to become supercritical (see operation 1330). Method 1300 concludes by cooling the autoclave or capsule and removing the crystals (see operation 1335).

Figure 14:
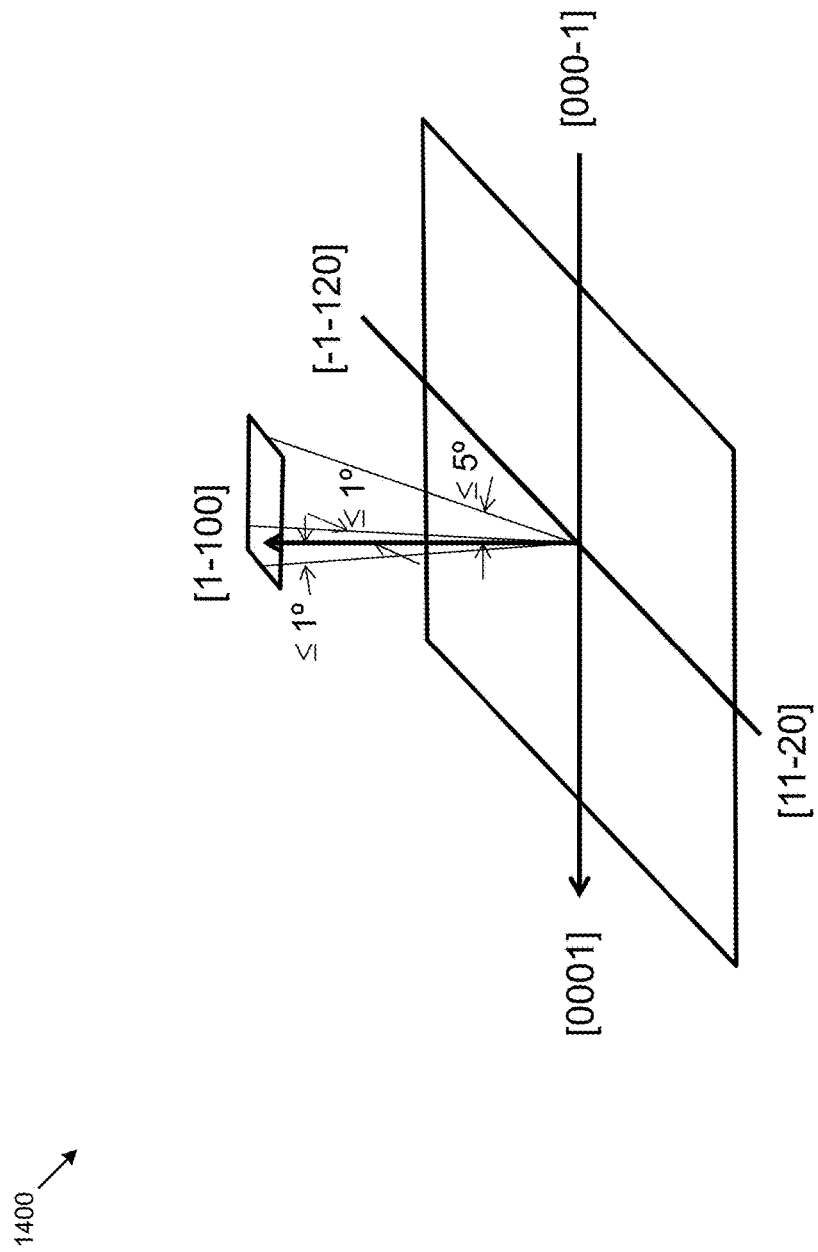
FIG. 14 is a diagram showing a range of crystallographic orientations suitable for seed crystals for m-plane crystal growth as used in certain embodiments of the present disclosure.

FIG. 14 is a diagram showing a range of crystallographic orientations 1400 suitable for seed crystals for m-plane crystal growth as used in certain embodiments.

Figure 15:
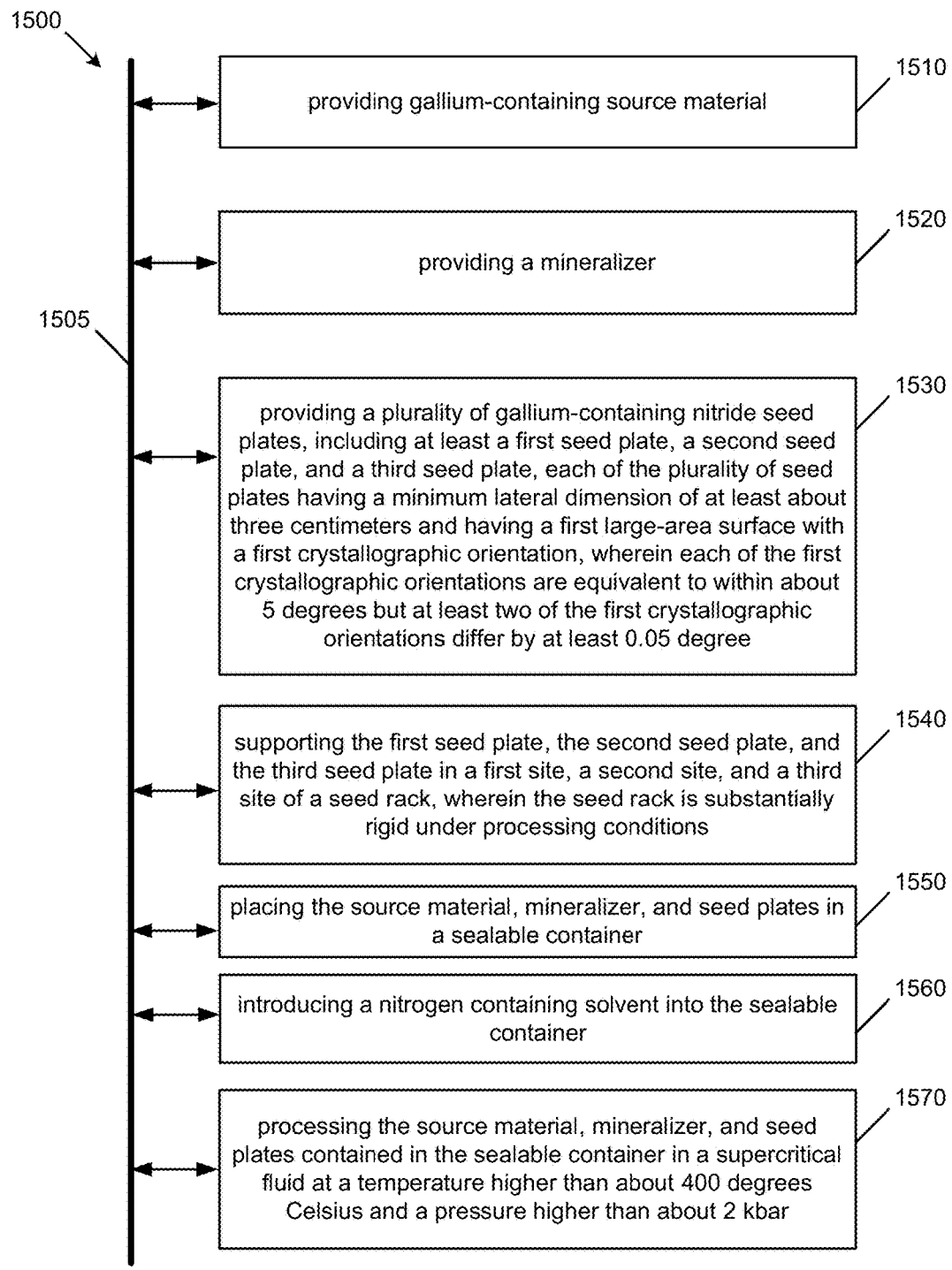
FIG. 15 depicts a block diagram of a method for growth of a gallium-containing nitride crystal.

FIG. 15 depicts a block diagram of a system for growth of a gallium-containing nitride crystal. As shown, system 1500 comprises a plurality of modules and any module can communicate with other modules over communication link 1505. The modules of the system can, individually or in combination, perform method steps within system 1500. Any method steps performed within system 1500 may be performed in any order unless as may be specified in the claims. As shown, system 1500 implements a method for growth of a gallium-containing nitride crystal, the system 1500 comprising modules for performing the steps of: providing gallium-containing source material (see module 1510); providing a mineralizer (see module 1520); providing a plurality of gallium-containing nitride seed plates, each of the plurality of seed plates having a non-cubic crystal structure and a wedge shape, with a wedge angle θ between a first large area surface and a second large area surface between about 1 degree and about 60 degrees, wherein each of the first and second large-area surfaces have crystallographic orientations that are equivalent to one another, to within about 5 degrees (see module 1530), supporting the first seed plate, the second seed plate, and the third seed plate in a first site (e.g., a site in a seed rack), a second site, and a third site of a seed rack; the seed rack being substantially rigid under processing conditions (see module 1540); placing the source material, mineralizer, and seed plates in a sealable container (see module 1550); introducing a nitrogen containing solvent into the sealable container (see module 1560); and processing the source material, mineralizer, and seed plates contained in the sealable container in a supercritical fluid at a temperature higher than about 400 degrees Celsius and a pressure higher than about 2 kbar (see module 1570).

Figure 16:
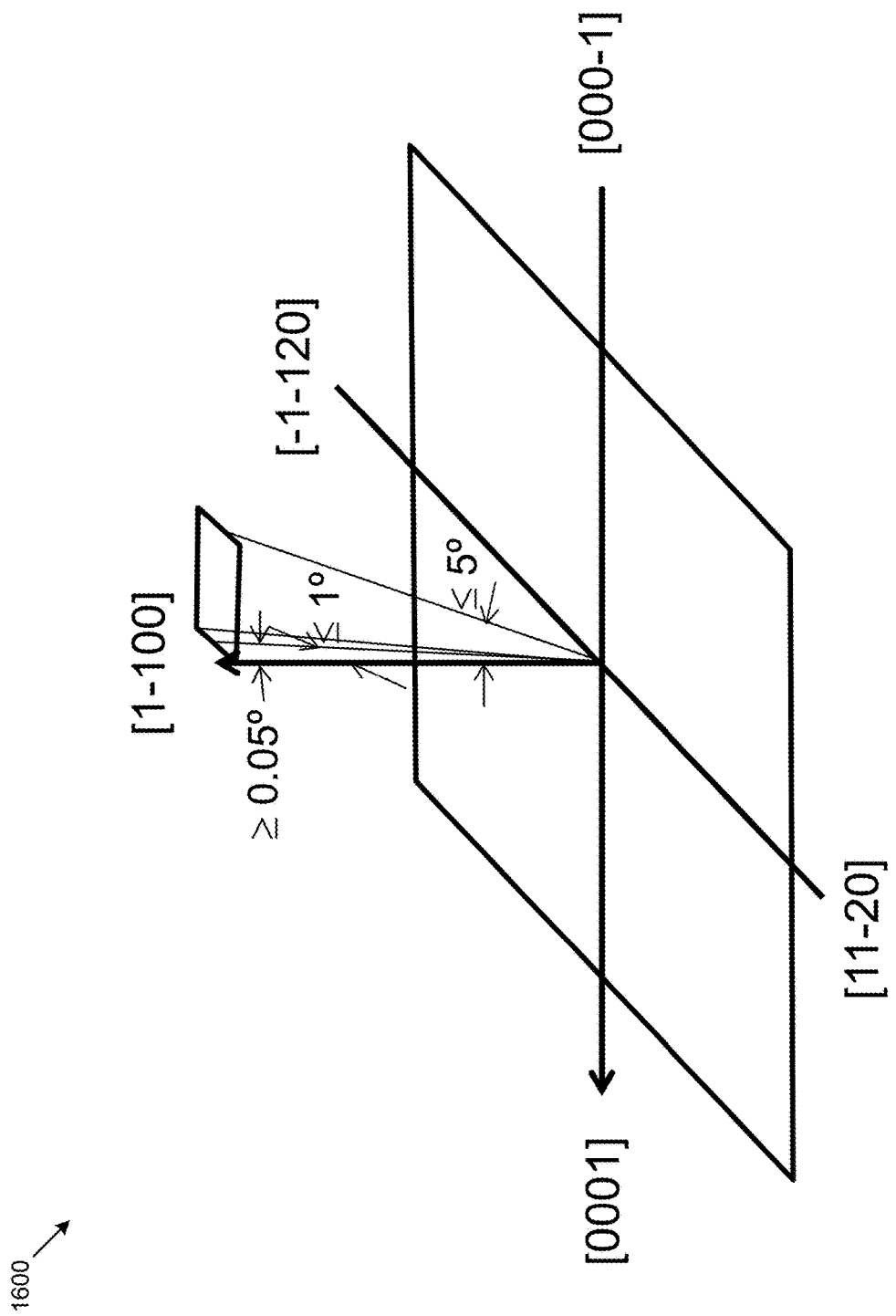
FIG. 16 is a diagram showing a range of crystallographic orientations suitable for seed crystals for m-plane crystal growth as used in certain embodiments of the present disclosure.
Figure 17:
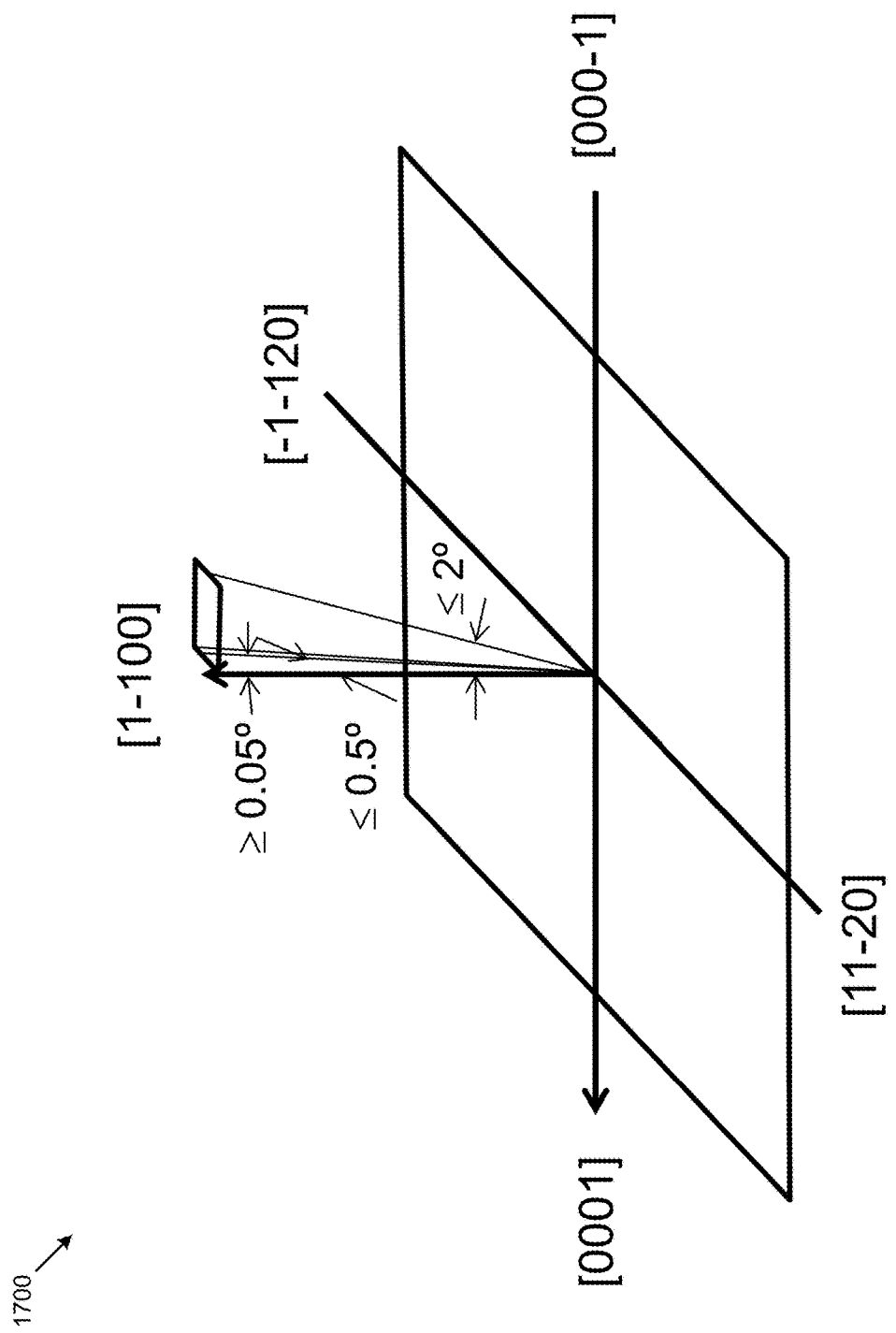
FIG. 17 is a diagram showing a range of crystallographic orientations suitable for seed crystals for m-plane crystal growth as used in certain embodiments of the present disclosure.

FIG. 16 is a diagram 1600 showing another range of crystallographic orientations 1600 suitable for seed crystals for m-plane crystal growth as used in certain embodiments of the present disclosure. FIG. 17 is a diagram 1700 showing still another range of crystallographic orientations 1700 suitable for seed crystals for m-plane crystal growth as used in certain embodiments of the present disclosure. One might have expected that to achieve an efficient manufacturing process for ammonothermal GaN crystals the surface orientation of each seed crystal must be controlled to a very high precision, for example, less than about 0.05°. Surprisingly, however, as illustrated in the examples, we find that high fidelity ammonothermal crystal growth can be achieved on near-m-plane seed crystals or seed plates when the miscut angle in the c-direction for each large-area surface of each of a plurality of seed plates lies between about 5 degrees toward [000-1] and about 1 degree toward [000+1] and the miscut angle in the a-direction is less than or equal to about 1 degree. In certain embodiments, we find that high fidelity ammonothermal crystal growth can be achieved on near-m-plane seed crystals or seed plates when the miscut angle in the c-direction for at least one large-area surface of each of a plurality of seed plates lies between about 5 degrees and about 0.05 degree toward [000-1] and the miscut angle in the a-direction is less than or equal to about 1 degree. In certain embodiments, we find that high fidelity ammonothermal crystal growth can be achieved on near-m-plane seed crystals or seed plates when the miscut angle in the c-direction for at least one large-area surface of each of a plurality of seed plates lies between about 2 degrees and about 0.05 degree toward [000-1] and the miscut angle in the a-direction is less than or equal to about 0.5 degree. These miscut angles do not include on-axis m-plane crystallographic orientations. These prescriptions enable a considerable reduction in the cost of preparing seeds, relative to the cost of maintaining extremely tight tolerances on the crystallographic orientation of each large-area face coupled with efficient manufacturing.

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

Several bulk GaN crystals grown by HVPE, approximately 0.3 millimeters thick, were provided for use as seed crystals for ammonothermal growth. A first seed crystal had a large-area surface that was miscut from m-plane by approximately 0.03 degree toward [11-20] and by approximately 0.05 degrees toward [000-1]. A second seed crystal had a large-area surface that was miscut from m-plane by less than 0.1 degree toward [11-20] and by approximately 1 degree toward [000-1]. A third seed crystal had a large-area surface that was miscut from m-plane by less than 0.1 degree toward [11-20] and by approximately 4 degrees toward [000-1]. A fourth seed crystal had a large-area surface that was miscut from m-plane by less than 0.1 degree toward [11-20] and by approximately 7 degrees toward [000-1]. The seed crystals were placed inside a silver capsule along with a 15%-open-area baffle, approximately 30.6 grams of polycrystalline GaN nutrient, 5.5 grams of $NH_4F$ mineralizer, and 28.6 grams of ammonia and the capsule was sealed. The capsule was placed in an internally-heated high pressure apparatus and heated to temperatures of approximately 645 degrees Celsius for the upper, nutrient zone and approximately 665 degrees Celsius for the lower, crystal growth zone, maintained at these temperatures for approximately 45 hours, and then cooled and removed. The seed crystals, which grew to thicknesses between 0.9 and 2.2 millimeters, were then examined under a microscope and their crystallinity was quantified by x-ray diffraction rocking curve analysis.

The m-plane crystal grown from the seed that had a large-area surface that was miscut from m-plane by approximately 0.03 degree toward [11-20] and by approximately 0.05 degrees toward [000-1] had excellent surface morphology on both the front and back surfaces. The x-ray-diffraction rocking curve full-width-at-half-maximum values for the (100) reflection, rocking about [11-20], the (100) reflection, rocking about [0001], and the off-axis (102) reflection were approximately 28 arc-seconds, 32 arc-seconds, and 20 arc-seconds, respectively, on side 1. On side 2 the corresponding values were approximately 26 arc-seconds, 32 arc-seconds, and 26 arc-seconds, respectively. These values indicate excellent crystallinity.

The m-plane crystal that began with a 1-degree miscut towards [000-1] on one large-area surface also had excellent surface morphology on both the front and back surfaces, both of which appeared to have grown out to approximately on-axis m-plane. The x-ray-diffraction rocking curve full-width-at-half-maximum values for the (100) reflection, rocking about [11-20], the (100) reflection, rocking about [0001], and the off-axis (102) reflection were approximately 67 arc-seconds, 53 arc-seconds, and 43 arc-seconds, respectively, on side 1, which corresponds to the face that was originally miscut by 1 degree toward [0001]. On side 2, which corresponds to the face that was originally miscut by 1 degree toward [000-1], the corresponding values were approximately 86 arc-seconds, 85 arc-seconds, and 46 arc-seconds, respectively. These values indicate excellent crystallinity.

The m-plane crystal that began with a 4-degree miscut towards [000-1] on one large-area surface had good surface morphology on both the front and back surfaces. The face that was originally miscut towards [000-1] appeared to have grown out to on-axis m-plane, with a pronounced {10-1-1} facet. However, the face that was originally miscut toward [0001] was somewhat rougher. The x-ray-diffraction rocking curve full-width-at-half-maximum values for the (100) reflection, rocking about [11-20], the (100) reflection, rocking about [0001], and the off-axis (102) reflection were approximately 75 arc-seconds, 221 arc-seconds, and 51 arc-seconds, respectively, on side 1, which corresponds to the face that was originally miscut by 4 degrees toward [0001]. On side 2, which corresponds to the face that was originally miscut by 4 degrees toward [000-1], the corresponding values were approximately 40 arc-seconds, 144 arc-seconds, and 134 arc-seconds, respectively. These values indicate that crystallinity has been degraded somewhat, particularly on the face that was miscut toward [0001].

The m-plane crystal that began with a 7-degree miscut towards [000-1] on one large-area surface had good surface morphology on one face but the other exhibited considerable roughness. The face that was originally miscut towards [000-1] appeared to have grown out to on-axis m-plane, with a pronounced {10-1-1} facet. The face that was originally miscut toward was significantly rougher. The x-ray-diffraction rocking curve full-width-at-half-maximum values for the (100) reflection, rocking about [11-20], the (100) reflection, rocking about [0001], and the off-axis (102) reflection were approximately 102 arc-seconds, 292 arc-seconds, and 60 arc-seconds, respectively, on side 1, which corresponds to the face that was originally miscut by 7 degrees toward [0001]. On side 2, which corresponds to the face that was originally miscut by 7 degrees toward [000-1], the corresponding values were approximately 73 arc-seconds, 123 arc-seconds, and 55 arc-seconds, respectively. These values indicate that crystallinity has been degraded significantly, particularly on the face that was miscut toward [0001].

Example 2

Several bulk GaN crystals grown by HVPE, approximately 0.3 millimeters thick, were provided for use as seed crystals for ammonothermal growth. A first seed crystal had a large-area surface that was miscut from the m-plane by approximately 0.03 degree toward [11-20] and by approximately 0.05 degrees toward [000-1]. A second seed crystal had a large-area surface that was miscut from m-plane by approximately 4.9 degrees toward [11-20] and by approximately 1.2 degrees toward [000-1]. A third seed crystal had a large-area surface that was miscut from m-plane by approximately 4.6 degrees toward [11-20] and by approximately 7.2 degrees toward [000-1]. The seed crystals were placed inside a silver capsule along with a 15%-open-area baffle, approximately 37.1 grams of polycrystalline GaN nutrient, 2.6 grams of $NH_4F$ mineralizer, and 29.6 grams of ammonia and the capsule was sealed. The capsule was placed in an internally-heated high pressure apparatus and heated to temperatures of approximately 645 degrees Celsius for the upper, nutrient zone and approximately 665 degrees Celsius for the lower, crystal growth zone, maintained at these temperatures for approximately 45 hours, and then cooled and removed. The seed crystals, which grew to thicknesses between 0.8 and 1.5 millimeters, were then examined under a microscope.

The m-plane crystal grown from the seed that had a large-area surface that was miscut from m-plane by approximately 0.03 degree toward [11-20] and by approximately 0.05 degrees toward [000-1] had excellent surface morphology on both the front and back surfaces. However, the crystal that was grown on the seed that had one large-area surface that was miscut by 1 degree toward [000-1] and 5 degrees towards [11-20] was rougher, and the crystal that was grown on the seed that had one large-area surface that was miscut by 7.2 degrees toward [000-1] and 4.6 degrees toward [11-20] was quite rough and irregular on both faces. X-ray diffraction measurements were not performed due to the roughness of the surfaces.

Example 3

Several bulk GaN crystals grown by HVPE, approximately 0.3 millimeters thick, were provided for use as seed crystals for ammonothermal growth. A first seed crystal had a large-area surface that was miscut from the m-plane by approximately 0.03 degree toward [11-20] and by approximately 0.05 degrees toward [000-1]. A second seed crystal had a large-area surface that was oriented to within one degree of {10-1-1}. The seed crystals were placed inside a silver capsule along with a 33%-open-area baffle, approximately 39.4 grams of polycrystalline GaN nutrient, 2.6 grams of $NH_4F$ mineralizer, and 29.2 grams of ammonia and the capsule was sealed. The capsule was placed in an internally-heated high pressure apparatus and heated to temperatures of approximately 650 degrees Celsius for the upper, nutrient zone and approximately 680 degrees Celsius for the lower, crystal growth zone, maintained at these temperatures for approximately 45 hours, and then cooled and removed. The seed crystals, which grew to thicknesses between 0.4 and 2.2 millimeters, were then examined under a microscope.

The m-plane crystal grown from the seed that had a large-area surface that was miscut from m-plane by approximately 0.03 degree toward [11-20] and by approximately 0.05 degrees toward [000-1] had excellent surface morphology on both the front and back surfaces. The {10-1-1} surface of the semipolar crystal was flat and had a good surface morphology. However, the backside of the crystal, with a nominal orientation of {10-11}, had a surface morphology that was rough and irregular. The {10-1-1} surface of the crystal was characterized by x-ray diffraction. The x-ray-diffraction rocking curve full-width-at-half-maximum values for the (10-1) reflection, rocking parallel to [0001], the (10-1) reflection, rocking perpendicular to [0001], and the off-axis (002) reflection were approximately 52 arc-seconds, 198 arc-seconds, and 125 arc-seconds, respectively, indicating good crystallinity.

While the above is a full description of the specific embodiments, various modifications, alternative constructions and equivalents may be used. Therefore, the above description and illustrations should not be taken as limiting the scope of the present disclosure which is defined by the appended claims.

What is claimed is:

1. A method for growth of a plurality of gallium-containing nitride crystals, the method comprising:
   placing a plurality of gallium-containing nitride seed plates in a seed rack, each of the plurality of gallium-containing nitride seed plates having a first growth surface and a second growth surface that are oriented relative to each other to form a wedge shape, wherein a wedge angle θ between the first growth surface and the second growth surface is between 1 degree and 60 degrees, and
   the first growth surface and the second growth surface have crystallographic orientations that are equivalent to one another to within 5 degrees;
   placing a source material, a mineralizer, and the seed rack that is supporting the plurality of gallium-containing nitride seed plates in a sealable container;
   introducing a nitrogen-containing solvent into the sealable container; and processing the plurality of gallium-containing nitride seed plates contained in the sealable container, wherein processing the plurality of gallium-containing nitride seed plates comprises growing a crystalline gallium-containing nitride material on the first growth surface and the second growth surface of each of the plurality of gallium-containing nitride seed plates by heating the plurality of gallium-containing nitride seed plates, the nitrogen-containing solvent, the gallium-containing source material, and the mineralizer disposed within the sealable container to a temperature higher than about 400 degrees Celsius.

2. The method of claim 1, wherein
each of the plurality of gallium-containing nitride seed plates has a minimum lateral dimension of three centimeters,
the crystallographic orientations of the first surfaces of the plurality of gallium-containing nitride seed plates are equivalent to within 5 degrees, and
the crystallographic orientation of at least two of the plurality of gallium-containing nitride seed plates differs by at least 0.05 degree.

3. The method of claim 1, wherein
the wedge angle θ is between 1 degree and 30 degrees, and
the crystallographic orientations of the first surface and the second surface are equivalent to one another to within 2 degrees.

4. The method of claim 1, wherein
each of the plurality of gallium-containing nitride seed plates comprises miscut m-plane crystals,
the wedge angle θ between 1 degree and 10 degrees, and
the crystallographic orientations of the first surface and the second surface are equivalent to one another to within about 2 degrees.

5. The method of claim 1, further comprising:
slicing at least one m-plane-oriented crystal from one or more boule grown on one or more of the plurality of gallium-containing nitride seed plates.

6. The method of claim 5, wherein slicing the at least one m-plane crystal comprises slicing the at least one m-plane crystal at a first angle parallel to the first growth surface of each of the plurality of gallium-containing nitride seed plates and at a second angle parallel to the second growth surface of each of the plurality of gallium-containing nitride seed plates.

7. The method of claim 1, wherein growing the crystalline gallium-containing nitride material on the first growth surface and the second growth surface is performed at a pressure higher than 2 kbar.

8. The method of claim 1, wherein the first growth surface and the second growth surface each have a lateral dimension of at least one centimeter.

9. The method of claim 1, wherein the plurality of gallium-containing nitride seed plates further comprise a first wedge shaped seed plate and a second wedge shaped seed plate, and the crystallographic orientation of the first growth surface of the first wedge shaped seed plate and the crystallographic orientation of the first growth surface or of the second growth surface of the second wedge shaped seed plate differ by at least 0.1 degree and less than 5 degrees.

10. The method of claim 9, wherein the crystallographic orientation of the first growth surfaces and second growth surfaces comprises a {1-1 0 0} plane crystallographic orientation that has a miscut angle towards a [000-1] direction of between 0.05 and 5 degrees and a miscut angle in a <11-20> direction less than or equal to 1 degree.

11. The method of claim 9, wherein the plurality of gallium-containing nitride seed plates further comprises a first wedge shaped seed plate and a second wedge shaped seed plate, and each of the first and second wedge shaped seed plates are attached to the seed rack in at least two positions.

12. The method of claim 1, wherein the sealable container comprises an autoclave.

13. The method of claim 1, wherein the sealable container comprises a capsule.

14. The method of claim 1, wherein
the plurality of gallium-containing nitride seed plates are placed in multiple tiers of the seed rack and are separated from an inner surface of the sealable container, and
in each of the multiple tiers, gallium-containing nitride seed plates are arranged in one or more rows.

15. The method of claim 1, wherein
the plurality of gallium-containing nitride seed plates are placed in multiple tiers of the seed rack and are separated from an inner surface of the sealable container, and
in each of the multiple tiers, gallium-containing nitride seed plates are arranged radially about a center of the seed rack such that a narrow end of each gallium-containing nitride seed plates faces the center of the seed rack.

16. The method of claim 15, wherein
the narrow end of each gallium-containing nitride seed plates arranged in a first centric circle faces a wide end of adjacent gallium-containing nitride seed plate arranged in a second centric circle that is closer to the center of the inner surface of the sealable container.

17. The method of claim 15, wherein
two or more gallium-containing nitride seed plates of the plurality of gallium-containing nitride seed plates are arranged in a first centric circle and are staggered with respect to two or more gallium-containing nitride seed plates of the plurality of gallium-containing nitride seed plates that are arranged in a second centric circle that is closer to the center of the inner surface of the sealable container.

18. A method for growing a gallium-containing nitride crystal, comprising:
processing a plurality of gallium-containing nitride seed plates disposed within a sealable container, wherein
a gallium-containing source material, a nitrogen-containing solvent, a mineralizer, and a seed rack are disposed within the sealable container, and the plurality of gallium-containing nitride seed plates are disposed on the seed rack,
the plurality of gallium-containing nitride seed plates each have a first growth surface and a second growth surface, which is opposite to the first growth surface, and each have a crystallographic orientation that comprises a {1-1 0 0} plane crystallographic orientation that has a miscut angle towards a [000-1] direction of between 0.05 and 5 degrees and a miscut angle in a <11-20> direction less than or equal to 1 degree,
the crystallographic orientations of at least two of the plurality of gallium-containing nitride seed plates differ from one another by at least 0.1 degree and less than 5 degrees towards the [000-1] direction, and
wherein processing the plurality of gallium-containing nitride seed plates comprises heating the plurality of gallium-containing nitride seed plates, the nitrogen-containing solvent, the gallium-containing source material, and the mineralizer disposed with the sealable container to a temperature higher than 400 degrees Celsius.

19. The method of claim 18, further comprising:
slicing at least one of {1–1 0 0}-plane crystals grown on one or more of the plurality of gallium-containing nitride seed plates.

20. The method of claim 18, wherein the first and second growth surfaces of the plurality of gallium-containing nitride seed plates each have a minimum lateral dimension of one centimeter.

21. The method of claim 18, wherein each of the plurality of gallium-containing nitride seed plates is attached to the seed rack in at least two positions.

22. The method of claim 18, wherein the miscut angle towards the [000–1] direction is between 1 and 5 degrees.

23. The method of claim 18, wherein
the miscut angle towards the [000–1] direction is between 0.05 degree and 2 degrees, and
the miscut angle in the <11-20> direction is less than or equal to 0.5 degree.

\* \* \* \* \*